(12) United States Patent
Yamazaki

(10) Patent No.: US 9,722,091 B2
(45) Date of Patent: Aug. 1, 2017

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-Shi, Kanagawa-Ken (JP)

( * ) Notice: Subject to any disclaimer, the term of this patent is extended or adjusted under 35 U.S.C. 154(b) by 0 days.

(21) Appl. No.: 14/850,026

(22) Filed: Sep. 10, 2015

(65) Prior Publication Data

US 2016/0079430 A1 Mar. 17, 2016

(30) Foreign Application Priority Data

Sep. 12, 2014 (JP) ................................. 2014-186088

(51) Int. Cl.
*H01L 21/311* (2006.01)
*H01L 21/477* (2006.01)
(Continued)

(52) U.S. Cl.
CPC .... *H01L 29/7869* (2013.01); *H01L 21/02323* (2013.01); *H01L 21/02554* (2013.01);
(Continued)

(58) Field of Classification Search
None
See application file for complete search history.

(56) References Cited

U.S. PATENT DOCUMENTS 5,528,032 A   6/1996 Uchiyama
5,731,856 A   3/1998 Kim et al.
(Continued)

FOREIGN PATENT DOCUMENTS

EP   1737044 A   12/2006
EP   2226847 A   9/2010
(Continued)

OTHER PUBLICATIONS

Noboru Kimizuka et al.; "Spinel, YbFe2O4, and Yb2Fe3O7 Types of Structures for Compounds in the In2O3 and Sc2O3-A2O3-BO Systems [A: Fe, Ga, or Al; B: Mg, Mn, Fe, Ni, Cu, or Zn] at Temperatures over 1000°C"; Journal of Solid State Chemistry, vol. 60; pp. 382-384; 1985.
(Continued)

*Primary Examiner* — Asok K Sarkar
(74) *Attorney, Agent, or Firm* — Fish & Richardson P.C.

(57) ABSTRACT

Provided is a transistor containing a semiconductor with low density of defect states, a transistor having a small subthreshold swing value, a transistor having a small short-channel effect, a transistor having normally-off electrical characteristics, a transistor having a low leakage current in an off state, a transistor having excellent electrical characteristics, a transistor having high reliability, or a transistor having excellent frequency characteristics. An insulator is formed, a layer is formed over the insulator, oxygen is added to the insulator through the layer, the layer is removed, an oxide semiconductor is formed over the insulator to which the oxygen is added, and a semiconductor element is formed using the oxide semiconductor.

22 Claims, 39 Drawing Sheets

(51) Int. Cl.
*H01L 29/786* (2006.01)
*H01L 29/66* (2006.01)
*H01L 27/146* (2006.01)
*H01L 21/02* (2006.01)
*H01L 21/3115* (2006.01)

(52) U.S. Cl.
CPC .. *H01L 21/02565* (2013.01); *H01L 21/02658* (2013.01); *H01L 21/31155* (2013.01); *H01L 21/477* (2013.01); *H01L 27/14643* (2013.01); *H01L 29/66742* (2013.01); *H01L 29/78603* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,440,510 | B2 | 5/2013 | Yamazaki |
| 8,461,007 | B2 | 6/2013 | Yamazaki |
| 8,519,387 | B2 | 8/2013 | Endo et al. |
| 8,530,289 | B2 | 9/2013 | Yamazaki |
| 8,546,225 | B2 | 10/2013 | Yamazaki |
| 8,637,347 | B2 | 1/2014 | Oikawa et al. |
| 8,637,348 | B2 | 1/2014 | Endo et al. |
| 8,669,148 | B2 | 3/2014 | Yamazaki |
| 8,709,922 | B2 | 4/2014 | Koezuka et al. |
| 8,723,176 | B2 | 5/2014 | Yamazaki |
| 8,729,547 | B2 | 5/2014 | Miyairi et al. |
| 8,748,240 | B2 | 6/2014 | Yamazaki |
| 8,753,928 | B2 | 6/2014 | Yamazaki et al. |
| 8,785,258 | B2 | 7/2014 | Yamazaki |
| 8,796,681 | B2 | 8/2014 | Yamade et al. |
| 8,809,154 | B2 | 8/2014 | Koezuka et al. |
| 8,809,992 | B2 | 8/2014 | Yamazaki et al. |
| 8,822,264 | B2 | 9/2014 | Yamazaki et al. |
| 8,828,794 | B2 | 9/2014 | Yamazaki et al. |
| 8,828,811 | B2 | 9/2014 | Yamazaki |
| 8,865,534 | B2 | 10/2014 | Yamazaki |
| 8,865,555 | B2 | 10/2014 | Yamazaki et al. |
| 8,878,173 | B2 | 11/2014 | Yamazaki |
| 8,895,377 | B2 | 11/2014 | Yamazaki |
| 8,901,556 | B2 | 12/2014 | Okazaki et al. |
| 8,912,080 | B2 | 12/2014 | Yamazaki |
| 8,916,424 | B2 | 12/2014 | Isobe et al. |
| 8,927,990 | B2 | 1/2015 | Sasaki et al. |
| 8,945,982 | B2 | 2/2015 | Yamazaki |
| 8,946,703 | B2 | 2/2015 | Miyairi et al. |
| 8,946,704 | B2 | 2/2015 | Yamazaki |
| 8,956,912 | B2 | 2/2015 | Yamazaki |
| 8,969,130 | B2 | 3/2015 | Tanaka et al. |
| 8,969,867 | B2 | 3/2015 | Yamazaki et al. |
| 8,975,115 | B2 | 3/2015 | Endo et al. |
| 8,999,773 | B2 | 4/2015 | Hanaoka et al. |
| 9,006,024 | B2 | 4/2015 | Akimoto |
| 9,006,733 | B2 | 4/2015 | Yamazaki |
| 9,012,913 | B2 | 4/2015 | Noda et al. |
| 9,023,684 | B2 | 5/2015 | Suzawa et al. |
| 9,048,265 | B2 | 6/2015 | Hondo et al. |
| 9,064,898 | B2 | 6/2015 | Yamazaki |
| 9,064,907 | B2 | 6/2015 | Yamazaki |
| 9,082,860 | B2 | 7/2015 | Nakano et al. |
| 9,087,745 | B2 | 7/2015 | Yamazaki et al. |
| 9,099,303 | B2 | 8/2015 | Yamazaki |
| 9,099,499 | B2 | 8/2015 | Yamazaki |
| 9,105,658 | B2 | 8/2015 | Yamazaki |
| 9,111,804 | B2 | 8/2015 | Yamazaki et al. |
| 9,117,662 | B2 | 8/2015 | Isobe et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |

(56) References Cited

U.S. PATENT DOCUMENTS

| | | |
|---|---|---|
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0079778 A1 | 4/2011 | Yamazaki et al. |
| 2011/0101335 A1 | 5/2011 | Yamazaki et al. |
| 2012/0153277 A1* | 6/2012 | Yaginuma ......... H01L 29/78618 257/43 |
| 2013/0126862 A1 | 5/2013 | Yamazaki |
| 2013/0146870 A1 | 6/2013 | Yamazaki |
| 2013/0161610 A1 | 6/2013 | Yamazaki |
| 2013/0161611 A1 | 6/2013 | Yamazaki et al. |
| 2013/0187150 A1 | 7/2013 | Yamazaki et al. |
| 2013/0187153 A1 | 7/2013 | Yamazaki et al. |
| 2013/0200375 A1 | 8/2013 | Yamazaki |
| 2013/0221347 A1 | 8/2013 | Isobe et al. |
| 2013/0270549 A1 | 10/2013 | Okazaki et al. |
| 2013/0270563 A1 | 10/2013 | Yamazaki |
| 2013/0299818 A1 | 11/2013 | Tanaka |
| 2013/0316493 A1* | 11/2013 | Yamazaki ......... H01L 29/66742 438/104 |
| 2014/0001466 A1 | 1/2014 | Sasaki et al. |
| 2014/0001467 A1 | 1/2014 | Yamazaki et al. |
| 2014/0021467 A1 | 1/2014 | Koezuka et al. |
| 2014/0042433 A1 | 2/2014 | Yamazaki |
| 2014/0042434 A1 | 2/2014 | Yamazaki |
| 2014/0103337 A1 | 4/2014 | Yamazaki et al. |
| 2014/0103338 A1 | 4/2014 | Yamazaki et al. |
| 2014/0103340 A1 | 4/2014 | Yamazaki et al. |
| 2014/0106504 A1 | 4/2014 | Yamazaki et al. |
| 2014/0106505 A1 | 4/2014 | Oikawa et al. |
| 2014/0113405 A1 | 4/2014 | Tsubuku et al. |
| 2014/0154837 A1 | 6/2014 | Yamazaki |
| 2014/0175435 A1 | 6/2014 | Yamazaki et al. |
| 2014/0175436 A1 | 6/2014 | Yamazaki |
| 2014/0186998 A1 | 7/2014 | Koezuka et al. |
| 2014/0206133 A1 | 7/2014 | Koezuka et al. |
| 2014/0209896 A1* | 7/2014 | Yamazaki ......... H01L 29/66969 257/43 |
| 2014/0242749 A1 | 8/2014 | Yamazaki |
| 2014/0299876 A1 | 10/2014 | Yamade et al. |
| 2014/0319514 A1 | 10/2014 | Noda et al. |
| 2014/0319517 A1 | 10/2014 | Noda et al. |
| 2014/0332809 A1 | 11/2014 | Saito et al. |
| 2014/0339547 A1 | 11/2014 | Hondo et al. |
| 2014/0339548 A1 | 11/2014 | Yamazaki et al. |
| 2014/0342498 A1 | 11/2014 | Endo et al. |
| 2014/0367682 A1 | 12/2014 | Yamazaki et al. |
| 2014/0370656 A1 | 12/2014 | Yamazaki |
| 2014/0370657 A1 | 12/2014 | Yamazaki et al. |
| 2015/0008430 A1 | 1/2015 | Yamazaki et al. |
| 2015/0037932 A1 | 2/2015 | Yamazaki et al. |
| 2015/0041803 A1 | 2/2015 | Endo et al. |
| 2015/0048371 A1 | 2/2015 | Miyairi et al. |
| 2015/0050774 A1 | 2/2015 | Yamazaki et al. |
| 2015/0053972 A1 | 2/2015 | Tokumaru et al. |
| 2015/0053978 A1 | 2/2015 | Yamazaki |
| 2015/0072535 A1 | 3/2015 | Okazaki et al. |
| 2015/0076496 A1 | 3/2015 | Tanaka et al. |
| 2015/0084050 A1 | 3/2015 | Sasaki et al. |
| 2015/0087112 A1 | 3/2015 | Yamazaki |
| 2015/0093854 A1 | 4/2015 | Yamazaki |
| 2015/0123121 A1 | 5/2015 | Hanaoka et al. |
| 2015/0125991 A1 | 5/2015 | Yamazaki |
| 2015/0137121 A1 | 5/2015 | Noda et al. |
| 2015/0137122 A1 | 5/2015 | Yamazaki |
| 2015/0137124 A1 | 5/2015 | Egi et al. |
| 2015/0155312 A1 | 6/2015 | Yamazaki |
| 2015/0179803 A1 | 6/2015 | Yamazaki et al. |
| 2015/0179804 A1 | 6/2015 | Yamazaki et al. |
| 2015/0187952 A1 | 7/2015 | Yamazaki et al. |
| 2015/0214041 A1 | 7/2015 | Hanaoka et al. |
| 2015/0214342 A1 | 7/2015 | Yamazaki |
| 2015/0221754 A1 | 8/2015 | Hondo et al. |
| 2015/0228802 A1 | 8/2015 | Suzawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Noboru Kimizuka et al.; "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$-$ZnGa_2O_4$-ZnO System"; Journal of Solid State Chemistry, vol. 116, No. 1; pp. 170-178; Apr. 1, 1995.

Shunpei Yamazaki et al.; "Back-channel-etched thin-film transistor using c-axis-aligned crystal In-Ga-Zn oxide"; Journal of the Society for Information Display, vol. 22, No. 1; pp. 55-67; 2014.

Asakuma.N et al., "Crystallization and Reduction of Sol-Gel-Derived Zinc Oxide Films by Irradiation With Ultraviolet Lamp" Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

(56) References Cited

OTHER PUBLICATIONS

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In-Ga-Zn-O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4, Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In-Ga-Zn-Oxide TFTS With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

(56) References Cited

OTHER PUBLICATIONS

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALED Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In-Ga-Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 26A1
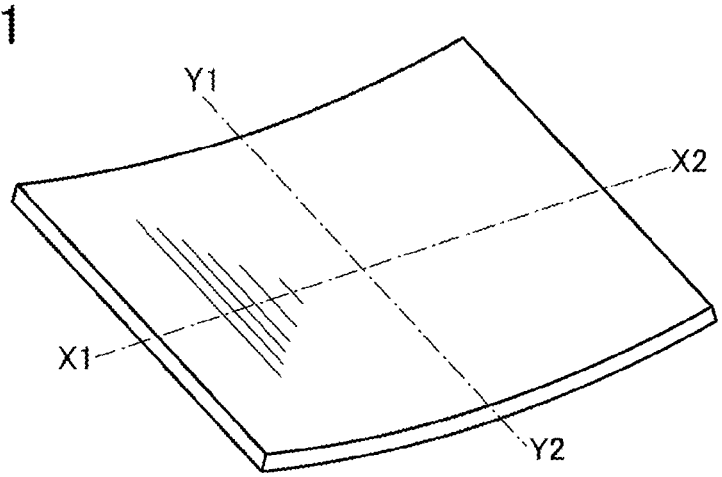
FIG. 26A2
FIG. 26A3
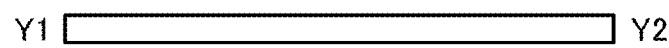
FIG. 26B1
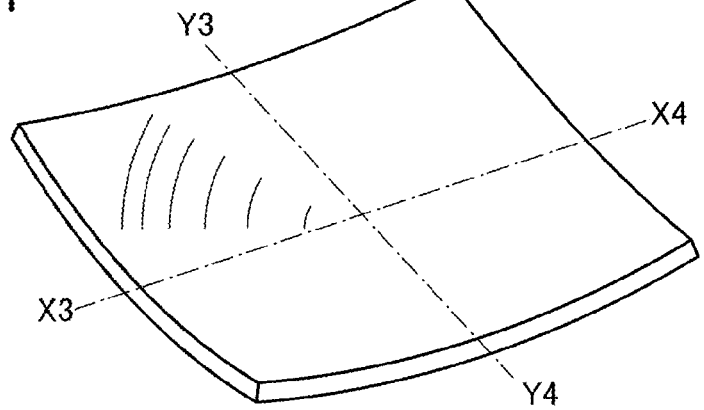
FIG. 26B2
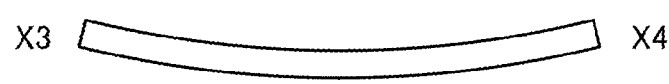
FIG. 26B3

FIG. 33A
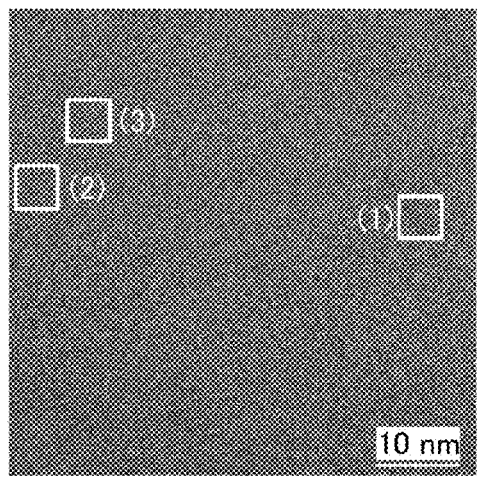
FIG. 33B        FIG. 33C        FIG. 33D
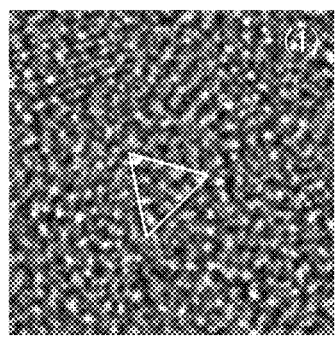   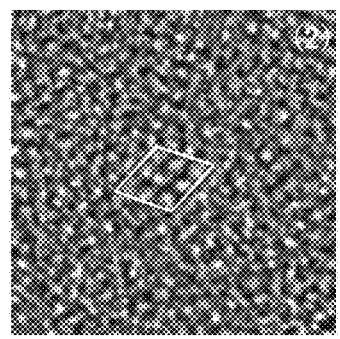   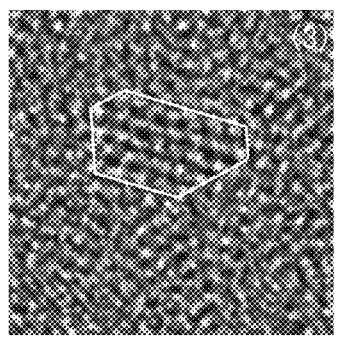

FIG. 35A
FIG. 35B
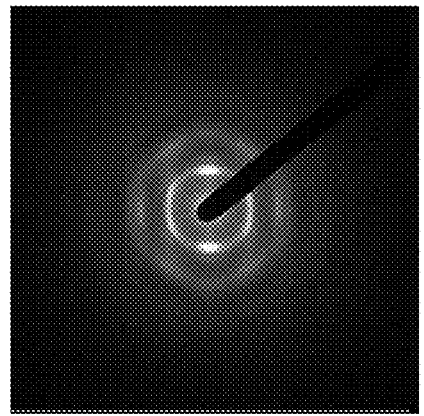
Irradiation with electron beam
in a direction
parallel to a sample surface
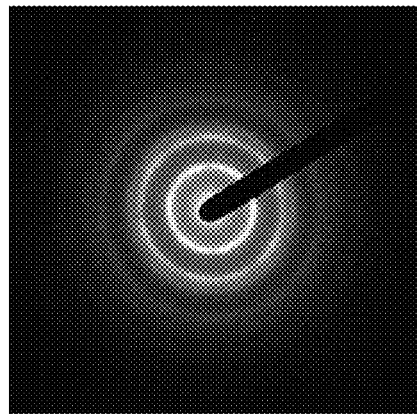
Irradiation with electron beam
in a direction
perpendicular to a sample surface

METHOD FOR MANUFACTURING SEMICONDUCTOR DEVICE

BACKGROUND OF THE INVENTION

1. Field of the Invention

The present invention relates to, for example, a semiconductor, a transistor, and a semiconductor device. Alternatively, the present invention relates to, for example, methods for manufacturing a semiconductor, a transistor, and a semiconductor device. Further alternatively, the present invention relates to, for example, a semiconductor, a display device, a light-emitting device, a lighting device, a power storage device, a memory device, a processor, and an electronic device. Still further alternatively, the present invention relates to methods for manufacturing a semiconductor, a display device, a liquid crystal display device, a light-emitting device, a memory device, and an electronic device. Yet still further alternatively, the present invention relates to driving methods of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor with the use of a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. In the case of a transistor included in a high-performance display device in which a driver circuit and a pixel circuit are formed over the same substrate, it is preferable to use polycrystalline silicon, which can be used to form a transistor having a high field-effect mobility. It is known that polycrystalline silicon can be formed as a result of heat treatment at high temperatures or laser light treatment on amorphous silicon.

In recent years, transistors including oxide semiconductors (typified by an In—Ga—Zn oxide) have been actively developed.

Oxide semiconductors have a long history, and in 1985, synthesis of an In—Ga—Zn oxide crystal was reported (see Non-Patent Document 1). In 1988, it was disclosed to use an In—Ga—Zn oxide crystal for a semiconductor element (see Patent Document 1). It was reported in 1995 that an In—Ga—Zn oxide has a homologous structure and is represented by a composition formula $InGaO_3(ZnO)_m$ (m is a natural number) (see Non-Patent Document 2).

Furthermore, in 1995, a transistor including an oxide semiconductor was invented, and its electrical characteristics were disclosed (see Patent Document 2).

In 2014, a transistor including a crystalline oxide semiconductor was reported (see Non-Patent Document 3). The transistor in this report includes a c-axis aligned crystalline oxide semiconductor (CAAC-OS) and thus is capable of mass-production and has high electrical characteristics and reliability.

The transistor including an oxide semiconductor has features different from those of the transistors including amorphous silicon or polycrystalline silicon. For example, a display device to which a transistor including an oxide semiconductor is applied is known to have small power consumption. An oxide semiconductor can be formed by a sputtering method or the like, and thus can be used in a transistor included in a large display device. Because a transistor including an oxide semiconductor has high field-effect mobility, a high-performance display device in which a driver circuit and a pixel circuit are formed over the same substrate can be obtained. In addition, there is an advantage that capital investment can be reduced because part of production equipment for a transistor including amorphous silicon can be retrofitted and utilized.

REFERENCE

Patent Documents

[Patent Document 1] Japanese Published Patent Application No. S63-239117
[Patent Document 2] Japanese Translation of PCT International Application No. H11-505377

Non-Patent Documents

[Non-Patent Document 1] N. Kimizuka and T. Mohri, *Journal of Solid State Chemistry*, Vol. 60, 1985, pp. 382-384.
[Non-Patent Document 2] N. Kimizuka, M. Isobe, and M. Nakamura, *Journal of Solid State Chemistry*, Vol. 116, 1995, pp. 170-178.
[Non-Patent Document 3] S. Yamazaki, T. Hirohashi, M. Takahashi, S. Adachi, M. Tsubuku, J. Koezuka, K. Okazaki, Y. Kanzaki, H. Matsukizono, S. Kaneko, S. Mori, and T. Matsuo, *Journal of the Society for Information Display*, Vol. 22, Issue 1, 2014, pp. 55-67.

SUMMARY OF THE INVENTION

One object is to provide a transistor containing a semiconductor with low density of defect states. Another object is to provide a transistor having a small subthreshold swing value. Another object is to provide a transistor having a small short-channel effect. Another object is to provide a transistor having normally-off electrical characteristics. Another object is to provide a transistor having a low leakage current in an off state. Another object is to provide a transistor having excellent electrical characteristics. Another object is to provide a transistor having high reliability. Another object is to provide a transistor having excellent frequency characteristics.

Another object is to provide a semiconductor device including any of the above transistors. Another object is to provide a module including the semiconductor device. Another object is to provide an electronic device including the semiconductor device or the module. Another object is to provide a novel semiconductor device. Another object is to provide a novel module. Another object is to provide a novel electronic device.

Note that the descriptions of these objects do not preclude the existence of other objects. In one embodiment of the present invention, there is no need to achieve all the objects. Other objects will be apparent from and can be derived from the description of the specification, the drawings, the claims, and the like.

(1) One embodiment of the present invention is a method for manufacturing a semiconductor device. In the method, an insulator is formed, a layer is formed over the insulator, oxygen is added to the insulator through the layer, the layer is removed, an oxide semiconductor is formed over the insulator to which the oxygen is added, and a semiconductor element is formed using the oxide semiconductor.

(2) One embodiment of the present invention is the method for manufacturing a semiconductor device described in (1), in which heat treatment is performed after the oxide semiconductor is formed.

(3) One embodiment of the present invention is the method for manufacturing a semiconductor device described in (1) or (2), in which the layer contains an oxide semiconductor.

(4) One embodiment of the present invention is the method for manufacturing a semiconductor device described in any one of (1) to (3), in which the layer is removed by wet etching.

(5) One embodiment of the present invention is the method for manufacturing a semiconductor device described in any one of (1) to (4), in which the insulator is an oxide containing silicon.

(6) One embodiment of the present invention is the method for manufacturing a semiconductor device described in any one of (1) to (5), in which hydrogen in the oxide semiconductor and oxygen in the insulator are made to react with each other by the heat treatment to be released as water.

(7) One embodiment of the present invention is the method for manufacturing a semiconductor device described in any one of (1) to (6), in which the oxygen is added by an ion implantation method.

(8) One embodiment of the present invention is the method for manufacturing a semiconductor device described in any one of (1) to (7), in which the semiconductor element is a transistor.

A transistor containing a semiconductor with low density of defect states can be provided. A transistor having a small subthreshold swing value can be provided. A transistor having a small short-channel effect can be provided. A transistor having normally-off electrical characteristics can be provided. A transistor having a low leakage current in an off state can be provided. A transistor having excellent electrical characteristics can be provided. A transistor having high reliability can be provided. A transistor having high frequency characteristics can be provided.

A semiconductor device including any of the above transistors can be provided. A module including the semiconductor device can be provided. An electronic device including the semiconductor device or the module can be provided. A novel semiconductor device can be provided. A novel module can be provided. A novel electronic device can be provided.

Note that the description of these effects does not preclude the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

FIGS. 26A1 to 26A3 and FIGS. 26B1 to 26B3 are perspective views and cross-sectional views illustrating semiconductor devices of one embodiment of the present invention.

FIGS. 33A to 33D are Cs-corrected high-resolution TEM images of a plane of a CAAC-OS.

FIGS. 35A and 35B show electron diffraction patterns of a CAAC-OS.

DETAILED DESCRIPTION OF THE INVENTION

Figure 1A:
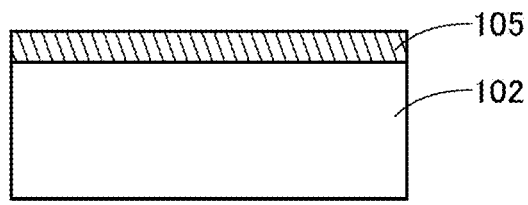
FIGS. 1A to 1E are cross-sectional views illustrating a method for manufacturing a semiconductor device of one embodiment of the present invention.

Embodiments of the present invention will be described in detail with the reference to the drawings. However, the present invention is not limited to the following description, and it is easily understood by those skilled in the art that modes and details disclosed herein can be modified in various ways. Furthermore, the present invention is not construed as being limited to description of the following embodiments. In describing structures of the invention with reference to the drawings, common reference numerals are used for the same portions in different drawings. Note that the same hatched pattern is applied to similar parts, and the similar parts are not denoted by reference numerals in some cases.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a ground potential (GND) or a source potential). Thus, a voltage can be referred to as a potential and vice versa. Note that in general, a potential (voltage) is relative and is determined depending on the amount relative to a certain potential. Thus, a "ground potential" is not necessarily 0 V. For example, in some cases, a "ground potential" is the lowest potential in a circuit. In other cases, a "ground potential" is a moderate potential in a circuit. In those cases, a positive potential and a negative potential are set using the ground potential as a reference.

Note that the ordinal numbers such as "first" and "second" are used for convenience and do not denote the order of steps or the stacking order of layers. Thus, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" has characteristics of an "insulator" in some cases when the conductivity is sufficiently low, for example. Furthermore, a "semiconductor" and an "insulator" cannot be strictly distinguished from each other in some cases because a border therebetween is not clear. Accordingly, a "semiconductor" in this specification can be called an "insulator" in some cases. Similarly, an "insulator" in this specification can be called a "semiconductor" in some cases.

A "semiconductor" has characteristics of a "conductor" in some cases when the conductivity is sufficiently high, for example. Furthermore, a "semiconductor" and a "conductor" cannot be strictly distinguished from each other in some cases because a border therebetween is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B," "the average concentration in a region of A in the depth direction is B," "the median value of a concentration in a region of A in the depth direction is B," "the maximum value of a concentration in a region of A in the depth direction is B," "the minimum value of a concentration in a region of A in the depth direction is B," "a convergence value of a concentration in a region of A in the depth direction is B," and "a concentration in a region of A in which a probable value is obtained in measurement is B."

In this specification, the phrase "A has a region with a size B, a length B, a thickness B, a width B, or a distance B" includes, for example, "the size, the length, the thickness, the width, or the distance of the entire region in a region of A is B," "the average value of the size, the length, the thickness, the width, or the distance of a region of A is B," "the median value of the size, the length, the thickness, the width, or the distance of a region of A is B," "the maximum value of the size, the length, the thickness, the width, or the distance of a region of A is B," "the minimum value of the size, the length, the thickness, the width, or the distance of a region of A is B," "a convergence value of the size, the length, the thickness, the width, or the distance of a region of A is B," and "the size, the length, the thickness, the width, or the distance of a region of A in which a probable value is obtained in measurement is B."

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not limited to one value in some cases. Thus, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Thus, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of a transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Thus, in the case where the shape of a semiconductor is not known accurately, it is difficult to measure an effective channel width accurately.

Thus, in this specification, in a plan view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, the values might be different from those calculated by using an effective channel width.

Note that in this specification, the description "A has a shape such that an end portion extends beyond an end portion of B" may indicate, for example, the case where at least one of end portions of A is positioned on an outer side than at least one of end portions of B in a plan view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

<Semiconductor Device>

A semiconductor device of one embodiment of the present invention will be described below.

FIGS. 1A to 1E are cross-sectional views illustrating a method for manufacturing the semiconductor device.

First, an insulator 102 and a layer 105 over the insulator 102 are prepared (see FIG. 1A).

The insulator 102 is formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 102 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. In particular, an oxide containing silicon is preferable.

For the layer 105, it is preferable to use an insulator, a semiconductor, or a conductor whose etching rate is different from that of the insulator 102. It is also preferable to use an insulator, a semiconductor, or a conductor having a function of blocking oxygen, for the layer 105. In order not to react with oxygen in a later step, the layer 105 preferably contains an oxide. For example, the layer 105 may have a single-layer structure or a stacked-layer structure including an oxide containing boron, carbon, fluorine, magnesium, aluminum, silicon, phosphorus, chlorine, argon, titanium, vanadium, chromium, manganese, cobalt, nickel, copper, zinc, gallium, germanium, yttrium, zirconium, niobium, molybdenum, ruthenium, indium, tin, lanthanum, neodymium, hafnium, tantalum, or tungsten. The layer 105 may contain, for example, titanium oxide, manganese oxide, zinc oxide, gallium oxide, molybdenum oxide, indium oxide, tin oxide, tungsten oxide, an In—Ga oxide, an In—Zn oxide, a Zn—Ga oxide, a Zn—Sn oxide, an In—Ga—Zn oxide, an In—Sn—Zn oxide, or an In—Hf—Zn oxide. In particular, it is preferable to use an In—Ga—Zn oxide containing more Ga than In in an atomic ratio, an In—Ga—Zn oxide containing Ga twice or more as much as In in an atomic ratio, or an In—Ga—Zn oxide containing Ga three or more times as much as In in an atomic ratio.

Figure 1B:
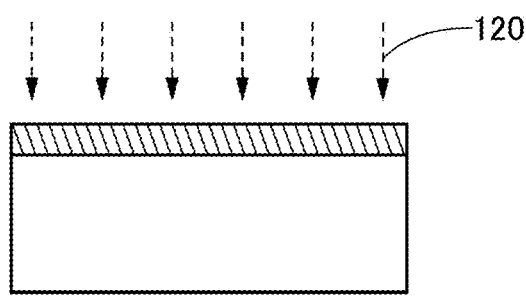

Next, treatment for adding oxygen to the insulator 102 through the layer 105 is performed. FIG. 1B illustrates an example where oxygen ions 120 are added by an ion implantation method. The dose of the oxygen ions 120 is, for example, greater than or equal to $5 \times 10^{14}$ ions/cm$^2$ and less than or equal to $2 \times 10^{17}$ ions/cm$^2$, preferably greater than or equal to $1 \times 10^{15}$ ions/cm$^2$ and less than or equal to $1 \times 10^{17}$ ions/cm$^2$, and further preferably greater than or equal to $2 \times 10^{15}$ ions/cm$^2$ and less than or equal to $5 \times 10^{16}$ ions/cm$^2$. Low dose of the oxygen ions 120 might make an effect of excess oxygen, which is described later, insufficient. In contrast, high dose of the oxygen ions 120 might cause formation of voids in the insulator 102, which decreases the density or generates carrier traps. Note that one embodiment of the present invention is not limited to the ion implantation method; oxygen can be added to the insulator 102 through the layer 105 using plasma containing oxygen, for example. The plasma treatment can be performed while a bias voltage toward the insulator 102 is applied. The application of the bias voltage allows the efficient addition of oxygen.

The ion implantation method can be divided into a method using mass-separated ions and a method using non-mass-separated ions. The use of mass-separated ions can reduce impurities entering the insulator 102 and reduce variation of the amount of added ions. In contrast, the use of non-mass-separated ions allows addition of a large amount of ions in a short time.

Heat treatment may be performed during oxygen addition. The added oxygen is diffused in the insulator 102 or the like by the heat. Thus, oxygen addition can be evenly performed. As a result, oxygen can be efficiently added. The heat treatment is performed at, for example, higher than or equal to 50° C. and lower than or equal to 350° C., preferably higher than or equal to 60° C. and lower than or equal to 250° C., and further preferably higher than or equal to 70° C. and lower than or equal to 150° C.

The oxygen ions 120 are not necessarily monatomic ions and can be, for example, molecular ions containing oxygen, such as $O_2$ ions, $O_3$ ions, $CO_2$ ions, $N_2O$ ions, $NO_2$ ions, or NO ions. A molecular ion has larger mass than a monatomic ion. For this reason, oxygen added by an ion implantation method using molecular ions is in a shallow region as compared with the case of using monatomic ions at the same acceleration voltage. This means that molecular ions are not added to a deep region even at high acceleration voltage; thus, a large amount of oxygen can be added in a short time.

Adding the oxygen ions 120 to the insulator 102 through the layer 105 may have the following advantages: the layer 105 can prevent added oxygen from being released from the insulator 102; the oxygen ions 120 can be implanted at high acceleration voltage, which makes it possible to add a large amount of oxygen in a short time; and a protective effect of the layer 105 can reduce damage due to addition of the oxygen ions 120 to the insulator 102.

The layer 105 has a thickness such that oxygen release can be blocked and the oxygen ions 120 can reach the insulator 102. For example, the thickness of the layer 105 is greater than or equal to 5 nm and less than or equal to 150 nm, preferably greater than or equal to 10 nm and less than or equal to 100 nm, and further preferably greater than or equal to 10 nm and less than or equal to 50 nm.

Figure 1C:
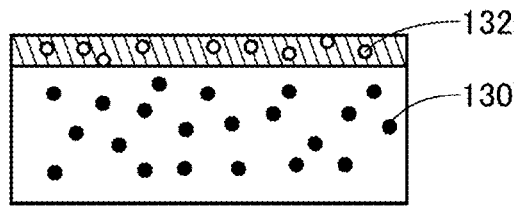

When the oxygen ions 120 are added to the insulator 102, excess oxygen 130 exists in the insulator 102 (see FIG. 1C). The excess oxygen 130 is, for example, oxygen with a weak bond in the insulator 102. Thus, the excess oxygen 130 can move in the insulator 102 when stimulated by light or heat, for example. In the case where the excess oxygen 130 is strongly bonded to an atom in the insulator 102, a bond between another oxygen and the atom might be broken and the oxygen originally bonded to the atom might serve as the excess oxygen 130. Bonding and unbonding are repeated in this manner; thus, the excess oxygen 130 can effectively move.

The excess oxygen 130 in the insulator 102 can be measured by electron spin resonance (ESR), thermal desorption spectroscopy (TDS), or the like, in some cases. For example, the excess oxygen 130 can be detected by ESR as a signal assigned to a peroxide radical. A peroxide radical causes an asymmetric signal with a g-factor of approximately 2.01. In the insulator 102 to which the oxygen ions 120 are added, the quantitative value of the peroxide radical is greater than or equal to $5 \times 10^{14}$ spins/cm$^2$ and less than or equal to $2 \times 10^{17}$ spins/cm$^2$, greater than or equal to $1 \times 10^{15}$ spins/cm$^2$ and less than or equal to $1 \times 10^{17}$ spins/cm$^2$, or greater than or equal to $2 \times 10^{15}$ spins/cm$^2$ and less than or equal to $5 \times 10^{16}$ spins/cm$^2$. The excess oxygen 130 is also detected as, for example, a gas having a mass-to-charge ratio of 32 by TDS with a surface temperature higher than or equal to 100° C. and lower than or equal to 700° C. or higher than or equal to 100° C. and lower than or equal to 500° C. In the insulator 102 to which the oxygen ions 120 are added, the quantitative value of oxygen detected by TDS is greater than or equal to $5 \times 10^{14}$ atoms/cm$^2$ and less than or equal to $2 \times 10^{17}$ atoms/cm$^2$, greater than or equal to $1 \times 10^{15}$ atoms/cm$^2$ and less than or equal to $1 \times 10^{17}$ atoms/cm$^2$, or greater than or equal to $2 \times 10^{15}$ atoms/cm$^2$ and less than or equal to $5 \times 10^{16}$ atoms/cm$^2$.

A method for measuring the amount of released oxygen by TDS analysis will be described below.

The total amount of released gas from a measurement sample in TDS analysis is proportional to the integral value of the ion intensity of the released gas. The total amount of released gas can be calculated by comparison with a reference sample.

For example, the number of released oxygen molecules ($N_{O2}$) from the measurement sample can be calculated according to the following formula using the TDS results of a silicon substrate containing hydrogen at a predetermined density, which is the reference sample, and the TDS results of the measurement sample. Here, all gases having a mass-to-charge ratio of 32 which are obtained in the TDS analysis are assumed to originate from an oxygen molecule. Note that $CH_3OH$, which is a gas having a mass-to-charge ratio of 32, is not taken into consideration because it is unlikely to be present. Furthermore, an oxygen molecule including an oxygen atom having a mass number of 17 or 18, which is an isotope of an oxygen atom, is also not taken into consideration because the proportion of such a molecule in the natural world is minimal.

$$N_{O2}=N_{H2}/S_{H2} \times S_{O2} \times \alpha$$

The value $N_{H2}$ is obtained by conversion of the number of hydrogen molecules desorbed from the reference sample into densities. The value $S_{H2}$ is the integral value of ion intensity when the reference sample is analyzed by TDS. Here, the reference value of the reference sample is set to $N_{H2}/S_{H2}$. The value $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen is measured with the thermal desorption spectroscopy apparatus EMD-WA1000S/W produced by ESCO Ltd., using a silicon substrate containing hydrogen atoms at $1\times10^{16}$ atoms/cm$^2$, for example, as the reference sample.

In the TDS analysis, oxygen is partly detected as an oxygen atom. The ratio between oxygen molecules and oxygen atoms can be calculated from the ionization rate of oxygen molecules. Since the above a includes the ionization rate of oxygen molecules, the amount of released oxygen atoms can also be estimated through the evaluation of the amount of released oxygen molecules.

Note that $N_{O2}$ is the amount of released oxygen molecules. The amount of released oxygen in the case of being converted into oxygen atoms is twice the amount of released oxygen molecules.

Damage 132 might occur in the layer 105 when the oxygen ions 120 are added to the insulator 102 (see FIG. 1C). The damage might generate carrier traps in an insulator, generate carrier traps or a carrier generation source in a semiconductor, or reduce carrier mobility and conductivity of a conductor. Thus, it is preferable to remove the layer 105 having the damage 132 regardless of whether the layer 105 is an insulator, a semiconductor, or a conductor. The layer 105 serves as a sacrificial layer.

The layer 105 is preferably removed by wet etching so that the insulator 102 or the like is not damaged. Specifically, an acidic aqueous solution containing phosphoric acid, nitric acid, oxalic acid, acetic acid, hydrochloric acid, sulfuric acid, or the like; or an alkaline aqueous solution containing ammonia, tetramethylammonium hydroxide, or the like may be used. Alternatively, the layer 105 may be removed by dry etching. Further alternatively, wet etching and dry etching may be used in combination. Still further alternatively, the layer 105 may be removed by dry etching and a surface and its vicinity of the insulator 102, which is exposed as a result of the dry etching, may be removed by wet etching.

Figure 1D:
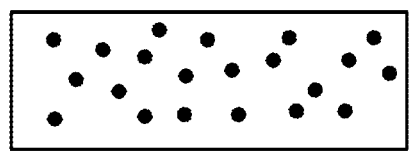

By the removal of the layer 105, formation of the insulator 102 containing the excess oxygen 130 is completed (see FIG. 1D).

Figure 1E:
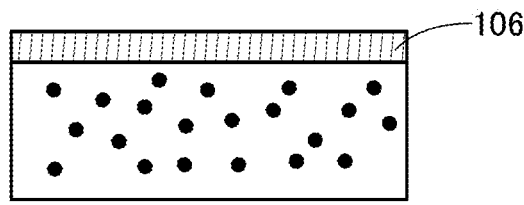

Next, a semiconductor 106 is formed over the insulator 102 (see FIG. 1E). Then, a semiconductor element can be formed using the semiconductor 106. A method for forming the semiconductor element will be described later. Note that a conductor or an insulator may be formed instead of the semiconductor 106, and the semiconductor element or the like may be formed using the conductor or the insulator.

For the semiconductor 106, an oxide semiconductor can be used, for example. Described below is the case where an oxide semiconductor is used for the semiconductor 106. The details of the oxide semiconductor will be described later.

After the semiconductor 106 is formed, heat treatment is preferably performed. The heat treatment can reduce the concentration of hydrogen in the semiconductor 106. Specifically, the semiconductor 106 subjected to the heat treatment has a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$.

Hydrogen in an oxide semiconductor might form a donor level. A donor level is formed also when hydrogen enters a site of an oxygen vacancy in an oxide semiconductor; thus, an oxide semiconductor with high hydrogen concentration has high carrier density. For this reason, if the semiconductor element is formed using the semiconductor 106 with high hydrogen concentration, the semiconductor 106 might be degenerated and might not serve as a semiconductor. Furthermore, when the semiconductor 106 with high hydrogen concentration is used, the threshold voltage of a transistor might shift in the negative direction to cause normally-on characteristics and as a result, power consumption might be increased.

Figure 2A:
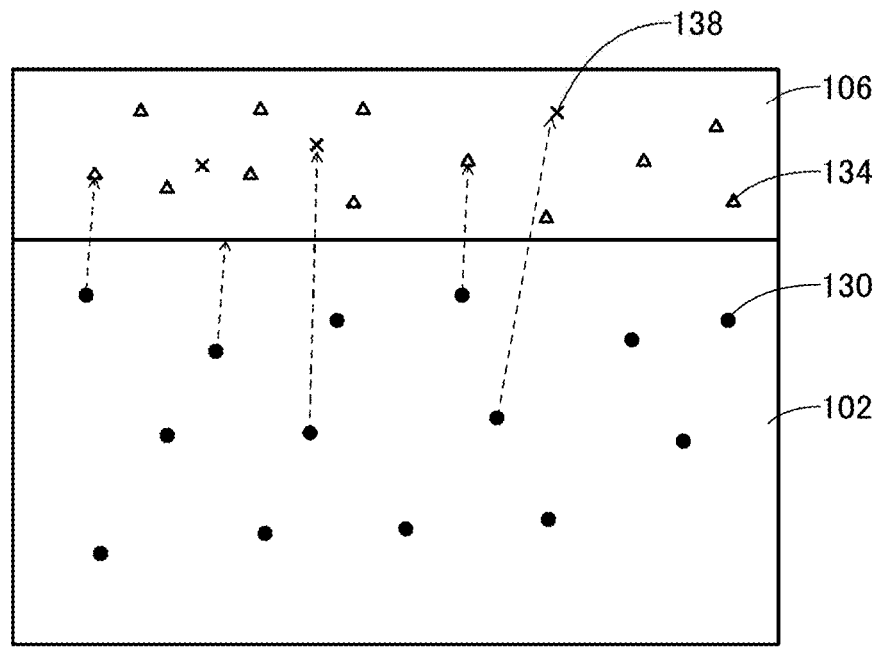
FIGS. 2A and 2B are cross-sectional views illustrating a method for manufacturing a semiconductor device of one embodiment of the present invention.

The heat treatment is preferably performed at a temperature at which the excess oxygen 130 in the insulator 102 can move to the semiconductor 106. As illustrated in FIG. 2A, the excess oxygen 130 in the insulator 102 moves to the semiconductor 106 by the heat treatment. The heat treatment is performed at a temperature higher than or equal to 250° C. and lower than or equal to 650° C., preferably higher than or equal to 350° C. and lower than or equal to 600° C., and further preferably higher than or equal to 450° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen.

Figure 2B:
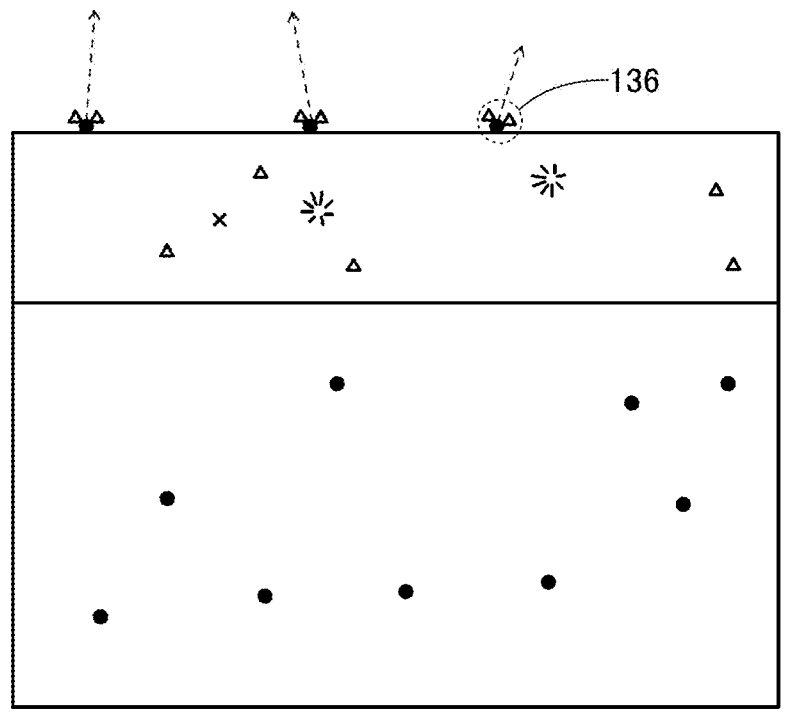

As illustrated in FIGS. 2A and 2B, there are hydrogen atoms 134 in the semiconductor 106. One atom of the excess oxygen 130 that has reached the semiconductor 106 is bonded to two hydrogen atoms 134; as a result, water 136 is formed (see FIG. 2B). The water 136 is released from a surface of the semiconductor 106. In this manner, the excess oxygen 130 in the insulator 102 can effectively reduce the concentration of hydrogen in the semiconductor 106 when heated.

In addition, the excess oxygen 130 in the insulator 102 can reduce oxygen vacancies 138 in the semiconductor 106 by entering sites of the oxygen vacancies 138. Not only might the oxygen vacancy in the oxide semiconductor cause formation of a donor level, but it might trap a hole generated by a stimulus such as light. For this reason, a reduction in the oxygen vacancies 138 in the semiconductor 106 enables the semiconductor element including the semiconductor 106 to have favorable electric characteristics and high reliability <Transistor>

A transistor, which is one kind of semiconductor element of one embodiment of the present invention, will be described below.

FIG. 3A, FIG. 4A, FIG. 5A, and FIG. 6A are top views illustrating a method for forming the transistor. In each of the top views, a dashed-dotted line A1-A2 and a dashed-dotted line A3-A4 are drawn. FIG. 3B, FIG. 4B, FIG. 5B, and FIG. 6B are cross-sectional views taken along the lines.

First, a substrate 400 is prepared.

As the substrate 400, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a single material semiconductor substrate of silicon, germanium, or the like and a compound semiconductor substrate of silicon carbide, silicon germanium, gallium arsenide, indium phosphide, zinc oxide, gallium oxide, or the like. A semiconductor substrate in which an insulator region is provided in the above semiconductor substrate, e.g., a silicon on insulator (SOI) substrate, may also be used. Examples of the conductor substrate include a graphite substrate, a metal substrate, an alloy substrate, a conductive resin substrate, a substrate containing a metal nitride, and a substrate containing a metal oxide. An insulator substrate provided with a conductor or a semiconductor, a semiconductor substrate provided with a conductor or an insulator, a conductor substrate provided with a semiconductor or an insulator, or the like may also be used. Each of these substrates may be provided with an element such as a capacitor, a resistor, a switching element, a light-emitting element, or a memory element.

Alternatively, a flexible substrate may be used as the substrate 400. As a method for providing a transistor over a flexible substrate, a method in which the transistor is formed over a non-flexible substrate and then the transistor is separated and transferred to the substrate 400 that is a flexible substrate is employed. In that case, a separation layer is preferably provided between the non-flexible substrate and the transistor. As the substrate 400, a sheet, a film, or a foil containing a fiber may be used. The substrate 400 may have elasticity. The substrate 400 may have a property of going back to its original shape when application of a bending or pulling force is stopped. Alternatively, the substrate 400 may have a property of not going back into its original shape. The thickness of the substrate 400 is, for example, greater than or equal to 5 µm and less than or equal to 700 µm, preferably greater than or equal to 10 µm and less than or equal to 500 µm, and further preferably greater than or equal to 15 µm and less than or equal to 300 µm. When the substrate 400 has a small thickness, the weight of the semiconductor device can be reduced. When the substrate 400 has a small thickness, even in the case of using glass or the like, the substrate 400 may have elasticity or a property of going back into its original shape when application of a bending or pulling force is stopped. Thus, an impact applied to the semiconductor device over the substrate 400, which is caused by dropping or the like, can be reduced. That is, a durable semiconductor device can be provided.

When a flexible substrate is used as the substrate 400, a metal, an alloy, a resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

Next, a conductor is formed. The conductor may be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

With a PECVD method, a high quality film can be obtained at relatively low temperatures. A TCVD method does not use plasma and thus causes less plasma damage to an object. A wiring, an electrode, an element (e.g., transistor or capacitor), or the like included in a semiconductor device might be charged up by receiving charges from plasma, for example. In that case, accumulated charges might break the wiring, electrode, element, or the like included in the semiconductor device. Such plasma damage is not caused in the case of using a TCVD method; thus, the yield of a semiconductor device can be increased. In addition, since plasma damage does not occur in the deposition by a TCVD method, a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method or an ALD method, a film is formed by reaction at a surface of an object. Thus, a CVD method or an ALD method enables favorable step coverage almost regardless of the shape of an object. In particular, an ALD method provides excellent step coverage and excellent thickness uniformity and thus can be favorably used for covering a surface of an opening with a high aspect ratio, for example. On the other hand, an ALD method has a relatively low deposition rate; thus, it might be preferable to combine an ALD method with another deposition method with a high deposition rate such as a CVD method.

When a CVD method or an ALD method is used, composition of a film to be formed can be controlled with a flow ratio of source gases. For example, by a CVD method or an ALD method, a film with a certain composition can be formed by adjusting the flow ratio of source gases. Moreover, by a CVD method or an ALD method, a film whose composition is continuously changed can be formed by changing the flow ratio of source gases while forming the film. In the case where the film is formed while changing the flow ratio of source gases, as compared to the case where the film is formed using a plurality of deposition chambers, time taken for the deposition can be reduced because time taken for transfer and pressure adjustment is omitted. Thus, semiconductor devices can be manufactured with improved productivity.

Next, a resist or the like is formed over the conductor, and the conductor is processed into a conductor 413 using the resist.

Here, an example of a method for forming a resist used in manufacture of the semiconductor device of one embodiment of the present invention is described. First, a layer of a photosensitive organic or inorganic substance is formed by a spin coating method or the like. Then, the layer of a photosensitive organic or inorganic substance is irradiated with light through a photomask. As the light, KrF excimer laser light, ArF excimer laser light, extreme ultraviolet (EUV) light, or the like may be used. Alternatively, a liquid immersion technique may be employed in which light exposure is performed with a portion between a substrate and a projection lens filled with liquid (e.g., water). The layer of a photosensitive organic or inorganic substance may be irradiated with an electron beam or an ion beam instead of the above light. Note that a photomask is not necessary in the case of using an electron beam or an ion beam. Next, an exposed region of the layer of a photosensitive organic or inorganic substance is removed or left using a developing solution. In this manner, the resist is formed.

Note that the case where a resist is formed also includes the case where a bottom antireflective coating (BARC) layer is formed below the resist. When the BARC layer is used, the BARC layer is etched first using the resist, and then, with the use of the resist and the BARC layer, an object to be processed is etched. Note that in some cases, a layer containing an organic or inorganic substance without a function of an antireflection layer may be used instead of the BARC layer.

The resist is removed after an object to be processed is subjected to etching or the like. The resist is removed by plasma treatment and/or wet etching. As the plasma treatment, plasma ashing is preferably used. When the resist or the like is removed insufficiently, the remaining resist or the like may be removed using hydrofluoric acid at a concentration of higher than or equal to 0.001 volume % and lower than or equal to 1 volume % and/or ozone water, for example.

The conductor to be the conductor 413 may be formed to have a single-layer structure or a stacked-layer structure including a conductor containing one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used.

Then, an insulator 402 is formed. The insulator 402 can be formed by a sputtering method, a CVD method, an MBE method, a PLD method, an ALD method, or the like.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 may have a function of preventing diffusion of impurities from the substrate 400.

Next, the insulator 402 containing excess oxygen is formed by the method described using FIGS. 1A to 1E and the like.

Then, a semiconductor is formed. The semiconductor can be formed by a sputtering method, a CVD method, an MBE method, a PLD method, an ALD method, or the like.

The insulator 402 corresponds to the insulator 102 illustrated in FIGS. 1A to 1E, and the semiconductor corresponds to the semiconductor 106.

After that, heat treatment is preferably performed. By the heat treatment, part of the excess oxygen in the insulator 402 moves to the semiconductor in some cases. Accordingly, the concentration of hydrogen in the semiconductor can be reduced owing to the mechanism described using FIGS. 2A and 2B and the like. In addition, oxygen vacancies in the semiconductor can be reduced.

Figure 3A:
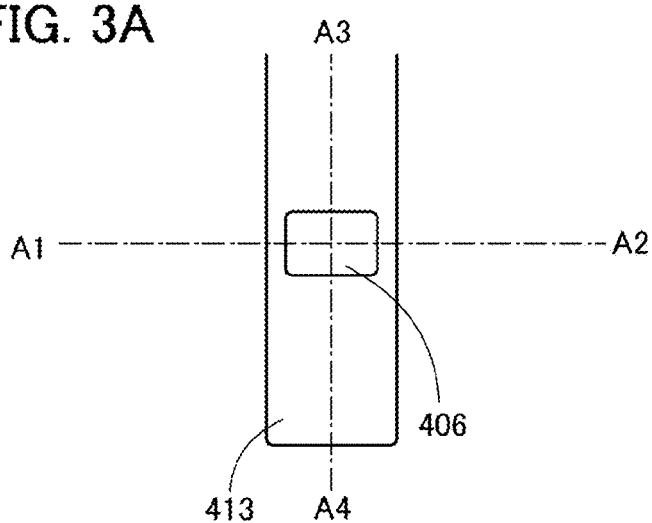
FIGS. 3A and 3B are a top view and a cross-sectional view illustrating a method for manufacturing a transistor of one embodiment of the present invention.
Figure 3B:
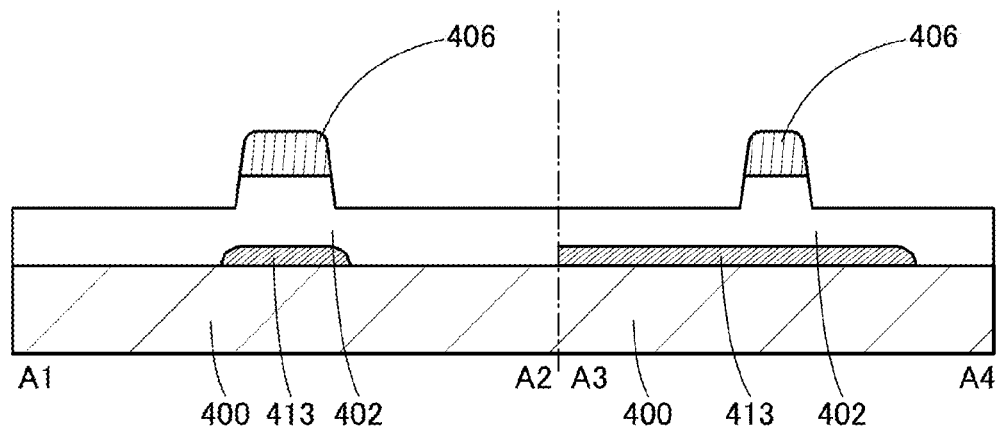

Subsequently, a resist or the like is formed over the semiconductor, and the semiconductor is processed into a semiconductor 406 using the resist (see FIGS. 3A and 3B). At this time, the insulator 402 may be partly etched in a region not overlapping with the semiconductor 406 so as to have a projection. With the insulator 402 having the projection, an s-channel structure, which is described later, can be easily formed.

After that, a conductor is formed. The conductor can be formed by a sputtering method, a CVD method, an MBE method, a PLD method, an ALD method, or the like.

Figure 4A:
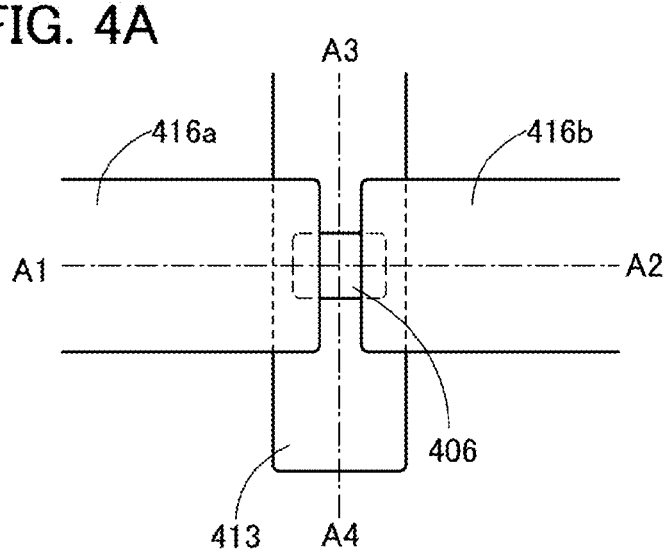
FIGS. 4A and 4B are a top view and a cross-sectional view illustrating a method for manufacturing a transistor of one embodiment of the present invention.
Figure 4B:
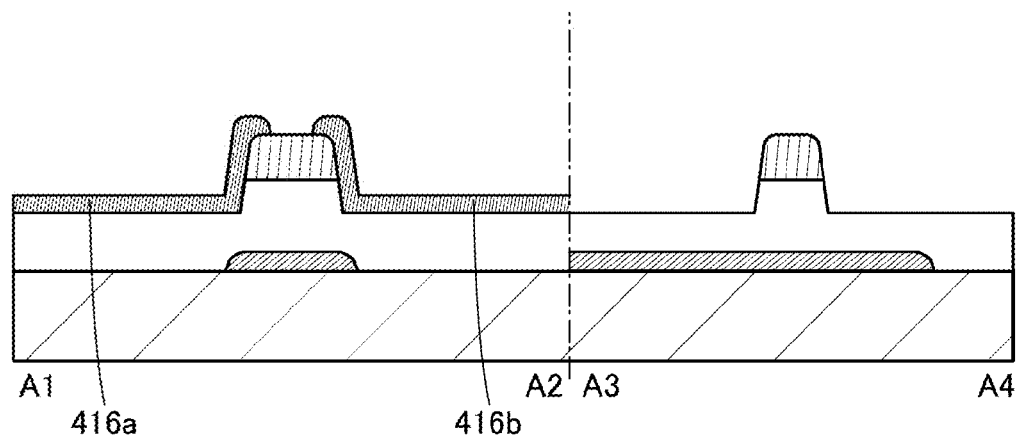
Figure 5A:
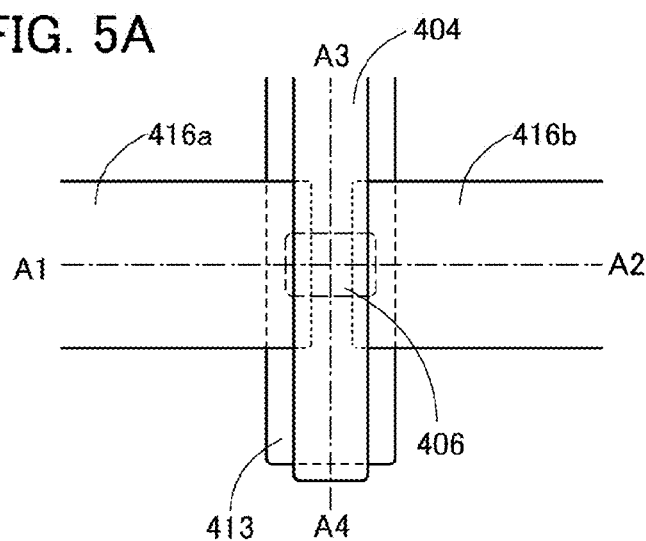
FIGS. 5A and 5B are a top view and a cross-sectional view illustrating a method for manufacturing a transistor of one embodiment of the present invention.
Figure 5B:
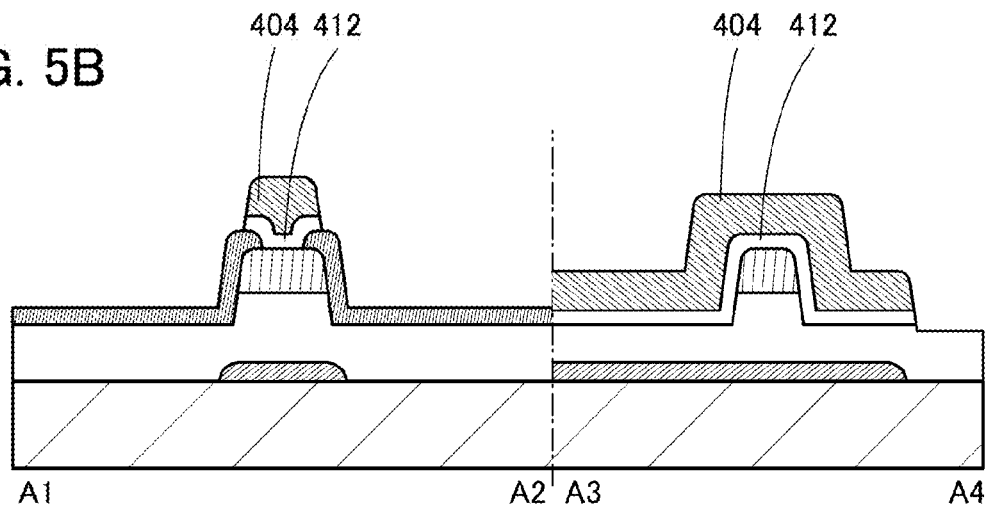

Next, a resist or the like is formed over the conductor, and the conductor is processed into a conductor 416a and a conductor 416b using the resist (see FIGS. 4A and 4B).

Then, an insulator is formed. The insulator can be formed by a sputtering method, a CVD method, an MBE method, a PLD method, an ALD method, or the like.

Subsequently, a conductor is formed. The conductor can be formed by a sputtering method, a CVD method, an MBE method, a PLD method, an ALD method, or the like.

After that, a resist or the like is formed over the conductor, and the conductor is processed into a conductor 404 using the resist. Furthermore, the insulator is processed into an insulator 412 using the resist or the conductor 404 (see FIGS. 5A and 5B). Although described here is the case where the insulator and the conductor are processed so that the insulator 412 and the conductor 404 have similar shapes when seen from the top, one embodiment of the present invention is not limited thereto. For example, different resists may be used to form the insulator 412 and the conductor 404, the conductor to be the conductor 404 may be formed after the insulator 412 is formed, or another resist or the like may be formed over the insulator to be the insulator 412 after the conductor 404 is formed.

The insulator to be the insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator to be the insulator 412 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor to be the conductor 404 may be formed to have, for example, a single-layer structure or a stacked-layer structure including a conductor containing one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used.

Next, an insulator 408 is formed. The insulator 408 can be formed by a sputtering method, a CVD method, an MBE method, a PLD method, an ALD method, or the like.

The insulator 408 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 408 is preferably formed to have, for example, a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

The insulator 408 preferably serves as a barrier layer. The insulator 408 has, for example, a function of blocking oxygen and/or hydrogen. Alternatively, the insulator 408 has, for example, a higher capability of blocking oxygen and/or hydrogen than any of the insulator 402, the insulator 412, and an insulator 418 to be formed later.

Figure 6A:
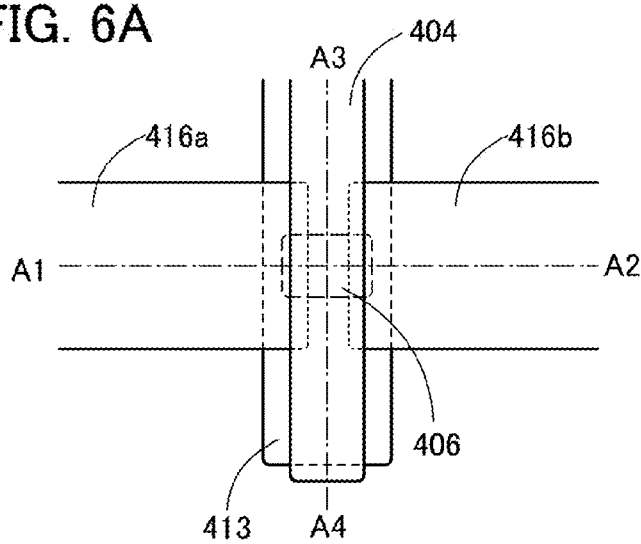
FIGS. 6A and 6B are a top view and a cross-sectional view illustrating a method for manufacturing a transistor of one embodiment of the present invention.
Figure 6B:
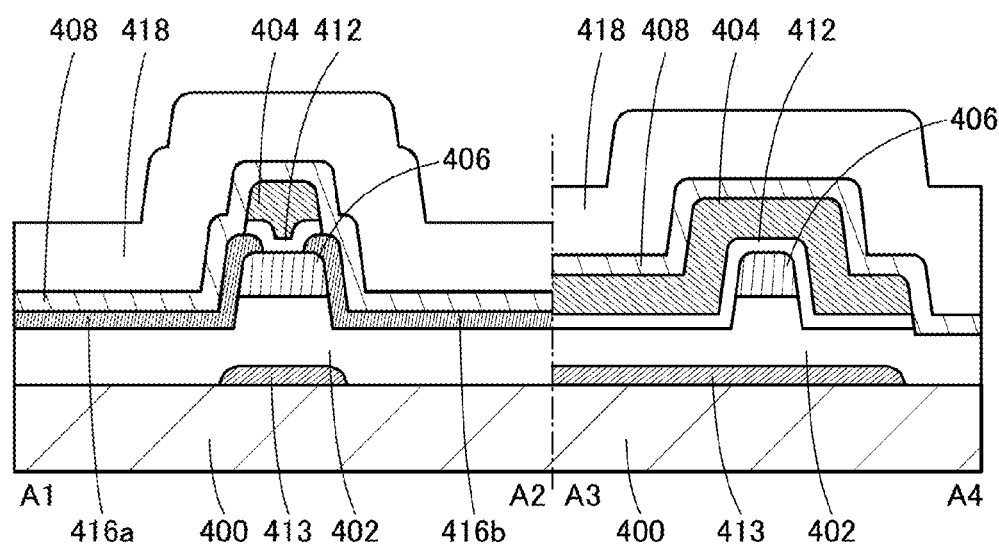

Then, the insulator 418 is formed (see FIGS. 6A and 6B). The insulator 418 can be formed by a sputtering method, a CVD method, an MBE method, a PLD method, an ALD method, or the like.

The insulator 418 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 418 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Figure 7A:
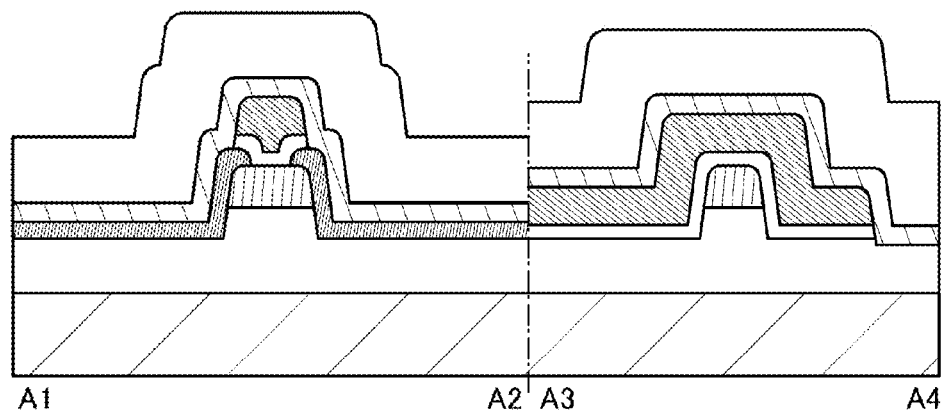
FIGS. 7A to 7C are cross-sectional views each illustrating a method for manufacturing a transistor of one embodiment of the present invention.
Figure 7B:
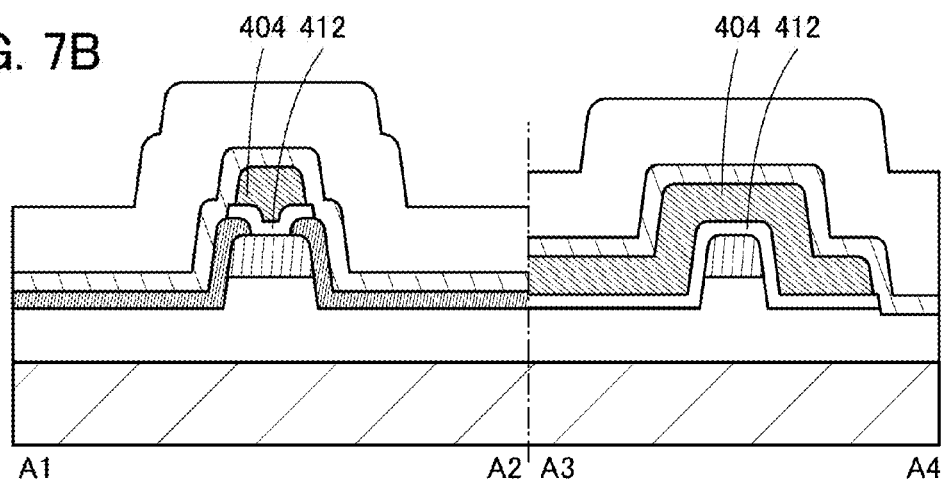
Figure 7C:
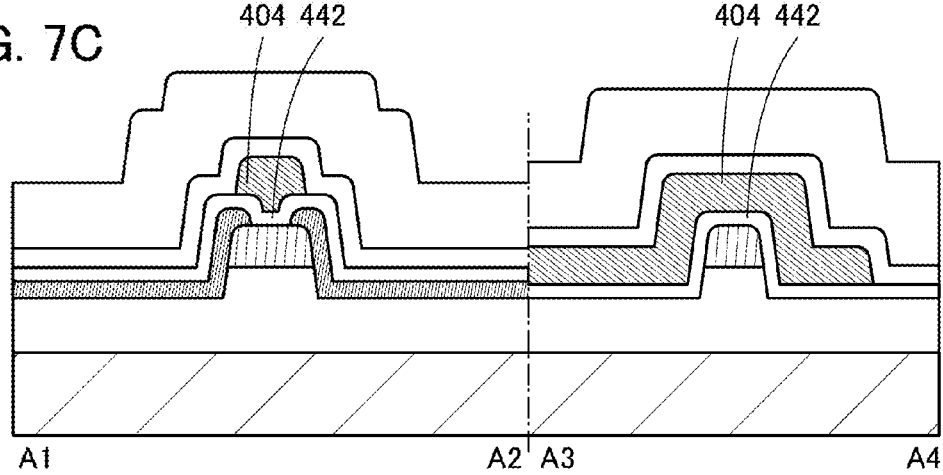

Through the above steps, the transistor of one embodiment of the present invention can be formed. Note that the conductor 413 is not necessarily formed (see FIG. 7A). Furthermore, an edge of the insulator 412 may extend beyond that of the conductor 404 (see FIG. 7B). The insulator to be the insulator 412 may be used as an insulator 442 without being processed (see FIG. 7C). The conductor 416a and the conductor 416b are not necessarily formed. The insulator 408 is not necessarily formed. The insulator 418 is not necessarily formed.

As illustrated in FIG. 6B, a side surface of the semiconductor 406 is in contact with the conductors 416a and 416b. The semiconductor 406 can be electrically surrounded by an electric field of the conductor 404 (a structure of a transistor in which a semiconductor is electrically surrounded by an electric field of a conductor is referred to as a surrounded channel (s-channel) structure). Thus, a channel is formed in the entire semiconductor 406 (the top, bottom, and side surfaces of the semiconductor 406). In the s-channel structure, a large amount of current can flow between a source and a drain of the transistor, so that a high on-state current can be achieved.

In the case where the transistor has the s-channel structure, a channel is formed also in the side surface of the semiconductor 406. Thus, the thicker the semiconductor 406 is, the larger a channel region is. In other words, the thicker the semiconductor 406 is, the larger the on-state current of the transistor is. In addition, as the thickness of the semiconductor 406 becomes larger, the proportion of the region with a high carrier controllability increases, leading to a smaller subthreshold swing value. The semiconductor 406 has, for example, a region with a thickness greater than or equal to 20 nm, preferably greater than or equal to 40 nm, further preferably greater than or equal to 60 nm, and still further preferably greater than or equal to 100 nm. In addition, to prevent a decrease in the productivity of the semiconductor device, the semiconductor 406 has, for example, a region with a thickness less than or equal to 300 nm, preferably less than or equal to 200 nm, and further preferably less than or equal to 150 nm.

The s-channel structure is suitable for a miniaturized transistor because a high on-state current can be achieved. A semiconductor device including the miniaturized transistor can have a high integration degree and high density. The transistor includes, for example, a region having a channel length of preferably less than or equal to 40 nm, further preferably less than or equal to 30 nm, and still further preferably less than or equal to 20 nm and a region having a channel width of preferably less than or equal to 40 nm, further preferably less than or equal to 30 nm, and still further preferably less than or equal to 20 nm.

Here, a method for forming a transistor that is partly different from the above-described transistor will be described. FIG. 8A, FIG. 9A, FIG. 10A, and FIG. 11A are top views illustrating the method for forming the transistor. In each of the top views, a dashed-dotted line F1-F2 and a dashed-dotted line F3-F4 are drawn. FIG. 8B, FIG. 9B, FIG. 10B, and FIG. 11B are cross-sectional views taken along the lines.

First, the substrate 400 is prepared.

Then, a conductor is formed. The conductor may be formed by a sputtering method, a CVD method, an MBE method, a PLD method, an ALD method, or the like.

Next, a resist or the like is formed over the conductor, and the conductor is processed into the conductor 413 using the resist.

After that, the insulator 402 is formed. The insulator 402 can be formed by a sputtering method, a CVD method, an MBE method, a PLD method, an ALD method, or the like.

Then, the insulator 402 containing excess oxygen is formed by the method described using FIGS. 1A to 1E and the like.

Subsequently, a semiconductor is formed. The semiconductor can be formed by a sputtering method, a CVD method, an MBE method, a PLD method, an ALD method, or the like.

The insulator 402 corresponds to the insulator 102 illustrated in FIGS. 1A to 1E, and the semiconductor corresponds to the semiconductor 106.

Then, heat treatment is preferably performed. By the heat treatment, part of the excess oxygen in the insulator 402 moves to the semiconductor in some cases. Accordingly, the concentration of hydrogen in the semiconductor can be reduced owing to the mechanism described using FIGS. 2A and 2B and the like. In addition, oxygen vacancies in the semiconductor can be reduced.

After that, a conductor is formed. The conductor can be formed by a sputtering method, a CVD method, an MBE method, a PLD method, an ALD method, or the like.

Next, a resist or the like is formed over the conductor, and the conductor is processed into a conductor 416 using the resist.

Figure 8A:
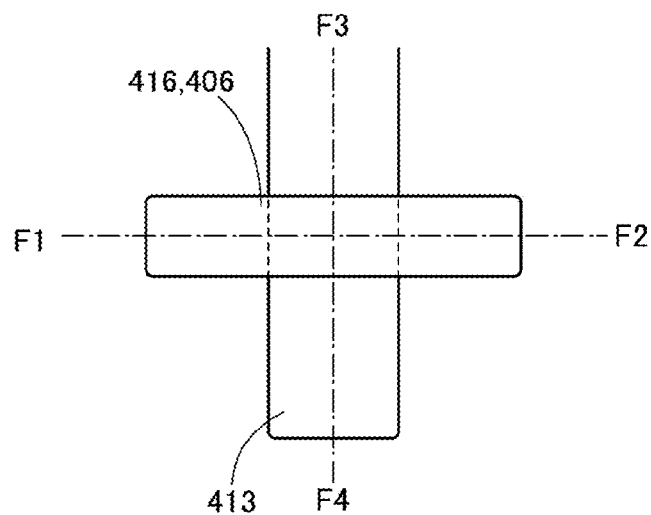
FIGS. 8A and 8B are a top view and a cross-sectional view illustrating a method for manufacturing a transistor of one embodiment of the present invention.
Figure 8B:
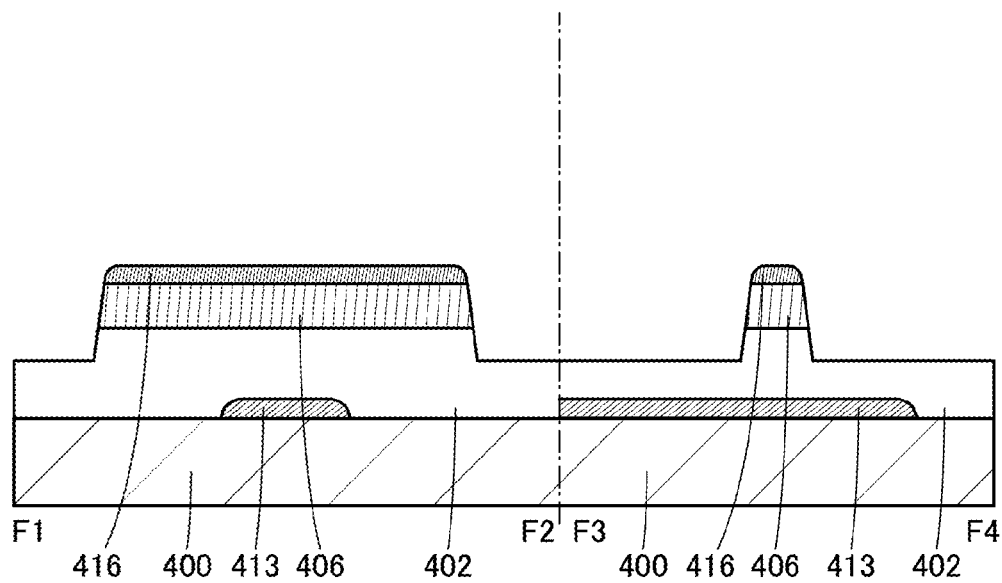

Subsequently, the semiconductor is processed into the semiconductor 406 using the conductor 416 (see FIGS. 8A and 8B). At this time, the insulator 402 may be partly etched in a region not overlapping with the semiconductor 406 so as to have a projection.

Figure 9A:
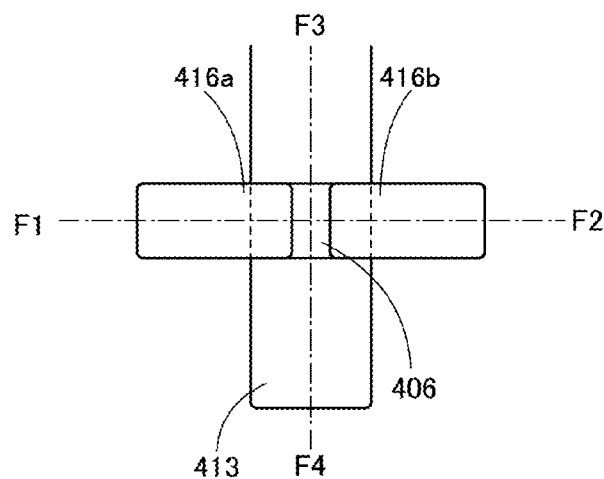
FIGS. 9A and 9B are a top view and a cross-sectional view illustrating a method for manufacturing a transistor of one embodiment of the present invention.
Figure 9B:
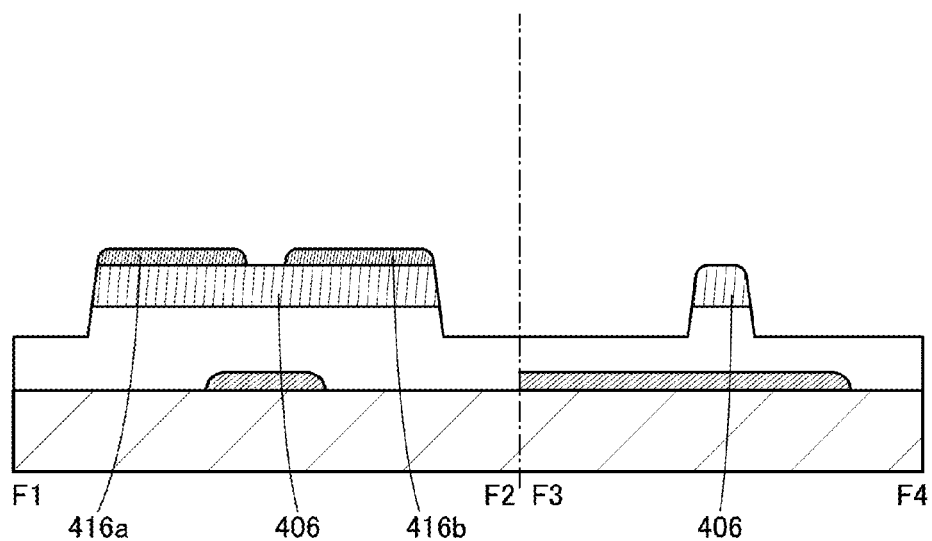
Figure 10A:
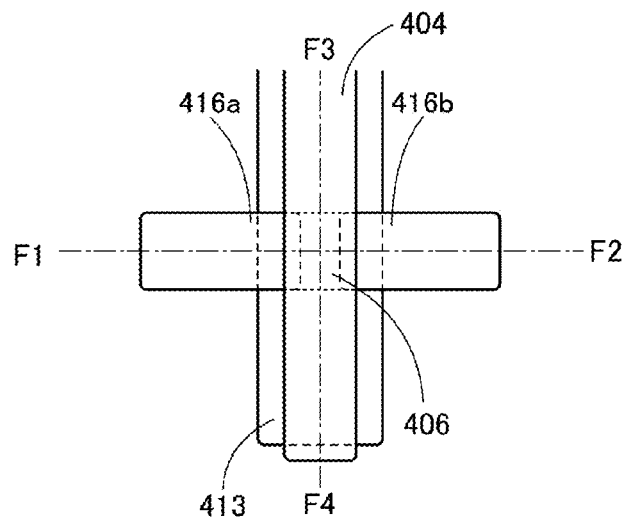
FIGS. 10A and 10B are a top view and a cross-sectional view illustrating a method for manufacturing a transistor of one embodiment of the present invention.
Figure 10B:
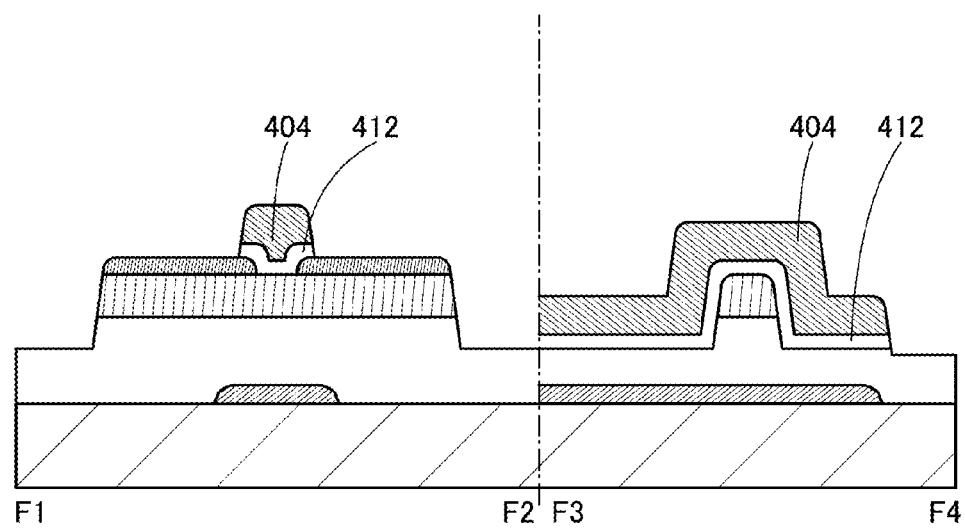

Then, a resist or the like is formed over the conductor 416, and the conductor 416 is processed into the conductor 416a and the conductor 416b using the resist (see FIGS. 9A and 9B).

Next, an insulator is formed. The insulator can be formed by a sputtering method, a CVD method, an MBE method, a PLD method, an ALD method, or the like.

Subsequently, a conductor is formed. The conductor can be formed by a sputtering method, a CVD method, an MBE method, a PLD method, an ALD method, or the like.

After that, a resist or the like is formed over the conductor, and the conductor is processed into the conductor 404 using the resist. Furthermore, the insulator is processed into the insulator 412 using the resist or the conductor 404 (see FIGS. 10A and 10B). Although described here is the case where the insulator and the conductor are processed so that the insulator 412 and the conductor 404 have similar shapes when seen from the top, one embodiment of the present invention is not limited thereto. For example, different resists may be used to form the insulator 412 and the conductor 404, the conductor to be the conductor 404 may be formed after the insulator 412 is formed, or another resist or the like may be formed over the insulator to be the insulator 412 after the conductor 404 is formed.

Next, the insulator 408 is formed. The insulator 408 can be formed by a sputtering method, a CVD method, an MBE method, a PLD method, an ALD method, or the like.

Figure 11A:
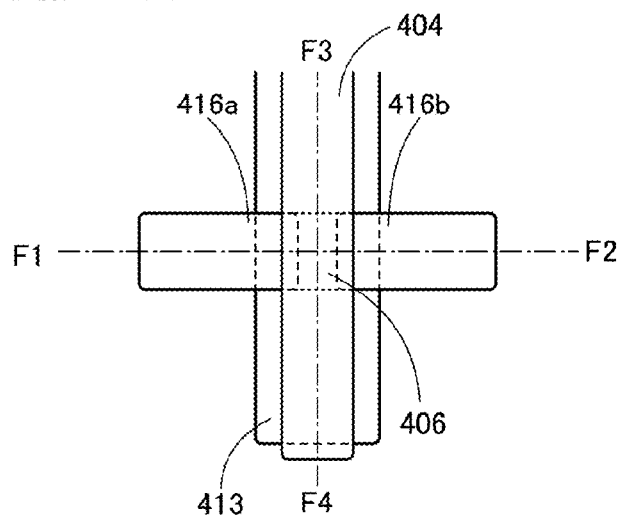
FIGS. 11A and 11B are a top view and a cross-sectional view illustrating a method for manufacturing a transistor of one embodiment of the present invention.
Figure 11B:
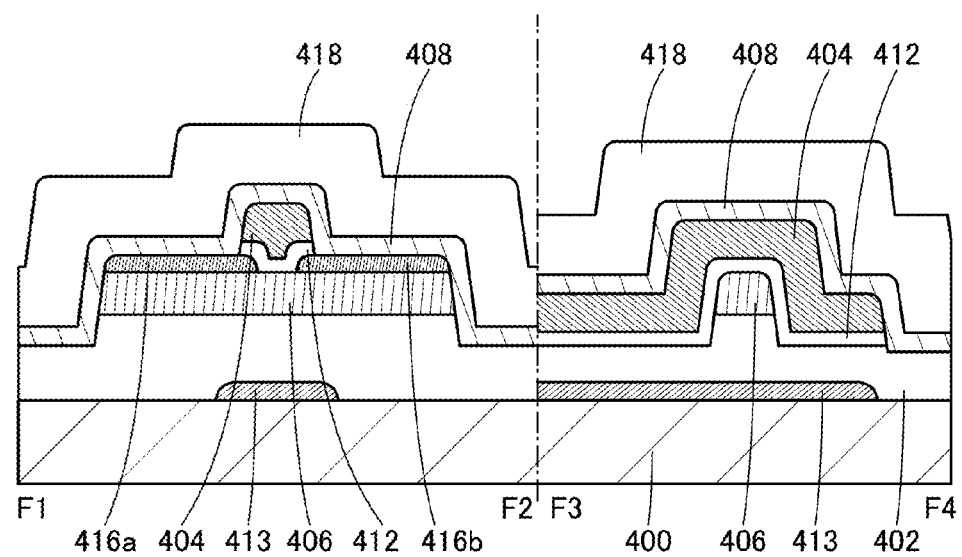

Then, the insulator 418 is formed (see FIGS. 11A and 11B). The insulator 418 can be formed by a sputtering method, a CVD method, an MBE method, a PLD method, an ALD method, or the like.

Figure 12A:
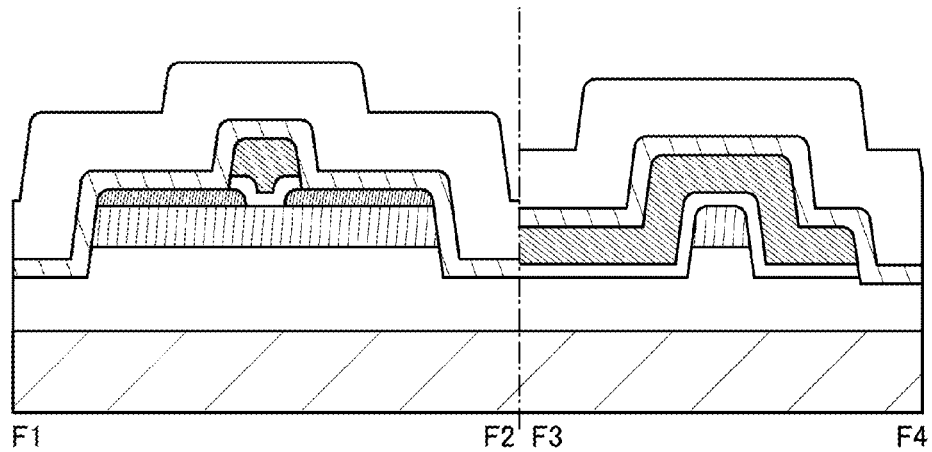
FIGS. 12A to 12C are cross-sectional views each illustrating a method for manufacturing a transistor of one embodiment of the present invention.
Figure 12B:
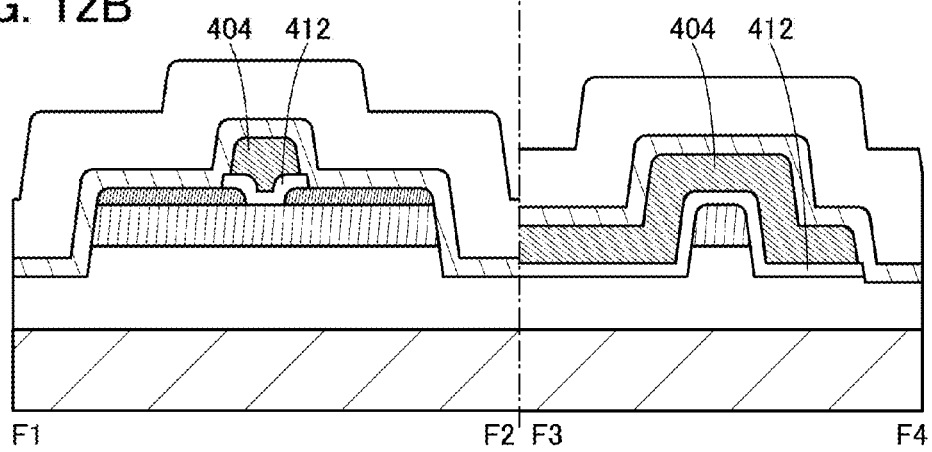
Figure 12C:
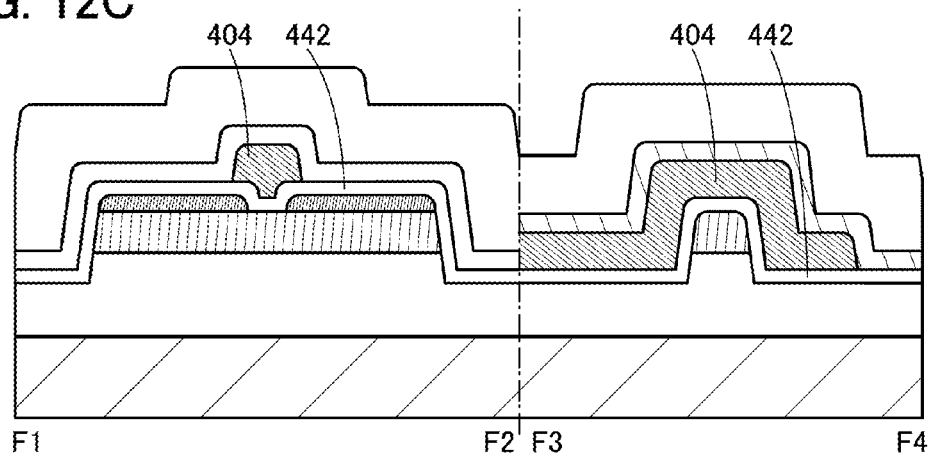

Through the above steps, the transistor of one embodiment of the present invention can be formed. Note that the conductor 413 is not necessarily formed (see FIG. 12A). Furthermore, an edge of the insulator 412 may extend beyond that of the conductor 404 (see FIG. 12B). The insulator to be the insulator 412 may be used as the insulator 442 without being processed (see FIG. 12C). The conductor 416a and the conductor 416b are not necessarily formed. The insulator 408 is not necessarily formed. The insulator 418 is not necessarily formed.

As illustrated in FIG. 11B, the transistor has an s-channel structure. In the s-channel structure, a large amount of current can flow between a source and a drain of the transistor, so that a high on-state current can be achieved.
<Semiconductor>

By placing semiconductors over and under the semiconductor 406, electrical characteristics of the transistor can be increased in some cases. The semiconductor 406 and semiconductors placed over and under the semiconductor 406 will be described in detail below with reference to FIGS. 13A to 13E.

Figure 13A:
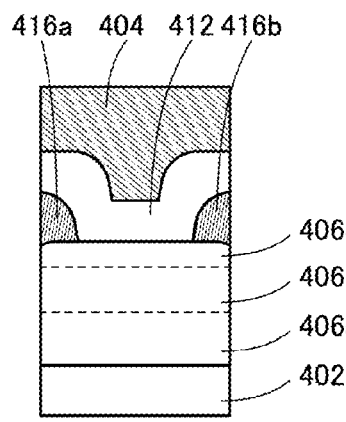
FIGS. 13A to 13D are cross-sectional views illustrating transistors of one embodiment of the present invention.
Figure 13B:
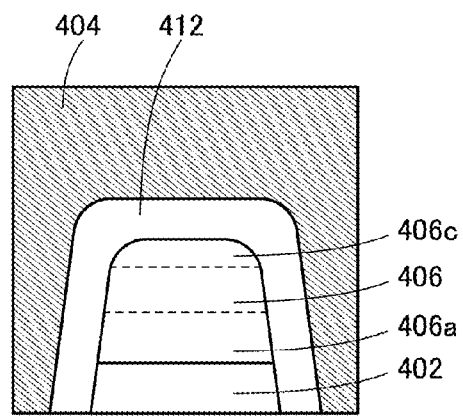

FIG. 13A is an enlarged cross-sectional view illustrating the semiconductor 406 and its vicinity of the transistor illustrated in FIG. 6B or FIG. 11B in the channel length direction. FIG. 13B is an enlarged cross-sectional view illustrating the semiconductor 406 and its vicinity of the transistor illustrated in FIG. 6B or FIG. 11B in the channel width direction.

In the transistor structure illustrated in FIGS. 13A and 13B, a semiconductor 406a is placed between the insulator 402 and the semiconductor 406. In addition, a semiconductor 406c is placed between the semiconductor 406 and the conductors 416a and 416b and between the semiconductor 406 and the insulator 412.

Figure 13C:
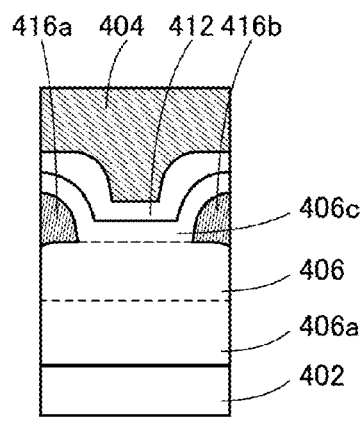
Figure 13D:
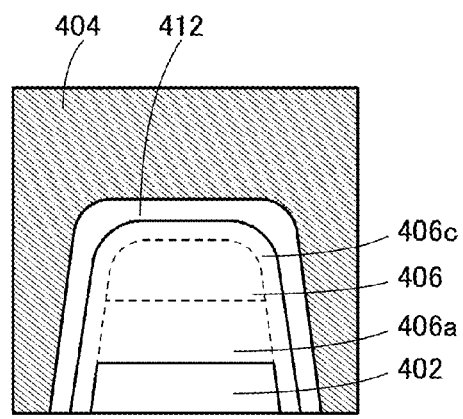
Figure 13E:
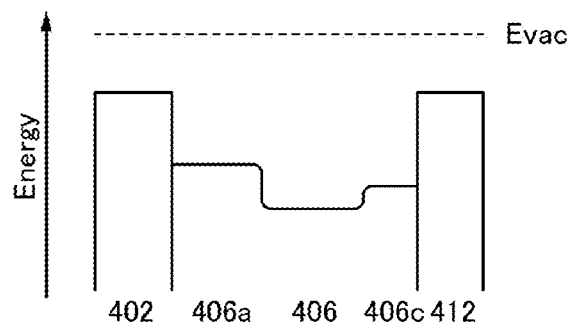
FIG. 13E is a band diagram of each of the transistors.

Alternatively, the transistor may have a structure illustrated in FIGS. 13C and 13D.

FIG. 13C is an enlarged cross-sectional view illustrating the semiconductor 406 and its vicinity of the transistor illustrated in FIG. 6B or FIG. 11B in the channel length direction. FIG. 13D is an enlarged cross-sectional view illustrating the semiconductor 406 and its vicinity of the transistor illustrated in FIG. 6B or FIG. 11B in the channel width direction.

In the transistor structure illustrated in FIGS. 13C and 13D, the semiconductor 406a is placed between the insulator 402 and the semiconductor 406. In addition, the semiconductor 406c is placed between the insulator 412 and the conductors 416a and 416b, the semiconductor 406, the semiconductor 406a, and the insulator 402.

The semiconductor 406 is an oxide semiconductor containing indium, for example. The oxide semiconductor 406 can have high carrier mobility (electron mobility) by containing indium, for example. The semiconductor 406 preferably contains an element M. The element M is preferably aluminum, gallium, yttrium, tin, or the like. Boron, silicon, titanium, iron, nickel, germanium, zirconium, molybdenum, lanthanum, cerium, neodymium, hafnium, tantalum, tungsten, or the like can also be used as the element M. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406 preferably contains zinc. When the oxide semiconductor contains zinc, the oxide semiconductor is easily crystallized, in some cases.

Note that the semiconductor 406 is not limited to the oxide semiconductor containing indium. The semiconductor 406 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406, an oxide with a wide energy gap may be used, for example. For example, the energy gap of the semiconductor 406 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the semiconductor 406a and the semiconductor 406c are oxide semiconductors including one or more elements, or two or more elements other than oxygen included in the semiconductor 406. Since the semiconductor 406a and the semiconductor 406c each include one or more elements, or two or more elements other than oxygen included in the semiconductor 406, a defect state is less likely to be formed at the interface between the semiconductor 406a and the semiconductor 406 and the interface between the semiconductor 406 and the semiconductor 406c.

The semiconductor 406a, the semiconductor 406, and the semiconductor 406c preferably include at least indium. In the case of using an In-M-Zn oxide as the semiconductor 406a, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406, when a summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the semiconductor 406c, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor 406c may be an oxide that is of the same type as the oxide of the semiconductor 406a. Note that the semiconductor 406a and/or the semiconductor 406c do/does not necessarily contain indium in some cases. For example, the semiconductor 406a and/or the semiconductor 406c may be gallium oxide. Note that the atomic ratios of the elements included in the semiconductor 406a, the semiconductor 406, and the semiconductor 406c are not necessarily simple ratios of integers.

As the semiconductor 406, an oxide having an electron affinity larger than those of the semiconductors 406a and 406c is used. For example, as the semiconductor 406, an oxide having an electron affinity larger than those of the semiconductors 406a and 406c by 0.07 eV or larger and 1.3 eV or smaller, preferably 0.1 eV or larger and 0.7 eV or smaller, further preferably 0.15 eV or larger and 0.4 eV or smaller is used. Note that the electron affinity refers to an energy difference between the vacuum level and the conduction band minimum.

An indium gallium oxide has small electron affinity and a high oxygen-blocking property. Thus, the semiconductor 406c preferably includes an indium gallium oxide. The gallium atomic ratio [Ga/(In+Ga)] is, for example, higher than or equal to 70%, preferably higher than or equal to 80%, further preferably higher than or equal to 90%.

At this time, when a gate voltage is applied, a channel is formed in the semiconductor 406 having the largest electron affinity in the semiconductors 406a, 406, and 406c.

Here, in some cases, there is a mixed region of the semiconductor 406a and the semiconductor 406 between the semiconductor 406a and the semiconductor 406. Furthermore, in some cases, there is a mixed region of the semiconductor 406 and the semiconductor 406c between the semiconductor 406 and the semiconductor 406c. The mixed region has a low density of defect states. For that reason, the stack including the semiconductor 406a, the semiconductor 406, and the semiconductor 406c has a band structure where energy is changed continuously at each interface and in the vicinity of the interface (continuous junction) (see FIG. 13E). Note that boundaries of the semiconductor 406a, the semiconductor 406, and the semiconductor 406c are not clear in some cases.

At this time, electrons move mainly in the semiconductor 406, not in the semiconductor 406a and the semiconductor 406c. As described above, when the density of defect states at the interface between the semiconductor 406a and the semiconductor 406 and the density of defect states at the interface between the semiconductor 406 and the semiconductor 406c are decreased, electron movement in the semiconductor 406 is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of a top surface or a bottom surface of the semiconductor 406 (a formation surface; here, the semiconductor 406a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

Moreover, the thickness of the semiconductor 406c is preferably as small as possible to increase the on-state current of the transistor. For example, the semiconductor 406c is formed to include a region having a thickness of less than 10 nm, preferably less than or equal to 5 nm, further preferably less than or equal to 3 nm. Meanwhile, the semiconductor 406c has a function of blocking entry of elements other than oxygen (such as hydrogen and silicon) included in the adjacent insulator into the semiconductor 406 where a channel is formed. For this reason, it is preferable that the semiconductor 406c have a certain thickness. For example, the semiconductor 406c is formed to include a region having a thickness of greater than or equal to 0.3 nm, preferably greater than or equal to 1 nm, further preferably greater than or equal to 2 nm. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a includes a region with a thickness of, for example, greater than or equal to 10 nm, preferably greater than or equal to 20 nm, further preferably greater than or equal to 40 nm, still further preferably greater than or equal to 60 nm. When the thickness of the semiconductor 406a is made large, a distance from an interface between the adjacent insulator and the semiconductor 406a to the semiconductor 406 in which a channel is formed can be large. Since the productivity of the semiconductor device might be decreased, the semiconductor 406a has a region with a thickness of, for example, less than or equal to 200 nm, preferably less than or equal to 120 nm, further preferably less than or equal to 80 nm.

For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406 and the semiconductor 406a. A region with a silicon concentration measured by SIMS of higher than or equal to $1\times10^{16}$ atoms/cm$^3$ and lower than or equal to $1 \times 10^{19}$ atoms/cm$^3$, preferably higher than or equal to $1 \times 10^{16}$ atoms/cm$^3$ and lower than or equal to $5 \times 10^{18}$ atoms/cm$^3$, further preferably higher than or equal to $1 \times 10^{16}$ atoms/cm$^3$ and lower than or equal to $2 \times 10^{18}$ atoms/cm$^3$ is provided between the semiconductor 406 and the semiconductor 406c.

It is preferable to reduce the hydrogen concentration in the semiconductor 406a and the semiconductor 406c in order to reduce the hydrogen concentration in the semiconductor 406. The semiconductor 406a and the semiconductor 406c each include a region with a hydrogen concentration measured by SIMS of higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, further preferably higher than or equal to $1 \times 10^{16}$ atoms/cm$^3$ and lower than or equal to $1 \times 10^{19}$ atoms/cm$^3$, or still further preferably higher than or equal to $1 \times 10^{16}$ atoms/cm$^3$ and lower than or equal to $5 \times 10^{18}$ atoms/cm$^3$. Furthermore, it is preferable to reduce the nitrogen concentration in the semiconductor 406a and the semiconductor 406c in order to reduce the nitrogen concentration in the semiconductor 406. The semiconductor 406a and the semiconductor 406c includes a region with a nitrogen concentration measured by SIMS of higher than or equal to $1 \times 10^{15}$ atoms/cm$^3$ and lower than or equal to $5 \times 10^{19}$ atoms/cm$^3$, preferably higher than or equal to $1 \times 10^{15}$ atoms/cm$^3$ and lower than or equal to $5 \times 10^{18}$ atoms/cm$^3$, further preferably higher than or equal to $1 \times 10^{15}$ atoms/cm$^3$ and lower than or equal to $1 \times 10^{18}$ atoms/cm$^3$, or still further preferably higher than or equal to $1 \times 10^{15}$ atoms/cm$^3$ and lower than or equal to $5 \times 10^{17}$ atoms/cm$^3$.

The above three-layer structure is an example. For example, a two-layer structure without the semiconductor 406a or the semiconductor 406c may be employed. Alternatively, a four-layer structure in which any one of the semiconductors described as examples of the semiconductor 406a, the semiconductor 406, and the semiconductor 406c is provided under or over the semiconductor 406a or under or over the semiconductor 406c may be employed. An n-layer structure (n is an integer of 5 or more) in which one or more of the semiconductors described as examples of the semiconductor 406a, the semiconductor 406, and the semiconductor 406c is provided at two or more of the following positions: over the semiconductor 406a, under the semiconductor 406a, over the semiconductor 406c, and under the semiconductor 406c.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 32A:
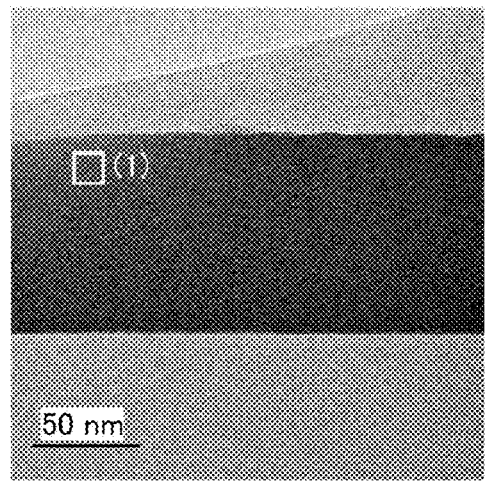
FIGS. 32A to 32D are Cs-corrected high-resolution TEM images of a cross section of a CAAC-OS and a cross-sectional schematic view of a CAAC-OS.

A CAAC-OS observed with TEM is described below. FIG. 32A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 32B:
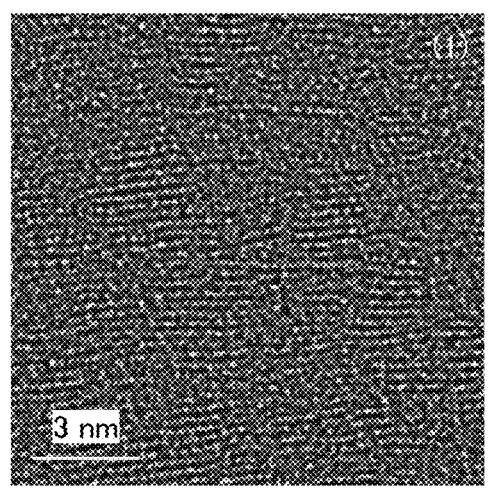

FIG. 32B is an enlarged Cs-corrected high-resolution TEM image of a region (1) in FIG. 32A. FIG. 32B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 32C:
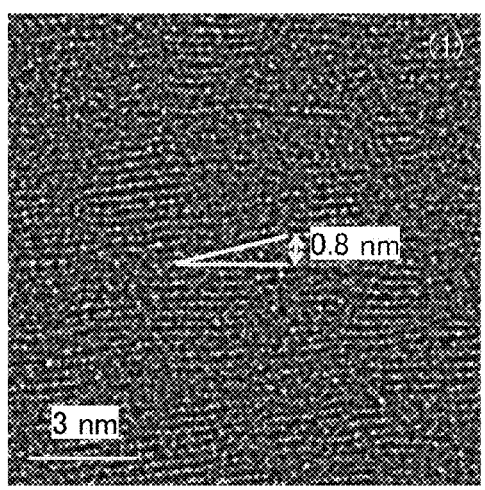

As shown in FIG. 32B, the CAAC-OS has a characteristic atomic arrangement. The characteristic atomic arrangement is denoted by an auxiliary line in FIG. 32C. FIGS. 32B and 32C prove that the size of a pellet is approximately 1 nm to 3 nm, and the size of a space caused by tilt of the pellets is approximately 0.8 nm. Thus, the pellet can also be referred to as a nanocrystal (nc).

Figure 32D:
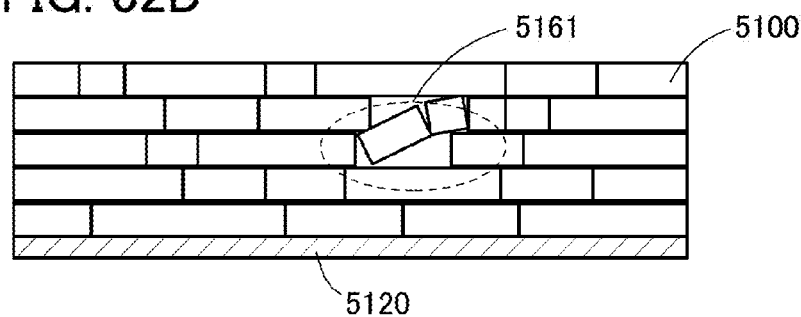

Here, according to the Cs-corrected high-resolution TEM images, the schematic arrangement of pellets 5100 of a CAAC-OS over a substrate 5120 is illustrated by such a structure in which bricks or blocks are stacked (see FIG. 32D). The part in which the pellets are tilted as observed in FIG. 32C corresponds to a region 5161 shown in FIG. 32D.

FIG. 33A shows a Cs-corrected high-resolution TEM image of a plane of the CAAC-OS observed from a direction substantially perpendicular to the sample surface. FIGS. 33B, 33C, and 33D are enlarged Cs-corrected high-resolution TEM images of regions (1), (2), and (3) in FIG. 33A, respectively. FIGS. 33B, 33C, and 33D indicate that metal atoms are arranged in a triangular, quadrangular, or hexagonal configuration in a pellet. However, there is no regularity of arrangement of metal atoms between different pellets.

Figure 34A:
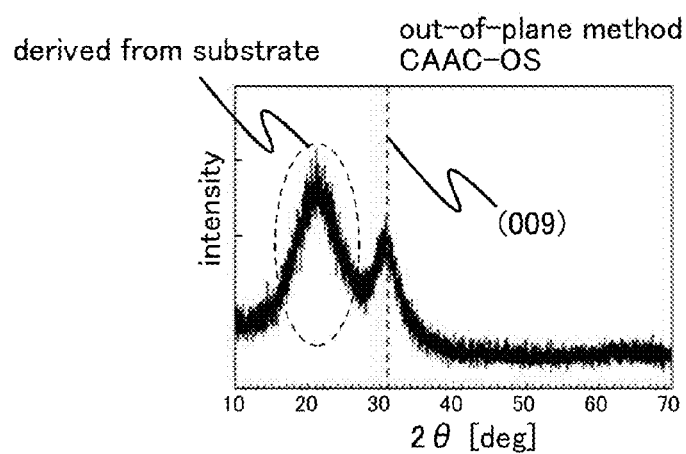
FIGS. 34A to 34C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 34A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 34B:
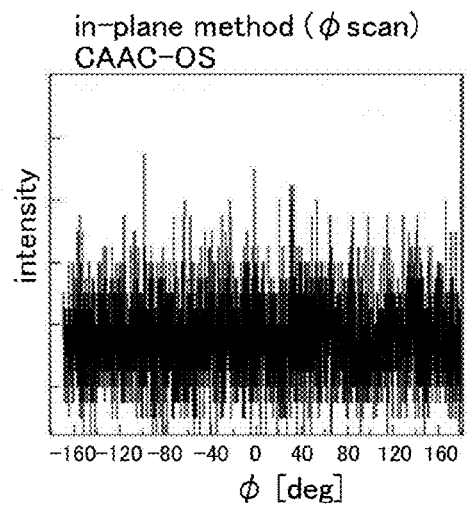
Figure 34C:
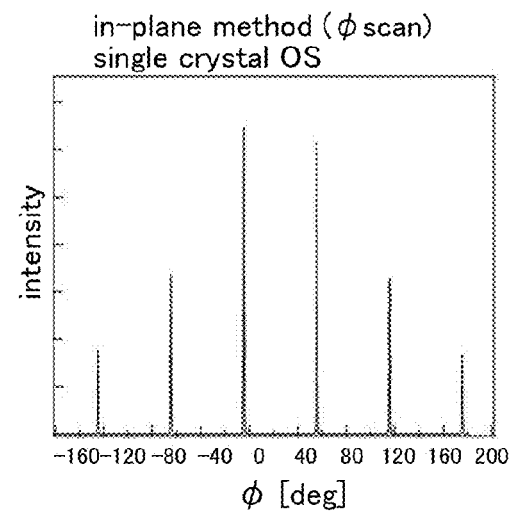

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 34B, a peak is not clearly observed. In contrast, in the case of a single crystal oxide semiconductor of InGaZnO$_4$, when φ scan is performed with 2θ fixed at around 56°, as shown in FIG. 34C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 35A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 35B shows a diffraction pattern obtained in such a manner that an electron beam with a probe diameter of 300 nm is incident on the same sample in a direction perpendicular to the sample surface. As shown in FIG. 35B, a ring-like diffraction pattern is observed. Thus, the electron diffraction also indicates that the a-axes and b-axes of the pellets included in the CAAC-OS do not have regular alignment. The first ring in FIG. 35B is considered to be derived from the (010) plane, the (100) plane, and the like of the InGaZnO$_4$ crystal. The second ring in FIG. 35B is considered to be derived from the (110) plane and the like.

Moreover, the CAAC-OS is an oxide semiconductor having a low density of defect states. Defects in the oxide semiconductor are, for example, a defect due to impurity and oxygen vacancies. Thus, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Thus, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Thus, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Thus, the nc-OS is likely to have a lower density of defect states than an amorphous oxide semiconductor. Note that there is no regularity of crystal orientation between different pellets in the nc-OS. Thus, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Thus, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 36:
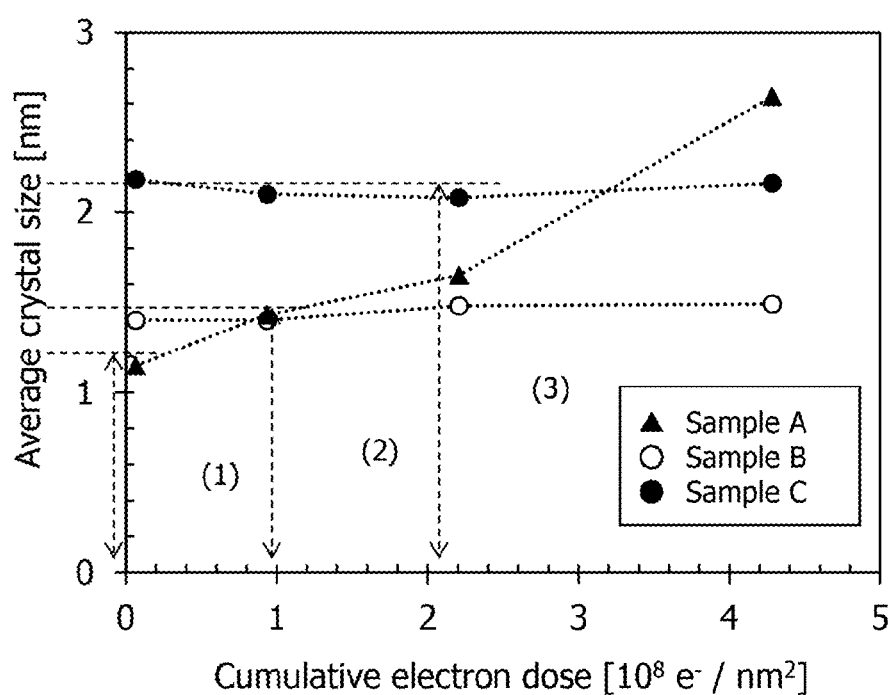
FIG. 36 shows a change in crystal part of an In—Ga—Zn oxide induced by electron irradiation.

FIG. 36 shows change in the average size of crystal parts (at 22 points to 45 points) in each sample. Note that the crystal part size corresponds to the length of a lattice fringe. FIG. 36 indicates that the crystal part size in the a-like OS increases with an increase in the cumulative electron dose. Specifically, as shown by (1) in FIG. 36, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 36, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Thus, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 37A:
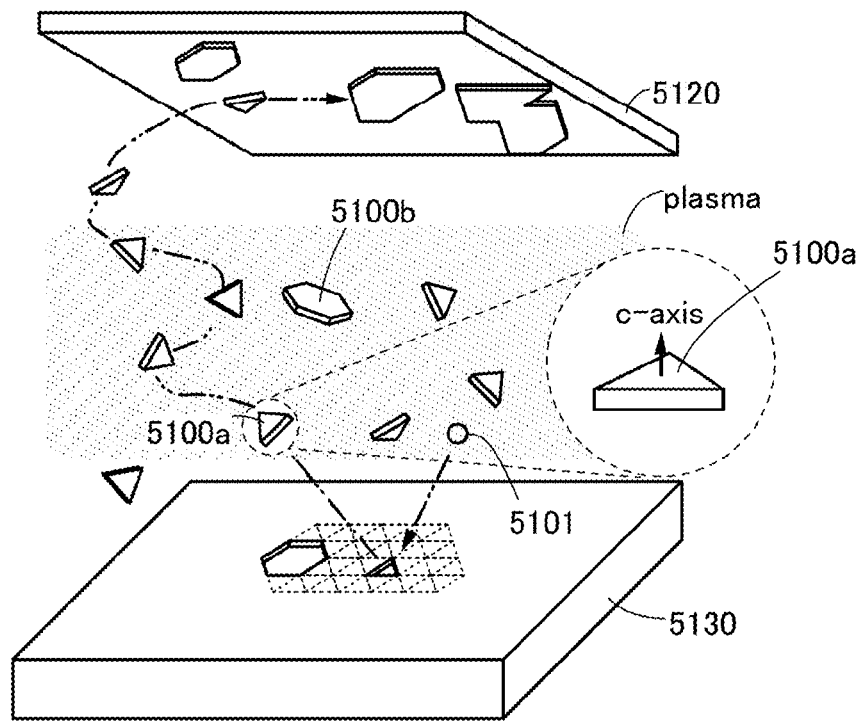
FIGS. 37A and 37B are schematic views showing deposition models of a CAAC-OS and an nc-OS.

FIG. 37A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 38A:
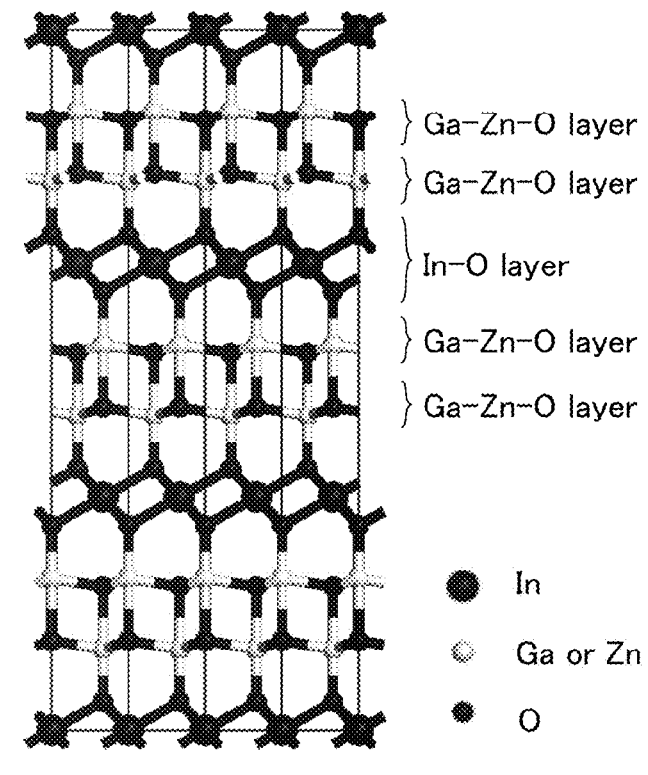
FIGS. 38A to 38C show an InGaZnO$_4$ crystal and a pellet.

Here, the target 5130 has a polycrystalline structure which includes a plurality of crystal grains and in which a cleavage plane exists in at least one crystal grain. FIG. 38A shows a structure of an $InGaZnO_4$ crystal included in the target 5130 as an example. Note that FIG. 38A shows a structure of the case where the $InGaZnO_4$ crystal is observed from a direction parallel to the b-axis. FIG. 38A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 38B:
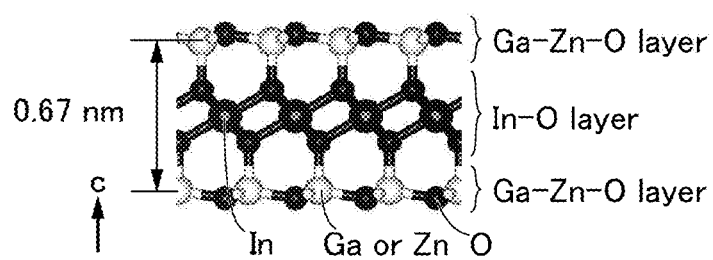
Figure 38C:
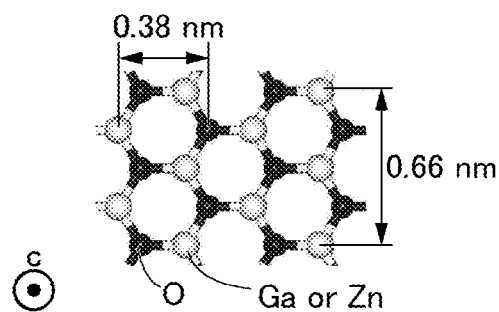

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 36. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 38B is separated. Note that FIG. 38C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 36 corresponds to the amount of growth in plasma. Here, in the case where the temperature of the substrate 5120 is at around room temperature, the pellet 5100 on the substrate 5120 hardly grows; thus, an nc-OS is formed (see FIG. 37B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 37B:
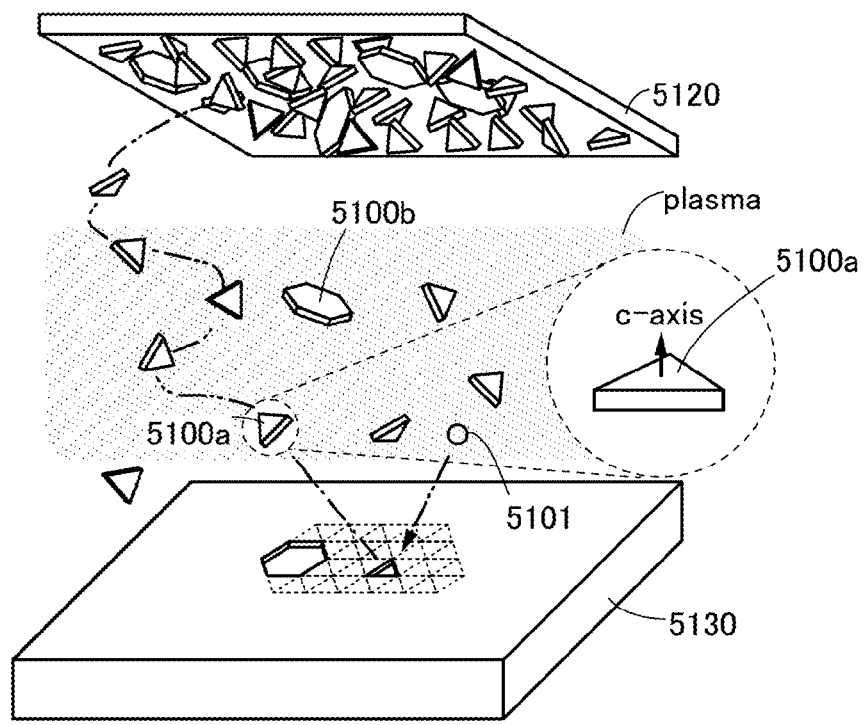

As shown in FIGS. 37A and 37B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Thus, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Thus, the pellet 5100 can be moved in various directions on the top surface of the substrate 5120 by receiving forces in various directions.

Furthermore, as shown in FIG. 37A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Thus, even when deformation such as shrink occurs in the CAAC-OS owing to heating during deposition, heating or bending after deposition, it is possible to relieve local stress or release distortion. Thus, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 39A to 39D are cross-sectional schematic views.

Figure 39A:
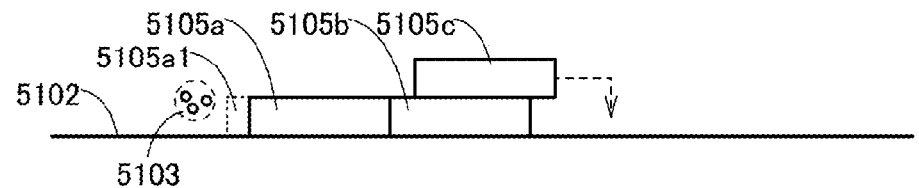
FIGS. 39A to 39D are schematic views showing a deposition model of a CAAC-OS.

As illustrated in FIG. 39A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heat from the substrate 5120 to form a region 5105a1 on another side surface of the pellet 5105a. Note that the plurality of particles 5103 may contain oxygen, zinc, indium, gallium, or the like.

Figure 39B:
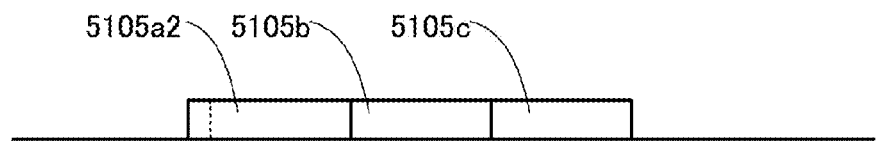

Then, as illustrated in FIG. 39B, the region 5105a1 grows to part of the pellet 5105a to form a pellet 5105a2. In addition, a side surface of the pellet 5105c is in contact with another side surface of the pellet 5105b.

Figure 39C:
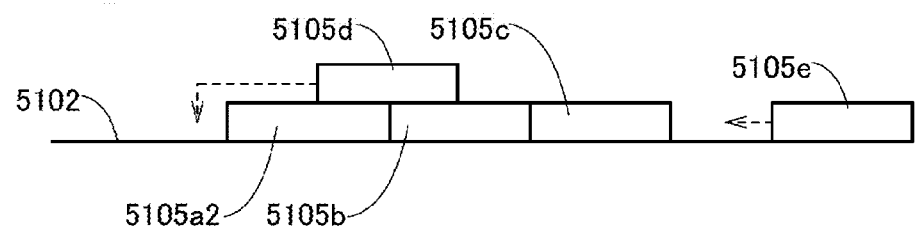

Next, as illustrated in FIG. 39C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 39D:
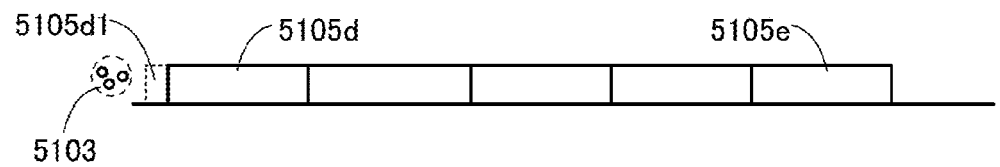

Then, as illustrated in FIG. 39D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heat from the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Thus, each pellet of the CAAC-OS is larger than that of the nc-OS. A difference in size between (3) and (2) in FIG. 36 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; thus, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible even on the unevenness surface. Thus, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

<Circuit>

An example of a semiconductor device including the transistor or the like of one embodiment of the present invention will be described below.

<CMOS Inverter>

Figure 14A:
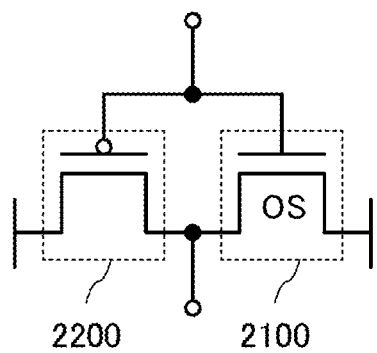
FIGS. 14A and 14B are circuit diagrams each illustrating a semiconductor device of one embodiment of the present invention.

A circuit diagram in FIG. 14A shows a configuration of what is called a CMOS inverter in which a p-channel transistor 2200 and an n-channel transistor 2100 are connected to each other in series and in which gates of them are connected to each other.

<Structure 1 of Semiconductor Device>

Figure 15:
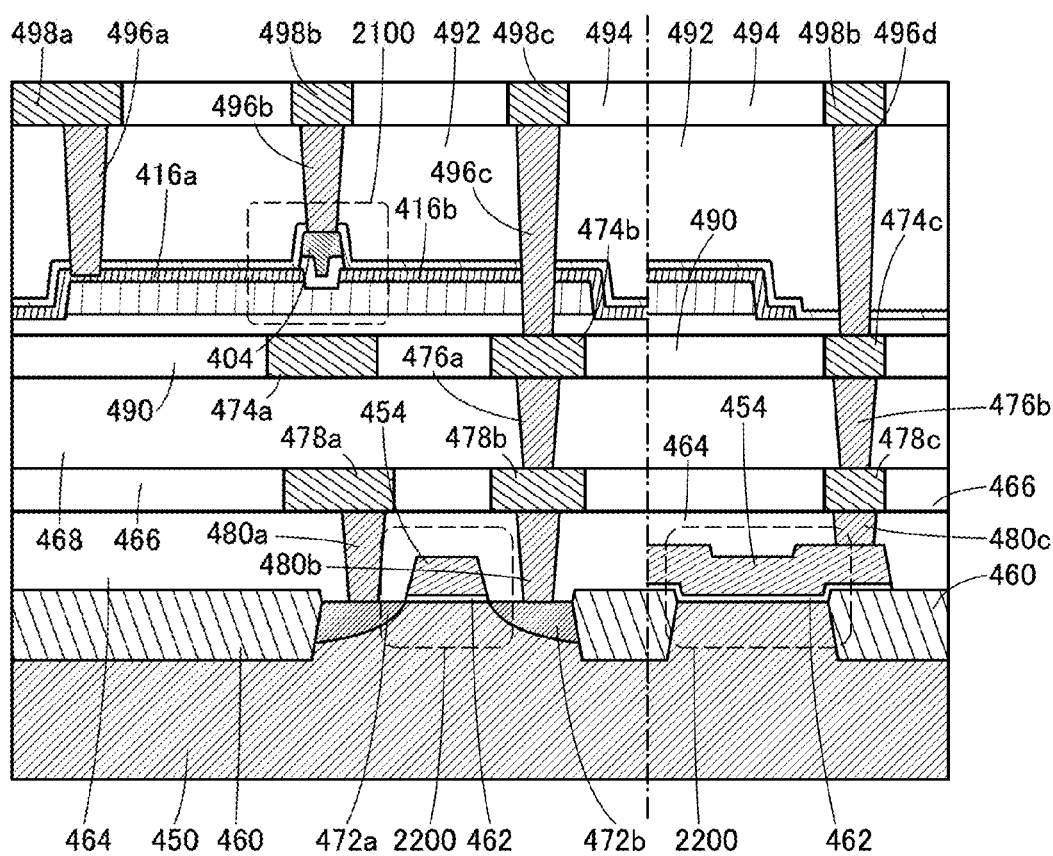
FIG. 15 is a cross-sectional view illustrating a semiconductor device of one embodiment of the present invention.

FIG. 15 is a cross-sectional view of the semiconductor device of FIG. 14A.

The semiconductor device illustrated in FIG. 15 includes the transistor 2200 and the transistor 2100. The transistor 2100 is placed above the transistor 2200. Although an example where the transistor shown in FIGS. 6A and 6B is used as the transistor 2100 is illustrated, the semiconductor device of one embodiment of the present invention is not limited thereto. For example, any of the transistors illustrated in FIG. 7A to 7C, FIGS. 11A and 11B, and FIGS. 12A to 12C can be used as the transistor 2100. Thus, the description of any of those transistors is referred to for the transistor 2100 as appropriate.

The transistor 2200 illustrated in FIG. 15 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b serve as a source region and a drain region. The insulator 462 serves as a gate insulator. The conductor 454 serves as a gate electrode. Thus, the resistance of a channel formation region can be controlled by a potential applied to the conductor 454. In other words, conduction or non-conduction between the region 472a and the region 472b can be controlled by the potential applied to the conductor 454.

As the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

As the semiconductor substrate 450, a semiconductor substrate containing impurities imparting n-type conductivity is used. Alternatively, a semiconductor substrate containing impurities imparting p-type conductivity may be used as the semiconductor substrate 450. In that case, a well containing impurities imparting n-type conductivity may be provided in a region where the transistor 2200 is formed. The semiconductor substrate 450 may be an i-type semiconductor substrate.

A top surface of the semiconductor substrate 450 preferably has a (110) plane because on-state characteristics of the transistor 2200 can be improved.

The regions 472a and 472b contain impurities imparting p-type conductivity. Accordingly, the transistor 2200 has a structure of a p-channel transistor.

Note that the transistor 2200 is separated from an adjacent transistor by a region 460 and the like. The region 460 is an insulating region.

The semiconductor device illustrated in FIG. 15 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 490, an insulator 492, and an insulator 494.

The insulator 464 is over the transistor 2200. The insulator 466 is over the insulator 464. The insulator 468 is over the insulator 466. The insulator 490 is over the insulator 468. The transistor 2100 is over the insulator 490. The insulator 492 is over the transistor 2100. The insulator 494 is over the insulator 492.

The insulator 464 has an opening reaching the region 472a, an opening reaching the region 472b, and an opening reaching the conductor 454. In the openings, the conductor 480a, the conductor 480b, and the conductor 480c are provided.

The insulator 466 has an opening reaching the conductor 480a, an opening reaching the conductor 480b, and an opening reaching the conductor 480c. In the openings, the conductor 478a, the conductor 478b, and the conductor 478c are provided.

The insulator 468 has an opening reaching the conductor 478b and an opening reaching the conductor 478c. In the openings, the conductor 476a and the conductor 476b are provided.

The insulator 490 has an opening overlapping with a channel formation region of the transistor 2100, an opening reaching the conductor 476a, and an opening reaching the conductor 476b. In the openings, the conductor 474a, the conductor 474b, and the conductor 474c are provided.

The conductor 474a may serve as a gate electrode of the transistor 2100. The electrical characteristics of the transistor 2100, such as the threshold voltage, may be controlled by application of a constant potential to the conductor 474a, for example. The conductor 474a may be electrically connected to the conductor 404 serving as the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable.

The insulator 492 has an opening reaching the conductor 474b through the conductor 416b that is one of a source electrode and a drain electrode of the transistor 2100, an opening reaching the conductor 416a that is the other of the source electrode and the drain electrode of the transistor 2100, an opening reaching the conductor 404 that is the gate electrode of the transistor 2100, and an opening reaching the conductor 474c. In the openings, the conductor 496a, the conductor 496b, the conductor 496c, and the conductor 496d are provided. Note that in some cases, the openings are provided through any of components of the transistor 2100 or the like.

The insulator 494 has an opening reaching the conductor 496a, an opening reaching the conductor 496b and the conductor 496d, and an opening reaching the conductor 496c. In the openings, the conductor 498a, the conductor 498b, and the conductor 498c are provided.

The insulators 464, 466, 468, 490, 492, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulators 464, 466, 468, 490, 492, and 494 may each be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

At least one of the insulators 464, 466, 468, 490, 492, and 494 preferably has a function of blocking oxygen and impurities such as hydrogen. When an insulator that has a function of blocking oxygen and impurities such as hydrogen is provided near the transistor 2100, the electrical characteristics of the transistor 2100 can be stable.

The insulator having a function of blocking oxygen and impurities such as hydrogen may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductors 480a, 480b, 480c, 478a, 478b, 478c, 476a, 476b, 474a, 474b, 474c, 496a, 496b, 496c, 496d, 498a, 498b, and 498c may be formed to have, for example, a single-layer structure or a stacked-layer structure including a conductor containing one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may also be used, for example, and an alloy containing aluminum, an alloy containing copper and titanium, an alloy containing copper and manganese, a compound containing indium, tin, and oxygen, a compound containing titanium and nitrogen, or the like may be used.

Figure 16:
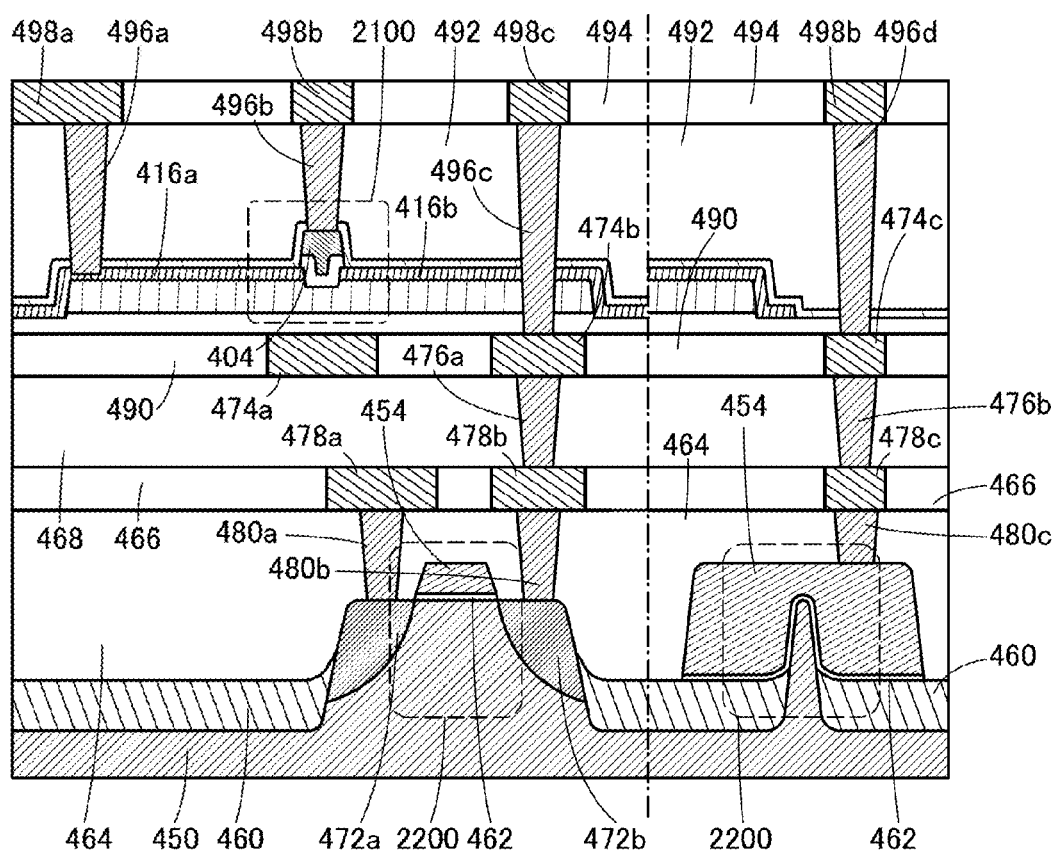
FIG. 16 is a cross-sectional view illustrating a semiconductor device of one embodiment of the present invention.

A semiconductor device in FIG. 16 is the same as the semiconductor device in FIG. 15 except for the structure of the transistor 2200. Thus, the description of the semiconductor device in FIG. 15 is referred to for the semiconductor device in FIG. 16. Specifically, the transistor 2200 in the semiconductor device in FIG. 16 is a FIN-type transistor. The effective channel width is increased in the FIN-type transistor 2200, whereby the on-state characteristics of the transistor 2200 can be improved. In addition, since contribution of the electric field of the gate electrode can be increased, the off-state characteristics of the transistor 2200 can be improved.

Figure 17:
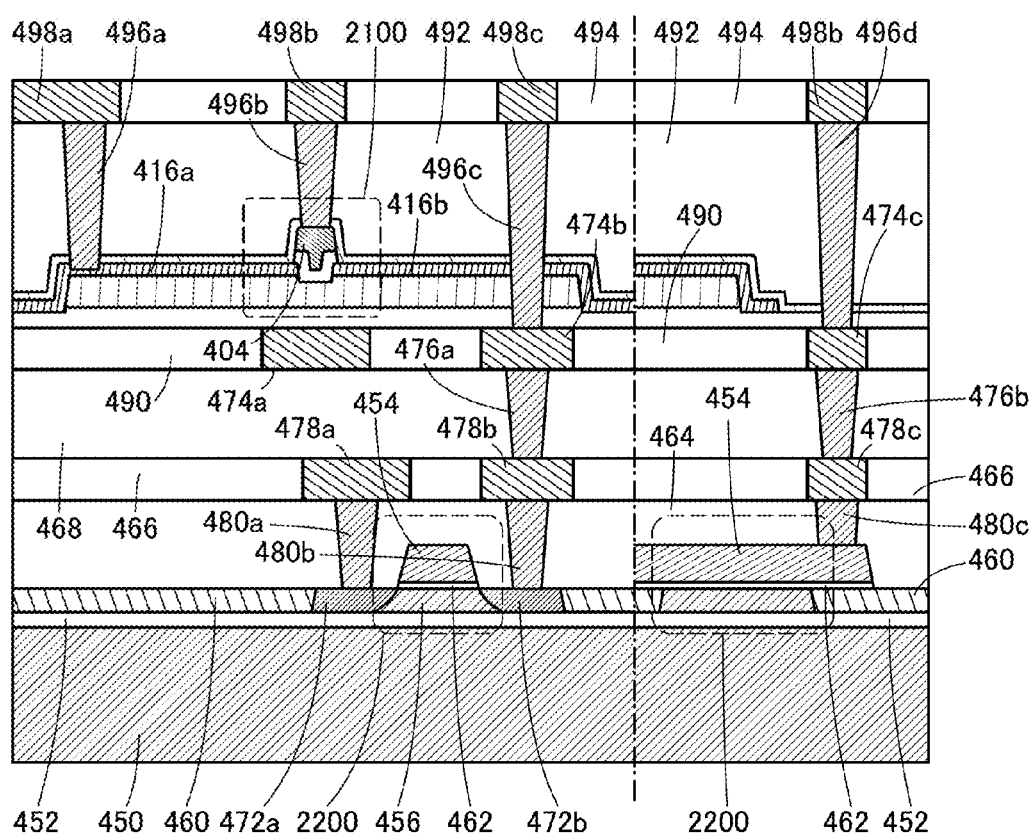
FIG. 17 is a cross-sectional view illustrating a semiconductor device of one embodiment of the present invention.

A semiconductor device in FIG. 17 is the same as the semiconductor device in FIG. 15 except for the structure of the transistor 2200. Thus, the description of the semiconductor device in FIG. 15 is referred to for the semiconductor device in FIG. 17. Specifically, the transistor 2200 in the semiconductor device in FIG. 17 is formed using an SOI substrate. In the structure in FIG. 17, a region 456 is separated from the semiconductor substrate 450 by an insulator 452. Since the SOI substrate is used, a punch-through phenomenon and the like can be suppressed; thus, the off-state characteristics of the transistor 2200 can be improved. Note that the insulator 452 can be formed by turning part of the semiconductor substrate 450 into an insulator. As the insulator 452, silicon oxide can be used, for example.

In each of the semiconductor devices illustrated in FIG. 15, FIG. 16, and FIG. 17, a p-channel transistor is formed using a semiconductor substrate, and an n-channel transistor is formed above the p-channel transistor; thus, an area occupied by the elements can be reduced. That is, the integration degree of the semiconductor device can be improved. In addition, a manufacturing process can be simplified compared with the case where an n-channel transistor and a p-channel transistor are formed using the same semiconductor substrate; thus, the productivity of the semiconductor device can be increased. Moreover, the yield of the semiconductor device can be improved. For the p-channel transistor, some complicated steps such as formation of lightly doped drain (LDD) regions, formation of a shallow trench structure, and strain engineering can be omitted in some cases. Thus, the productivity and yield of the semiconductor device can be increased in some cases, compared with the case of a semiconductor device in which an n-channel transistor is formed using a semiconductor substrate.

<CMOS Analog Switch>

Figure 14B:
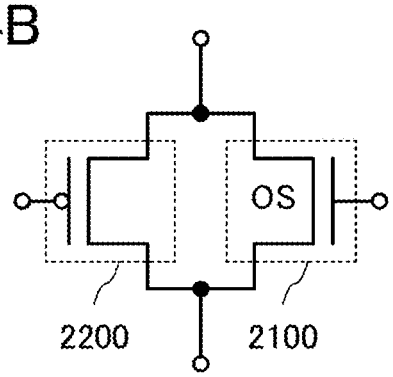

A circuit diagram in FIG. 14B shows a configuration in which sources of the transistors 2100 and 2200 are connected to each other and drains of the transistors 2100 and 2200 are connected to each other. With such a configuration, the transistors can function as what is called a CMOS analog switch.

<Memory Device 1>

Figure 18A:
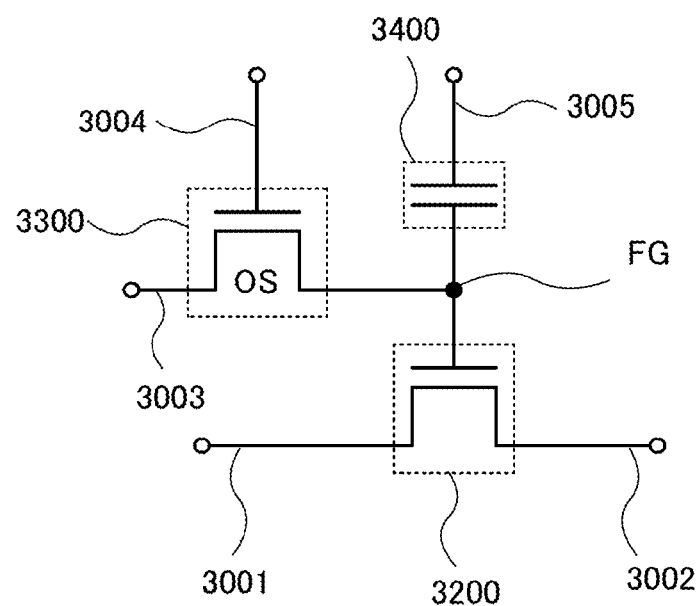
FIGS. 18A and 18B are circuit diagrams each illustrating a memory device of one embodiment of the present invention.
Figure 18B:
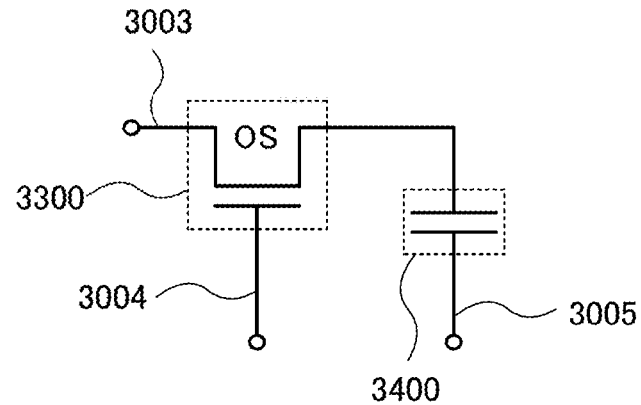

FIGS. 18A and 18B each illustrate an example of a semiconductor device (memory device) which includes the transistor of one embodiment of the present invention, which can retain stored data even when not powered, and which has an unlimited number of write cycles.

A semiconductor device illustrated in FIG. 18A includes a transistor 3200 using a first semiconductor, a transistor 3300 using a second semiconductor, and a capacitor 3400. Note that any of the above-described transistors can be used as the transistor 3300.

Note that the transistor 3300 is preferably a transistor with a low off-state current. For example, a transistor using an oxide semiconductor can be used as the transistor 3300. When the off-state current of the transistor 3300 is low, stored data can be retained for a long period at a predetermined node of the semiconductor device. This means that refresh operation becomes unnecessary or the frequency of refresh operation can be extremely low, leading to low power consumption of the semiconductor device.

In FIG. 18A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 18A has a feature that the potential of the gate of the transistor 3200 can be retained and thus enables writing, retaining, and reading of data as described below.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is off, so that the transistor 3300 is turned off. Thus, the charge is held in the node FG (retaining).

Since the off-state current of the transistor 3300 is low, the charge of the node FG is retained for a long time.

Next, reading of data is described. An appropriate potential (reading potential) is supplied to the fifth wiring 3005 while a predetermined potential (constant potential) is supplied to the first wiring 3001, whereby the potential of the second wiring 3002 is determined depending on the amount of charge retained in the node FG. This is because when an n-channel transistor is used as the transistor 3200, an apparent threshold voltage $V_{th\_H}$ in the case where the high-level charge is given to the gate of the transistor 3200 is lower than an apparent threshold voltage $V_{th\_L}$ in the case where the low-level charge is given to the gate of the transistor 3200. Here, an apparent threshold voltage refers to the potential of the fifth wiring 3005 which is needed to make the transistor 3200 be in an "on state." Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is brought into an "on state." In the case where the low-level charge is supplied to the node FG in writing, in contrast, the transistor 3200 remains in an "off state" even when the potential of the fifth wiring 3005 is $V_0$ ($<V_{th\_L}$). Thus, the data retained in the node FG can be read by determining the potential of the second wiring 3002.

Note that in the case where memory cells are arrayed, it is necessary that data of a desired memory cell be read in read operation. In the case where data of the other memory cells is not read, the fifth wiring 3005 may be supplied with a potential at which the transistor 3200 is in an "off state" regardless of the charge supplied to the node FG, that is, a potential lower than $V_{th\_H}$. Alternatively, the fifth wiring 3005 may be supplied with a potential at which the transistor 3200 is brought into an "on state" regardless of the charge supplied to the node FG, that is, a potential higher than $V_{th\_L}$.

<Structure 2 of Semiconductor Device>

Figure 19:
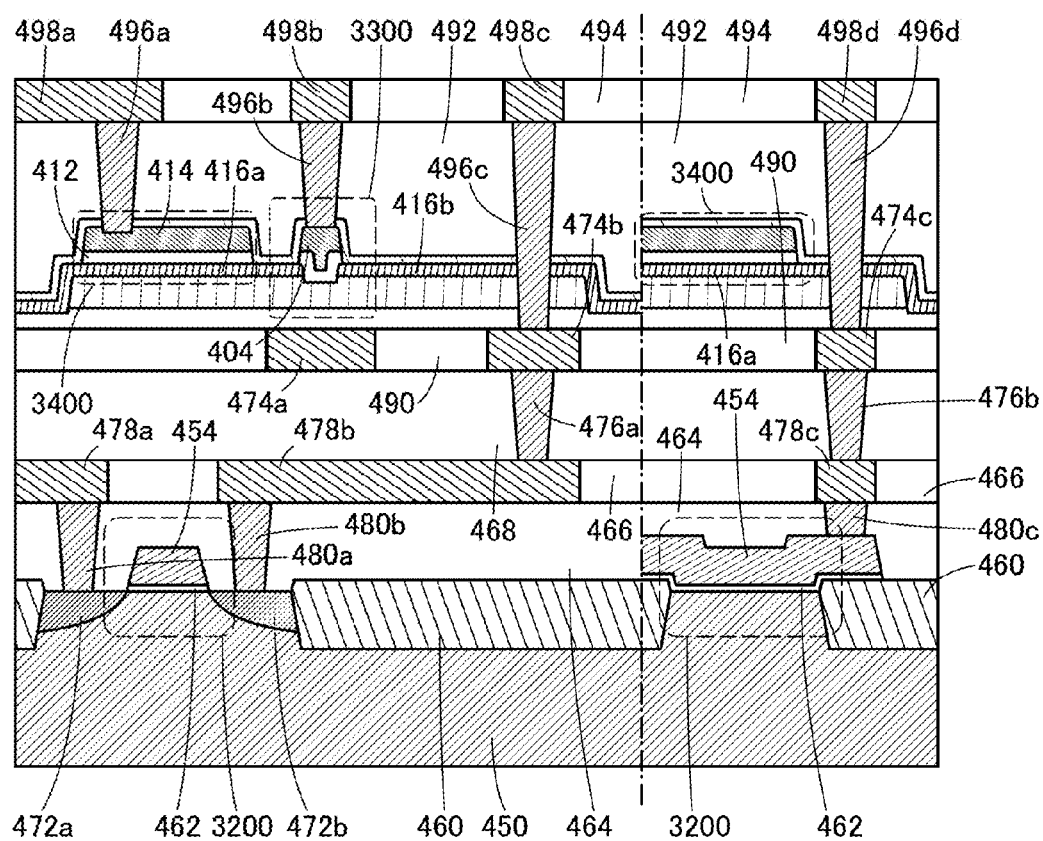
FIG. 19 is a cross-sectional view illustrating a semiconductor device of one embodiment of the present invention.

FIG. 19 is a cross-sectional view of the semiconductor device of FIG. 18A. The semiconductor device illustrated in FIG. 19 includes the transistor 3200, the transistor 3300, and the capacitor 3400. The transistor 3300 and the capacitor 3400 are placed above the transistor 3200. Note that for the transistor 3300, refer to the description of the transistor 2100. Furthermore, for the transistor 3200, refer to the description of the transistor 2200 in FIG. 15. Note that although the transistor 2200 in FIG. 15 is described as a p-channel transistor, the transistor 3200 may be an n-channel transistor.

The transistor 3200 illustrated in FIG. 19 is a transistor using the semiconductor substrate 450. The transistor 3200 includes the region 472a in the semiconductor substrate 450, the region 472b in the semiconductor substrate 450, the insulator 462, and the conductor 454.

The semiconductor device illustrated in FIG. 19 includes the insulator 464, the insulator 466, the insulator 468, the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, the conductor 498c, a conductor 498d, the insulator 490, the insulator 492, and the insulator 494.

The insulator 464 is over the transistor 3200. The insulator 466 is over the insulator 464. The insulator 468 is over the insulator 466. The insulator 490 is over the insulator 468. The transistor 3300 is over the insulator 490. The insulator 492 is over the transistor 3300. The insulator 494 is over the insulator 492.

The insulator 464 has an opening reaching the region 472a, an opening reaching the region 472b, and an opening reaching the conductor 454. In the openings, the conductor 480a, the conductor 480b, and the conductor 480c are provided.

The insulator 466 has an opening reaching the conductor 480a, an opening reaching the conductor 480b, and an opening reaching the conductor 480c. In the openings, the conductor 478a, the conductor 478b, and the conductor 478c are provided.

The insulator 468 has an opening reaching the conductor 478b and an opening reaching the conductor 478c. In the openings, the conductor 476a and the conductor 476b are provided.

The insulator 490 has an opening overlapping with a channel formation region of the transistor 3300, an opening reaching the conductor 476a, and an opening reaching the conductor 476b. In the openings, the conductor 474a, the conductor 474b, and the conductor 474c are provided.

The conductor 474a may serve as a bottom gate electrode of the transistor 3300. Electric characteristics such as the threshold voltage of the transistor 3300 may be controlled by application of a constant potential to the conductor 474a, for example. The conductor 474a may be electrically connected to the conductor 404 that is a top gate electrode of the transistor 3300, for example. In that case, the on-state current of the transistor 3300 can be increased. Furthermore, a punch-through phenomenon can be suppressed; thus, the electrical characteristics of the transistor 3300 in a saturation region can be stable.

The insulator 492 has an opening reaching the conductor 474b through the conductor 416b that is one of the source electrode and the drain electrode of the transistor 3300, an opening reaching a conductor 414, an opening reaching the conductor 404 that is the gate electrode of the transistor 3300, and an opening reaching the conductor 474c through the conductor 416a that is the other of the source electrode and the drain electrode of the transistor 3300. In the openings, the conductor 496a, the conductor 496b, the conductor 496c, and the conductor 496d are provided. Note that in some cases, the openings are provided through any of components of the transistor 3300 or the like.

The insulator 494 has an opening reaching the conductor 496a, an opening reaching the conductor 496b, an opening reaching the conductor 496c, and an opening reaching the conductor 496d. In the openings, the conductors 498a, 498b, 498c, and 498d are provided.

At least one of the insulators 464, 466, 468, 490, 492, and 494 preferably has a function of blocking oxygen and impurities such as hydrogen. When an insulator that has a function of blocking oxygen and impurities such as hydrogen is provided near the transistor 3300, the electrical characteristics of the transistor 3300 can be stable.

The conductor 498d may be formed to have a single-layer structure or a stacked-layer structure including a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and an alloy containing aluminum, an alloy containing copper and titanium, an alloy containing copper and manganese, a compound containing indium, tin, and oxygen, a compound containing titanium and nitrogen, or the like may be used.

The source or the drain of the transistor 3200 is electrically connected to the conductor 416b that is one of the source electrode and the drain electrode of the transistor 3300 through the conductor 480b, the conductor 478b, the conductor 476a, the conductor 474b, and the conductor 496c. The conductor 454 that is the gate electrode of the transistor 3200 is electrically connected to the conductor 416a that is the other of the source electrode and the drain electrode of the transistor 3300 through the conductor 480c, the conductor 478c, the conductor 476b, the conductor 474c, and the conductor 496d.

The capacitor 3400 includes an electrode electrically connected to the other of the source electrode and the drain electrode of the transistor 3300, the conductor 414, and the insulator 412. Because the insulator 412 can be formed in the same step as a gate insulator of the transistor 3300, productivity can be increased. Productivity can also be increased when a layer formed in the same step as the gate electrode of the transistor 3300 is used as the conductor 414.

For the structures of other components, the description of FIG. 15 and the like can be referred to as appropriate.

Figure 20:
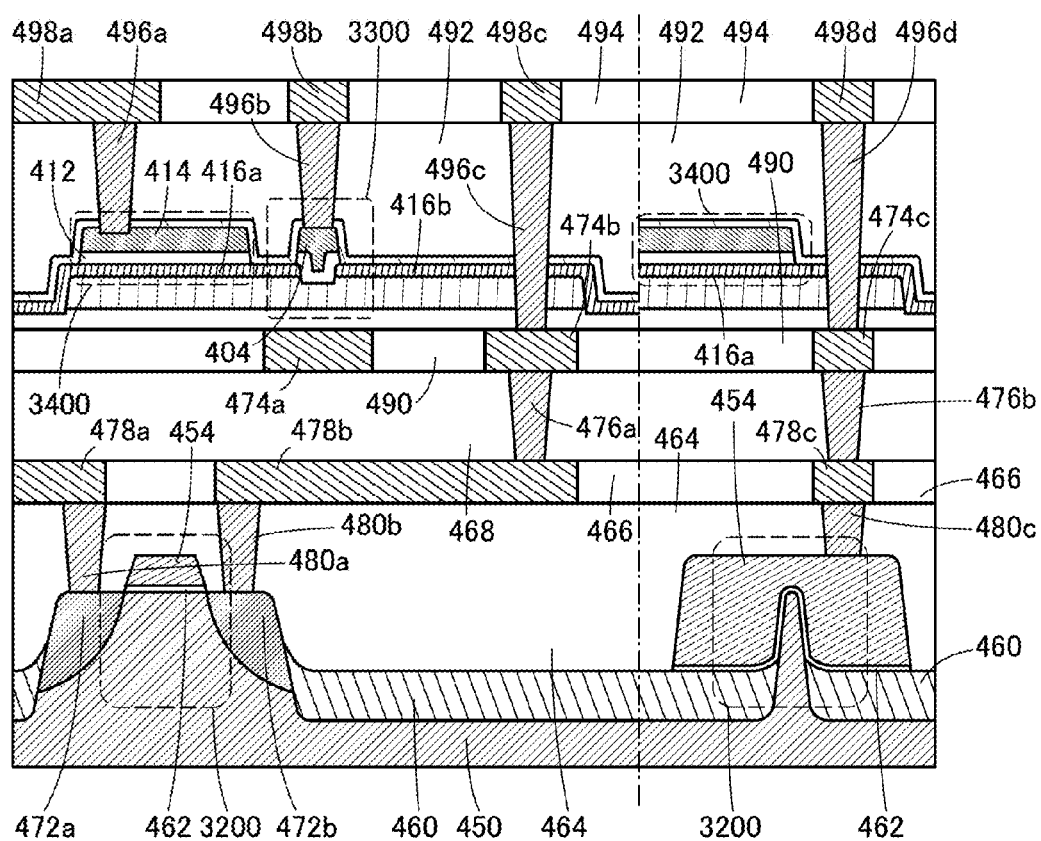
FIG. 20 is a cross-sectional view illustrating a semiconductor device of one embodiment of the present invention.

A semiconductor device in FIG. 20 is the same as the semiconductor device in FIG. 19 except for the structure of the transistor 3200. Thus, refer to the description of the semiconductor device in FIG. 19 for the semiconductor device in FIG. 20. Specifically, the transistor 3200 in the semiconductor device in FIG. 20 is a FIN-type transistor. For the FIN-type transistor 3200, refer to the description of the transistor 2200 in FIG. 16. Note that although the transistor 2200 in FIG. 16 is described as a p-channel transistor, the transistor 3200 may be an n-channel transistor.

Figure 21:
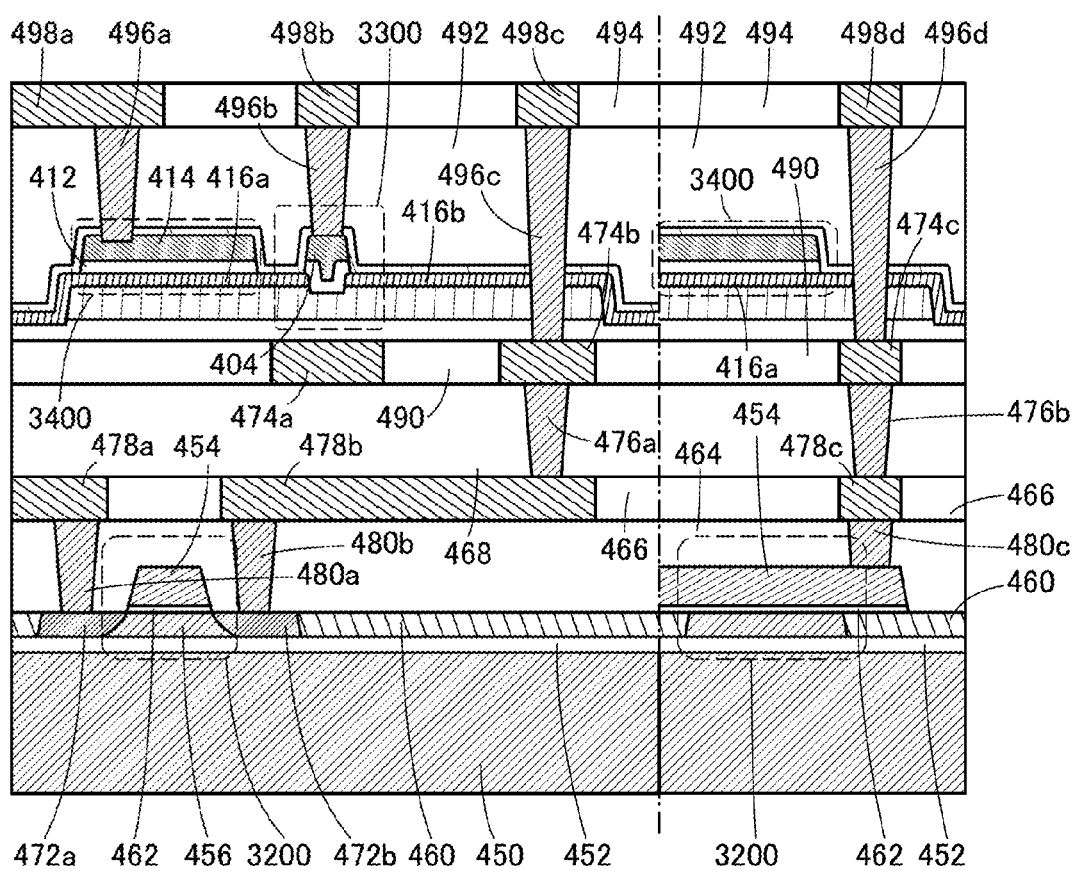
FIG. 21 is a cross-sectional view illustrating a semiconductor device of one embodiment of the present invention.

A semiconductor device in FIG. 21 is the same as the semiconductor device in FIG. 19 except for the structure of the transistor 3200. Thus, refer to the description of the semiconductor device in FIG. 19 for the semiconductor device in FIG. 21. Specifically, the transistor 3200 in the semiconductor device in FIG. 21 is provided in the semiconductor substrate 450 that is an SOI substrate. For the transistor 3200, which is provided in the semiconductor substrate 450 that is an SOI substrate, refer to the description of the transistor 2200 in FIG. 17. Note that although the transistor 2200 in FIG. 17 is described as a p-channel transistor, the transistor 3200 may be an n-channel transistor.

<Memory Device 2>

A semiconductor device in FIG. 18B is different from the semiconductor device in FIG. 18A in that the transistor 3200 is not provided. Also in this case, data can be written and retained in a manner similar to that of the semiconductor device in FIG. 18A.

Reading of data in the semiconductor device in FIG. 18B is described. When the transistor 3300 is turned on, the third wiring 3003 which is in a floating state and the capacitor 3400 are brought into conduction, and the charge is redistributed between the third wiring 3003 and the capacitor 3400. As a result, the potential of the third wiring 3003 changes. The amount of change in the potential of the third wiring 3003 varies depending on the potential of one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, the transistor using the first semiconductor may be used for a driver circuit for driving the memory cell, and the transistor using the second semiconductor may be stacked as the transistor 3300 over the driver circuit.

When including a transistor with a low off-state current using an oxide semiconductor, the semiconductor device described above can retain stored data for a long time. This means that refresh operation becomes unnecessary or the frequency of refresh operation can be extremely low, leading to low power consumption of the semiconductor device.

Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the semiconductor device of one embodiment of the present invention does not have a limit on the number of times data can be rewritten, and the reliability thereof is drastically improved. Furthermore, data is written depending on the on/off state of the transistor, whereby high-speed operation can be achieved.

<Imaging Device>

An imaging device of one embodiment of the present invention will be described below.

Figure 22A:
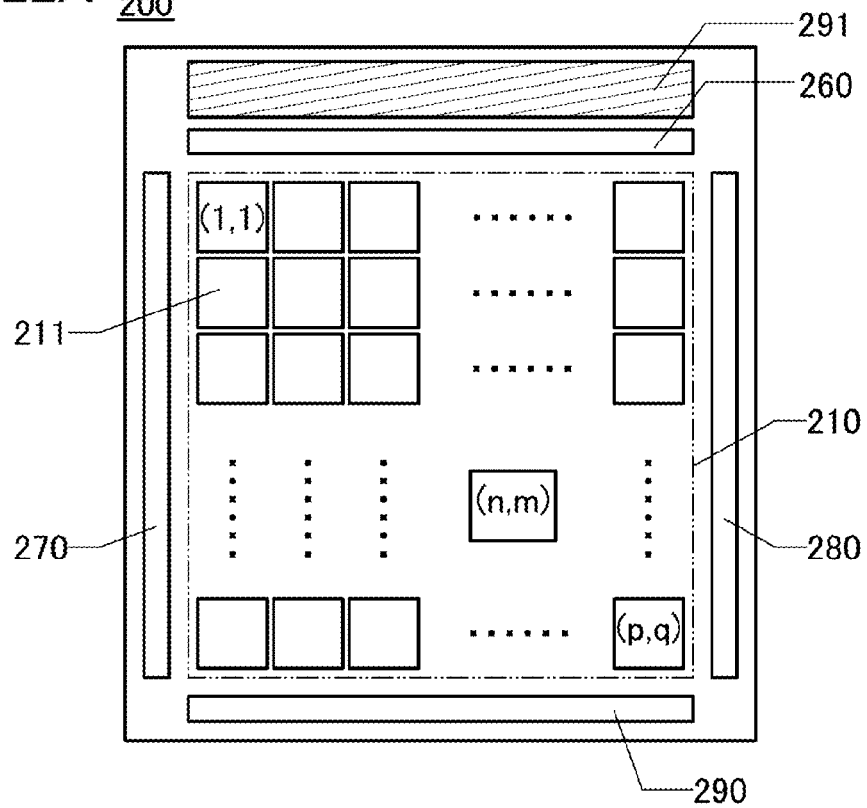
FIGS. 22A and 22B are top views each illustrating a semiconductor device of one embodiment of the present invention.

FIG. 22A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to the plurality of pixels 211 and each have a function of supplying a signal for driving the plurality of pixels 211. In this specification and the like, in some cases, a "peripheral circuit" or a "driver circuit" indicates all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be fabricated over a substrate where the pixel portion 210 is formed. Alternatively, a semiconductor device such as an IC chip may be used as part or the whole of the peripheral circuit. Note that as the peripheral circuit, one or more of the peripheral circuits 260, 270, 280, and 290 may be omitted.

Figure 22B:
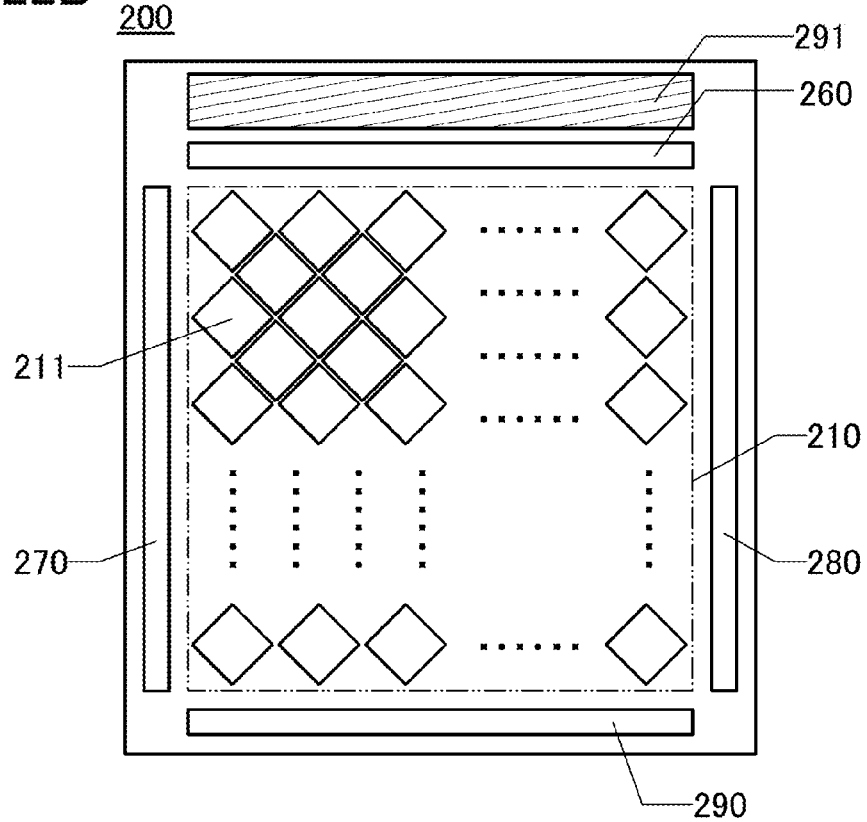

As illustrated in FIG. 22B, the pixels 211 may be obliquely arranged in the pixel portion 210 in the imaging device 200. When the pixels 211 are obliquely arranged, the distance between pixels (pitch) can be shortened in the row direction and the column direction. Accordingly, the quality of an image taken by the imaging device 200 can be improved.

Configuration Example 1 of Pixel

Each of the pixels 211 included in the imaging device 200 is formed with a plurality of subpixels 212, and each subpixel 212 is combined with a filter (color filter) which transmits light with a specific wavelength band, whereby data for achieving color image display can be obtained.

Figure 23A:
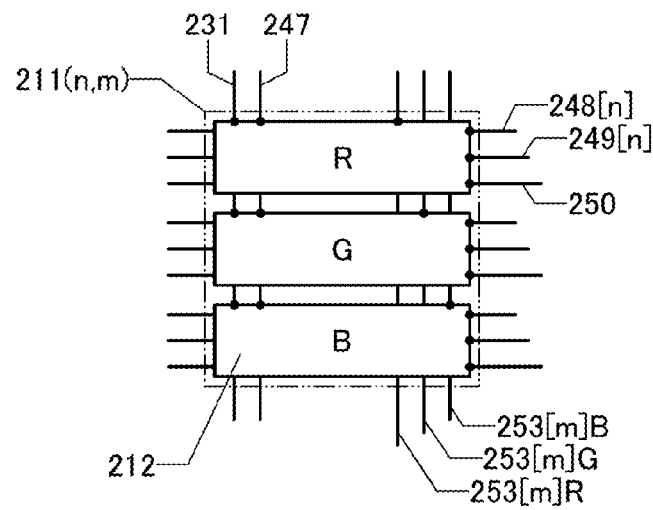
FIGS. 23A and 23B are block diagrams each illustrating a semiconductor device of one embodiment of the present invention.

FIG. 23A is a plan view illustrating an example of the pixel 211 with which a color image is obtained. The pixel 211 illustrated in FIG. 23A includes the subpixel 212 provided with a color filter transmitting light with a red (R) wavelength band (also referred to as a "subpixel 212R"), the subpixel 212 provided with a color filter transmitting light with a green (G) wavelength band (also referred to as a "subpixel 212G"), and the subpixel 212 provided with a color filter transmitting light with a blue (B) wavelength band (also referred to as a "subpixel 212B"). The subpixels 212 can function as photosensors.

Each of the subpixels 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixels 211 in an n-th row (n is an integer greater than or equal to 1 and less than or equal to p) are referred to as a wiring 248[n] and a wiring 249[n], respectively. Furthermore, for example, the wiring 253 connected to the pixels 211 in an m-th column (m is an integer greater than or equal to 1 and less than or equal to q) is referred to as a wiring 253[m]. Note that in FIG. 23A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B, respectively. The subpixels 212 are electrically connected to the peripheral circuits through the above wirings.

Figure 23B:
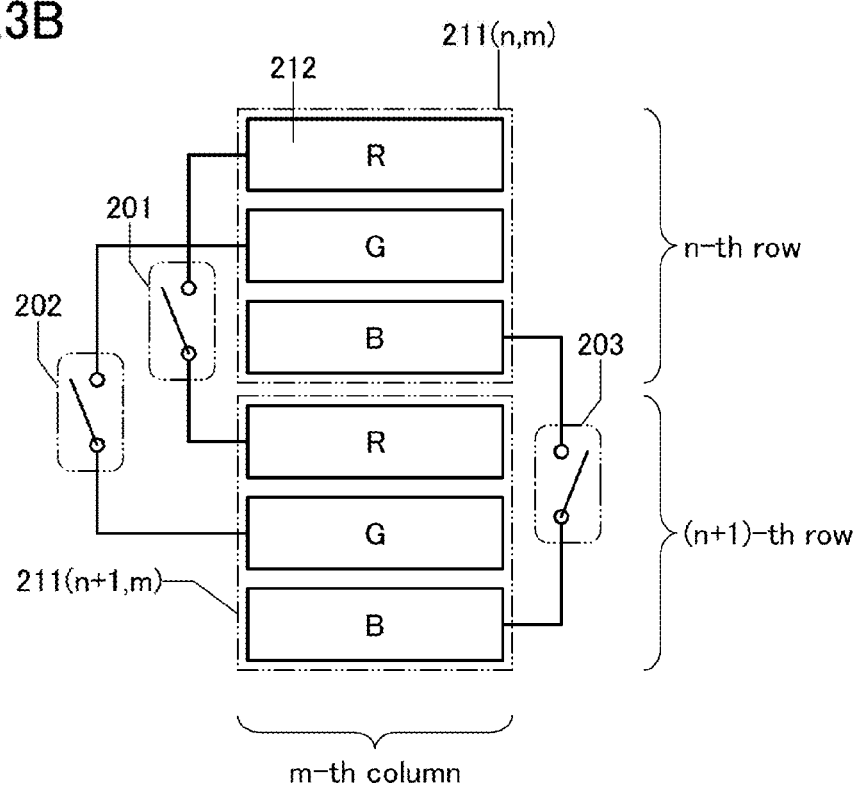

In the imaging device 200, the subpixel 212 is electrically connected to the subpixel 212, which is in an adjacent pixel 211 and is provided with a color filter transmitting light with the same wavelength band, via a switch. FIG. 23B illustrates a connection example of the subpixels 212: the subpixel 212 in the pixel 211 arranged in the n-th row and the m-th column and the subpixel 212 in the adjacent pixel 211 arranged in an (n+1)-th row and the m-th column. In FIG. 23B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filters used in the subpixels 212 are not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 23A, in regard to the subpixel 212 sensing a red wavelength band, the subpixel 212 sensing a green wavelength band, and the subpixel 212 sensing a blue wavelength band, the pixel number ratio (or the light receiving area ratio) thereof is not necessarily 1:1:1. For example, the Bayer arrangement in which the pixel number ratio (the light receiving area ratio) of red and green to blue is 1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. Arrangement examples of the pixel 211, filters 254, and a lens 255 are described with cross-sectional views in FIGS. 24A and 24B. With the lens 255, the photoelectric conversion element can efficiently receive incident light. Specifically, as illustrated in FIG. 24A, light 256 enters a photoelectric conversion element 220 through the lens 255, the filters 254 (a filter 254R, a filter 254G, and a filter 254B), a pixel circuit 230, and the like which are provided in the pixel 211.

However, as illustrated in a region surrounded by a two-dot chain line, part of the light 256 indicated by arrows might be blocked by part of a wiring 257. Thus, a preferred structure is such that the lens 255 and the filters 254 are provided on the photoelectric conversion element 220 side, so that the photoelectric conversion element 220 can efficiently receive the light 256 as illustrated in FIG. 24B. When the light 256 is incident on the photoelectric conversion element 220 through the photoelectric conversion element 220, the imaging device 200 with high sensitivity can be provided.

Figure 24A:
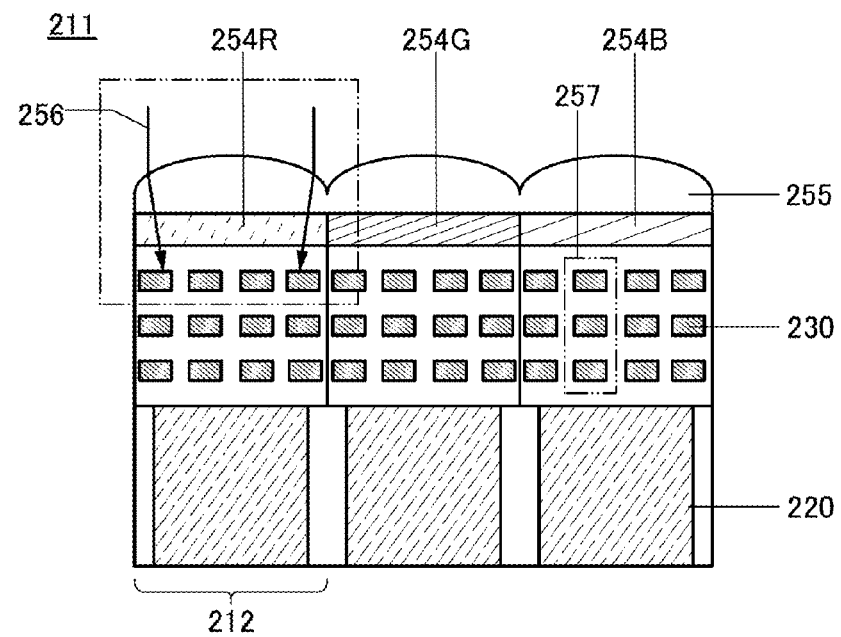
FIGS. 24A and 24B are cross-sectional views each illustrating a semiconductor device of one embodiment of the present invention.
Figure 24B:
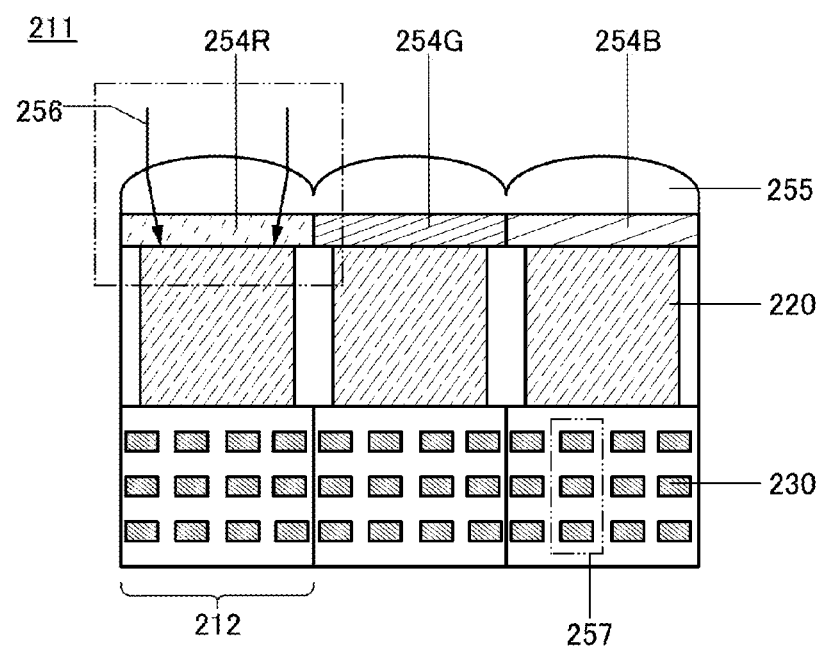

As each of the photoelectric conversion elements 220 illustrated in FIGS. 24A and 24B, a photoelectric conversion element in which a pn junction or a pin junction is formed may be used.

The photoelectric conversion element 220 may be formed using a substance that has a function of absorbing radiation and generating electric charges. Examples of the substance that has a function of absorbing radiation and generating electric charges include selenium, lead iodide, mercury iodide, gallium arsenide, cadmium telluride, and a cadmium zinc alloy The use of selenium for the photoelectric conversion element 220 enables the photoelectric conversion element 220 to have a light absorption coefficient over a wide wavelength range including X-rays and gamma rays in addition to visible light, ultraviolet light, and infrared rays, for example.

One pixel 211 included in the imaging device 200 may include the subpixel 212 with a first filter, in addition to the subpixels 212 illustrated in FIGS. 23A and 23B.

Configuration Example 2 of Pixel

An example of a pixel including a transistor using silicon and a transistor using an oxide semiconductor is described below.

Figure 25A:
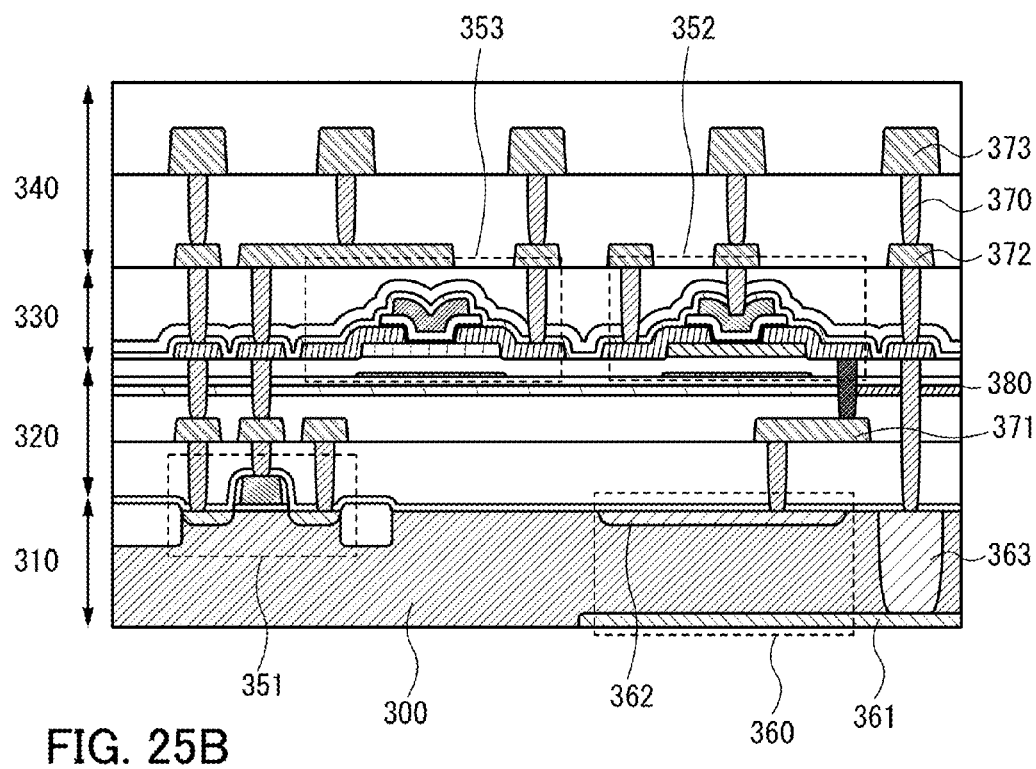
FIGS. 25A and 25B are cross-sectional views each illustrating a semiconductor device of one embodiment of the present invention.
Figure 25B:
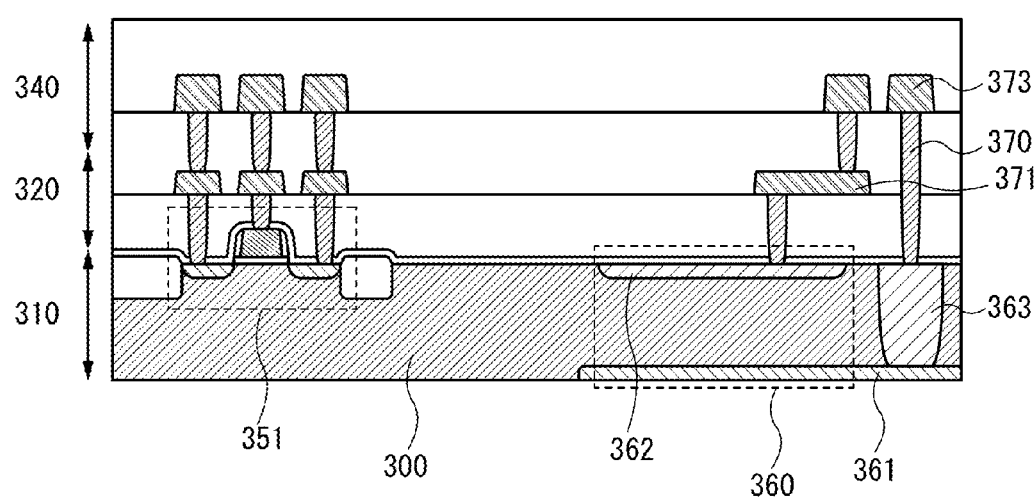

FIGS. 25A and 25B are each a cross-sectional view of an element included in an imaging device. The imaging device illustrated in FIG. 25A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, the photodiode 360 includes an anode 361 and a cathode 362, and the anode 361 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 25A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of transistors using silicon, the layer 330 may be omitted. An example of a cross-sectional view in which the layer 330 is not provided is shown in FIG. 25B. In the case where the layer 330 is not provided, the wiring 372 of the layer 340 can be omitted.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Thus, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

For the insulator 380, refer to the description of the insulator 408, for example.

In the cross-sectional view in FIG. 25A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 26A1 and FIG. 26B1, part or the whole of the imaging device can be bent. FIG. 26A1 illustrates a state in which the imaging device is bent in the direction of dashed-dotted line X1-X2. FIG. 26A2 is a cross-sectional view illustrating a portion indicated by dashed-dotted line X1-X2 in FIG. 26A1. FIG. 26A3 is a cross-sectional view illustrating a portion indicated by dashed-dotted line Y1-Y2 in FIG. 26A1.

FIG. 26B1 illustrates a state where the imaging device is bent in the direction of dashed-dotted line X3-X4 and the direction of dashed-dotted line Y3-Y4. FIG. 26B2 is a cross-sectional view illustrating a portion indicated by dashed-dotted line X3-X4 in FIG. 26B1. FIG. 26B3 is a cross-sectional view illustrating a portion indicated by dashed-dotted line Y3-Y4 in FIG. 26B1.

The bent imaging device enables the curvature of field and astigmatism to be reduced. Thus, the optical design of lens and the like, which is used in combination of the imaging device, can be facilitated. For example, the number of lens used for aberration correction can be reduced; accordingly, a reduction of size or weight of electronic devices using the imaging device, and the like, can be achieved. In addition, the quality of a captured image can be improved.

<CPU>

A CPU including a semiconductor device such as any of the above-described transistors or the above-described memory device is described below.

Figure 27:
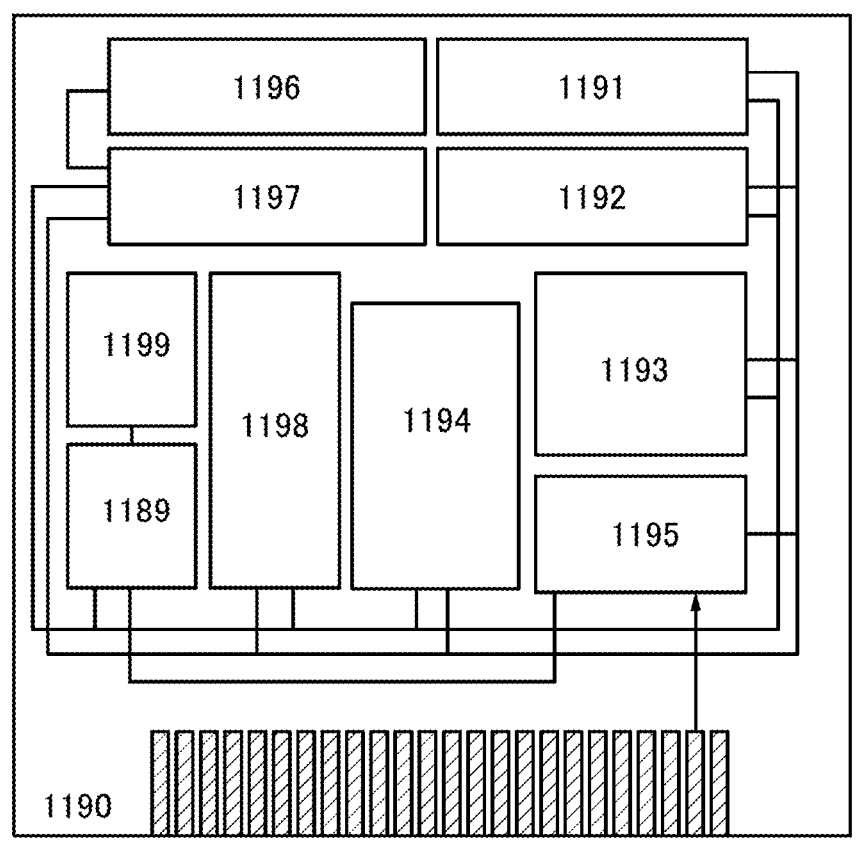
FIG. 27 is a block diagram illustrating a semiconductor device of one embodiment of the present invention.

FIG. 27 is a block diagram illustrating a configuration example of a CPU including any of the above-described transistors as a component.

The CPU illustrated in FIG. 27 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 27 is just an example in which the configuration has been simplified, and an actual CPU may have a variety of configurations depending on the application. For example, the CPU may have the following configuration: a structure including the CPU illustrated in FIG. 27 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 27, a memory cell is provided in the register 1196. For the memory cell of the register 1196, any of the above-described transistors, the above-described memory device, or the like can be used.

In the CPU illustrated in FIG. 27, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 28:
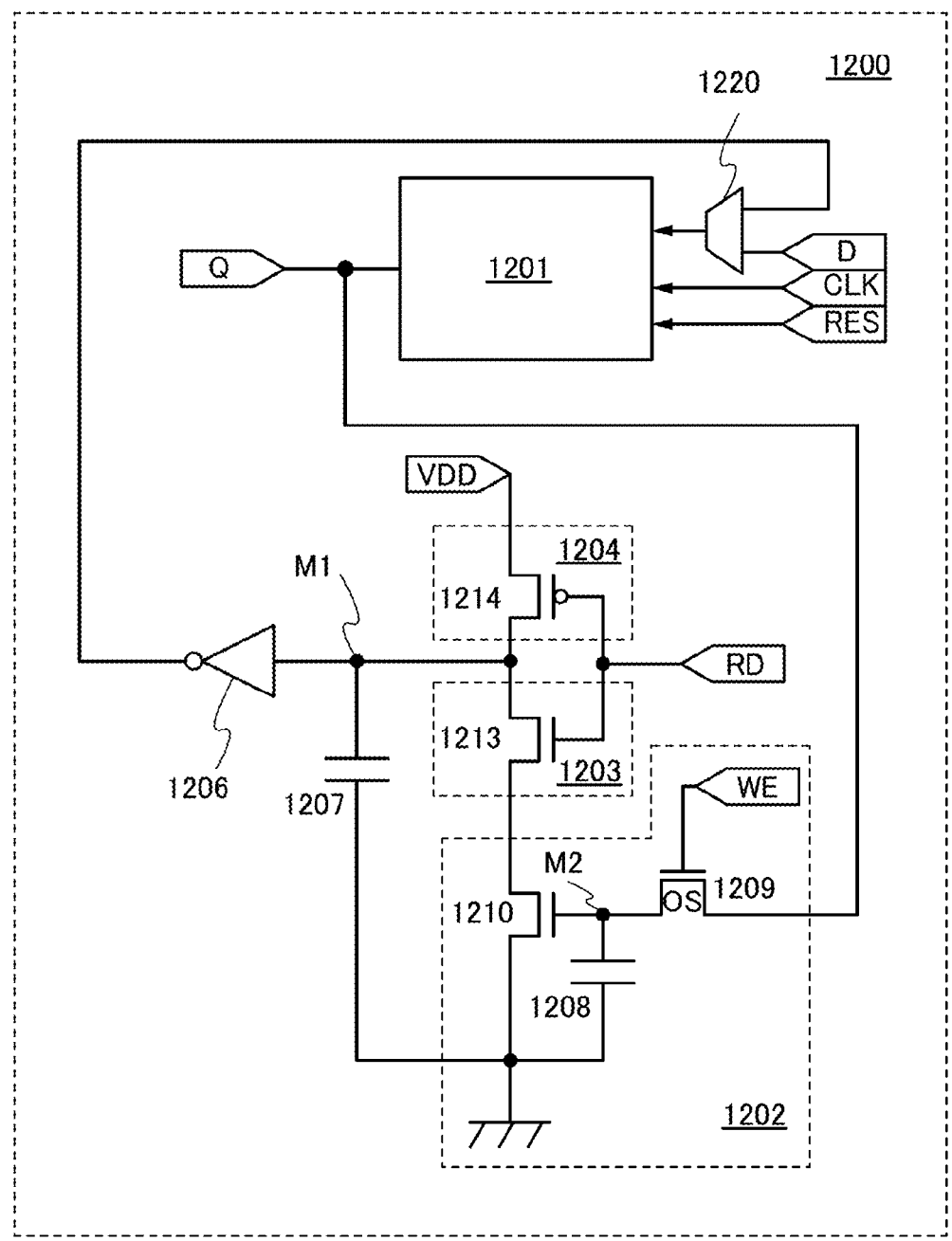
FIG. 28 is a circuit diagram of a semiconductor device of one embodiment of the present invention.

FIG. 28 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are unnecessarily as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 28 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 28, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 28, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a film formed using a semiconductor other than an oxide semiconductor or in the substrate 1190 can be used for the rest of the transistors.

As the circuit 1201 in FIG. 28, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency (RF) device.

<Display Device>

A display device of one embodiment of the present invention is described below with reference to FIGS. 29A to 29C and FIGS. 30A and 30B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 29A:
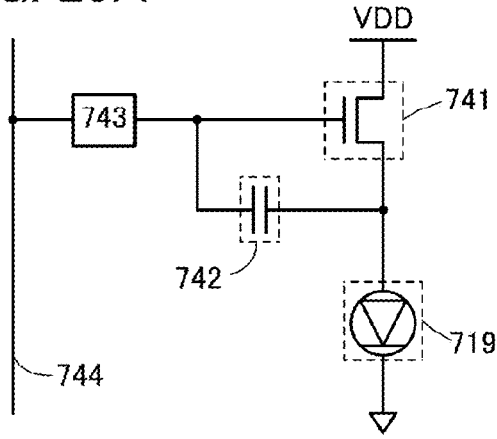
FIGS. 29A to 29C are a circuit diagram, a top view, and a cross-sectional view illustrating a semiconductor device of one embodiment of the present invention.
Figure 29B:
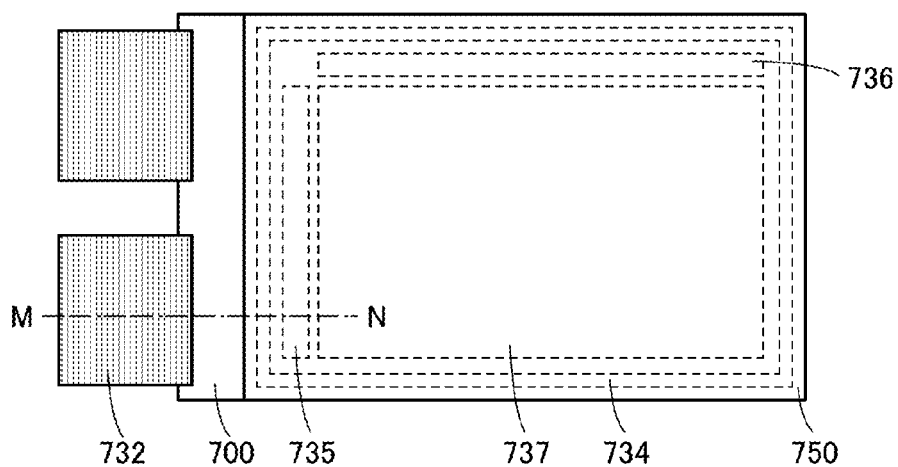
Figure 29C:
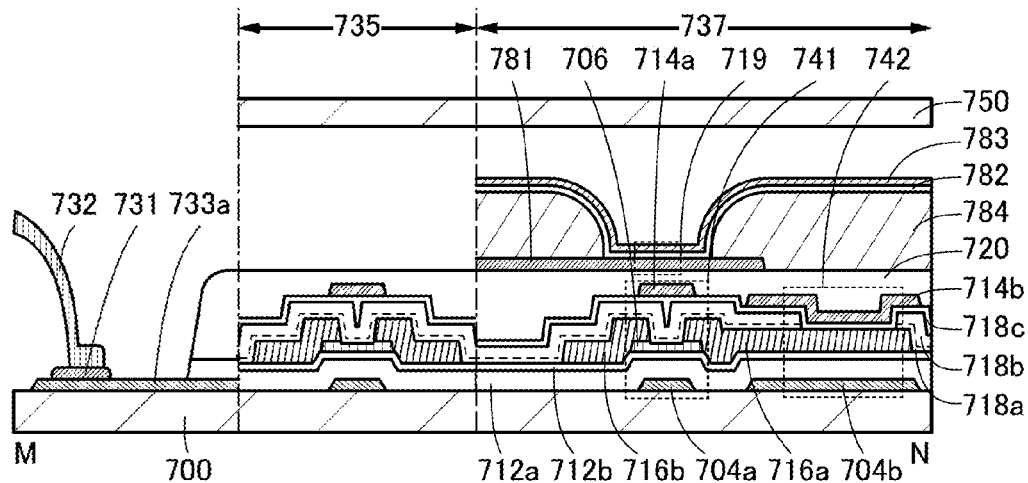

FIGS. 29A to 29C illustrate an example of an EL display device according to one embodiment of the present invention. FIG. 29A is a circuit diagram of a pixel in an EL display device. FIG. 29B is a plan view showing the whole of the EL display device.

FIG. 29A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Thus, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Thus, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 29A includes a switching element 743, a transistor 741, a capacitor 742, and a light-emitting element 719.

Note that FIG. 29A and the like each illustrate an example of a circuit structure; thus, a transistor can be provided additionally. In contrast, for each node in FIG. 29A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 29B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 29C is a cross-sectional view of the EL display device taken along part of dashed-dotted line M-N in FIG. 29B.

FIG. 29C illustrates a structure of the transistor 741 including a conductor 704*a* over the substrate 700; an insulator 712*a* over the conductor 704*a*; an insulator 712*b* over the insulator 712*a*; a semiconductor 706 that is over the insulator 712*b* and overlaps with the conductor 704*a*; a conductor 716*a* and a conductor 716*b* in contact with the semiconductor 706; an insulator 718*a* over the semiconductor 706, the conductor 716*a*, and the conductor 716*b*; an insulator 718*b* over the insulator 718*a*; an insulator 718*c* over the insulator 718*b*; and a conductor 714*a* that is over the insulator 718*c* and overlaps with the semiconductor 706. Note that the structure of the transistor 741 is just an example; the transistor 741 may have a structure different from that illustrated in FIG. 29C.

Thus, in the transistor 741 illustrated in FIG. 29C, the conductor 704a serves as a gate electrode, the insulator 712a and the insulator 712b serve as a gate insulator, the conductor 716a serves as a source electrode, the conductor 716b serves as a drain electrode, the insulator 718a, the insulator 718b, and the insulator 718c serve as a gate insulator, and the conductor 714a serves as a gate electrode. Note that in some cases, electrical characteristics of the semiconductor 706 change if light enters the semiconductor 706. To prevent this, it is preferable that one or more of the conductor 704a, the conductor 716a, the conductor 716b, and the conductor 714a have a light-blocking property.

Note that the interface between the insulator 718a and the insulator 718b is indicated by a broken line. This means that the boundary between them is not clear in some cases. For example, in the case where the insulator 718a and the insulator 718b are formed using insulators of the same kind, the insulator 718a and the insulator 718b are not distinguished from each other in some cases depending on an observation method.

FIG. 29C illustrates a structure of the capacitor 742 including a conductor 704b over the substrate; the insulator 712a over the conductor 704b; the insulator 712b over the insulator 712a; the conductor 716a that is over the insulator 712b and overlaps with the conductor 704b; the insulator 718a over the conductor 716a; the insulator 718b over the insulator 718a; the insulator 718c over the insulator 718b; and a conductor 714b that is over the insulator 718c and overlaps with the conductor 716a. In this structure, a part of the insulator 718a and a part of the insulator 718b are removed in a region where the conductor 716a and the conductor 714b overlap with each other.

In the capacitor 742, each of the conductor 704b and the conductor 714b serves as one electrode, and the conductor 716a serves as the other electrode.

Thus, the capacitor 742 can be formed using a film of the transistor 741. The conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 29C has a large capacitance per area occupied by the capacitor. Thus, the EL display device illustrated in FIG. 29C has high display quality. Note that although the capacitor 742 illustrated in FIG. 29C has the structure in which the part of the insulator 718a and the part of the insulator 718b are removed to reduce the thickness of the region where the conductor 716a and the conductor 714b overlap with each other, the structure of the capacitor according to one embodiment of the present invention is not limited to the structure. For example, a structure in which a part of the insulator 718c is removed to reduce the thickness of the region where the conductor 716a and the conductor 714b overlap with each other may be used.

An insulator 720 is provided over the transistor 741 and the capacitor 742. Here, the insulator 720 may have an opening reaching the conductor 716a that serves as the source electrode of the transistor 741. A conductor 781 is provided over the insulator 720. The conductor 781 may be electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 30A:
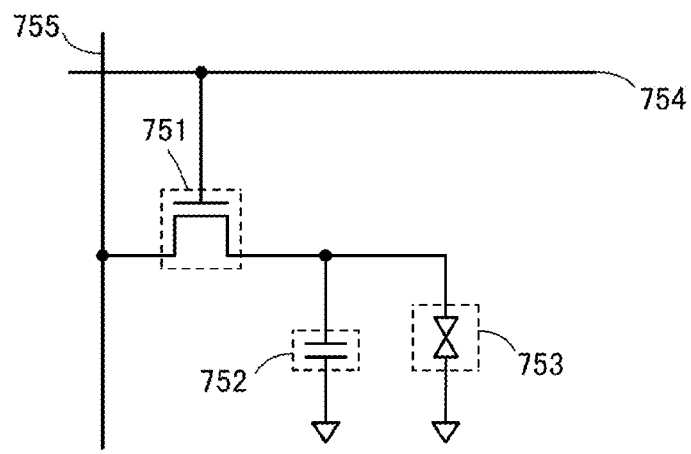
FIGS. 30A and 30B are a circuit diagram and a cross-sectional view illustrating a semiconductor device of one embodiment of the present invention.

FIG. 30A is a circuit diagram illustrating a configuration example of a pixel of a liquid crystal display device. A pixel shown in FIGS. 30A and 30B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 30B:
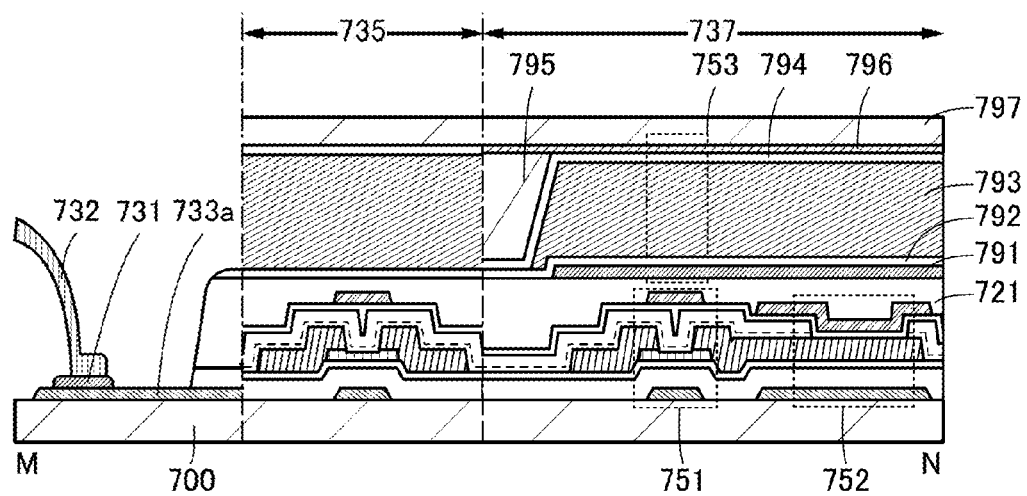

Note that the description of the liquid crystal display device is made on the assumption that the plan view of the liquid crystal display device is similar to that of the EL display device. FIG. 30B is a cross-sectional view of the liquid crystal display device taken along dashed-dotted line M-N in FIG. 29B. In FIG. 30B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, refer to the description of the transistor 741. For the capacitor 752, refer to the description of the capacitor 742. Note that the structure of the capacitor 752 in FIG. 30B corresponds to, but is not limited to, the structure of the capacitor 742 in FIG. 29C.

Note that in the case where an oxide semiconductor is used as the semiconductor of the transistor 751, the off-state current of the transistor 751 can be extremely small. Thus, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL element (e.g., an EL element including organic and inorganic materials, an organic EL element, or an inorganic EL element), a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an MN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 31A to 31F illustrate specific examples of these electronic devices.

Figure 31A:
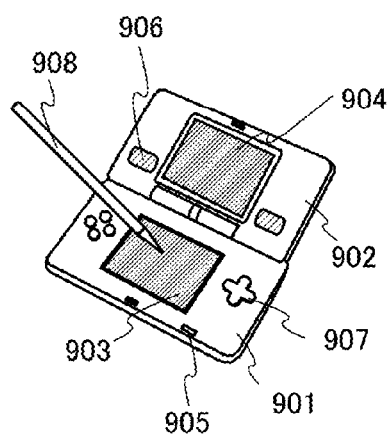
FIGS. 31A to 31F are perspective views each illustrating an electronic device of one embodiment of the present invention.

FIG. 31A illustrates a portable game console including a housing 901, a housing 902, a display portion 903, a display portion 904, a microphone 905, a speaker 906, an operation key 907, a stylus 908, and the like. Although the portable game console in FIG. 31A has the two display portions 903 and 904, the number of display portions included in a portable game console is not limited to this.

Figure 31B:
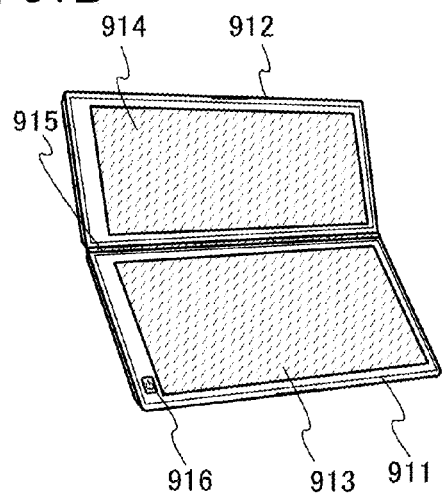

FIG. 31B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 31C:
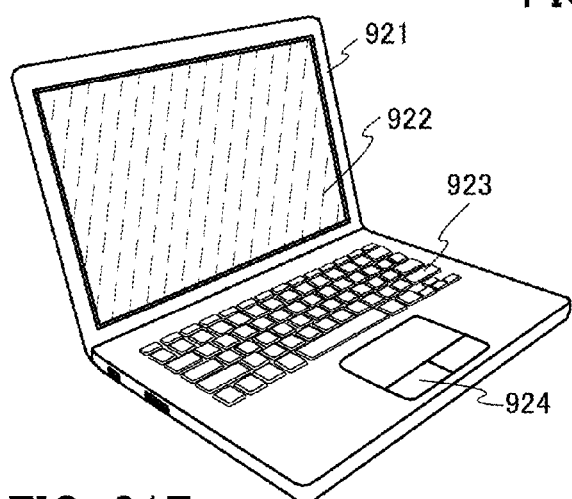

FIG. 31C illustrates a notebook personal computer, which includes a housing 921, a display portion 922, a keyboard 923, a pointing device 924, and the like.

Figure 31D:
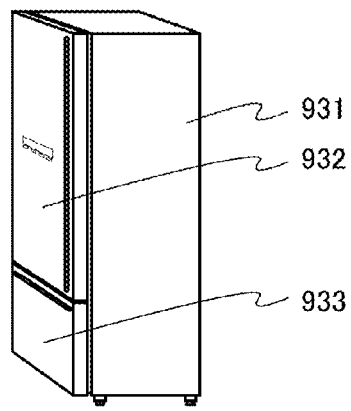

FIG. 31D illustrates an electric refrigerator-freezer, which includes a housing 931, a door for a refrigerator 932, a door for a freezer 933, and the like.

Figure 31E:
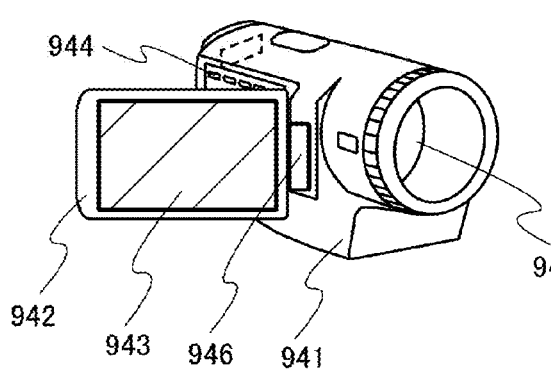

FIG. 31E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 31F:
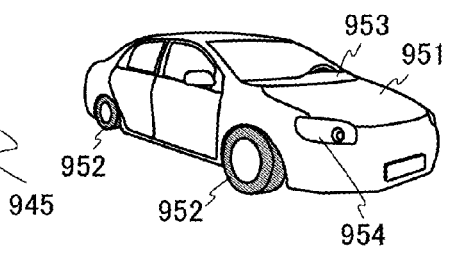

FIG. 31F illustrates a car including a car body 951, wheels 952, a dashboard 953, lights 954, and the like.

This application is based on Japanese Patent Application serial no. 2014-186088 filed with Japan Patent Office on Sep. 12, 2014, the entire contents of which are hereby incorporated by reference.

What is claimed is:

1. A method for manufacturing a semiconductor device, comprising the steps of:
    forming an insulator;
    forming a layer over the insulator;
    adding oxygen to the insulator through the layer;
    after adding the oxygen, removing the layer;
    after removing the layer, forming an oxide semiconductor over the insulator to which the oxygen is added; and
    forming a semiconductor element comprising the oxide semiconductor.

2. The method for manufacturing a semiconductor device, according to claim 1, wherein the layer contains a second oxide semiconductor.

3. The method for manufacturing a semiconductor device, according to claim 1, wherein the layer is removed by wet etching.

4. The method for manufacturing a semiconductor device, according to claim 1, wherein the insulator is an oxide comprising silicon.

5. The method for manufacturing a semiconductor device, according to claim 1, further comprising the step of performing heat treatment after forming the oxide semiconductor.

6. The method for manufacturing a semiconductor device, according to claim 5, wherein hydrogen in the oxide semiconductor and oxygen in the insulator are made to react with each other by the heat treatment to be released as water.

7. The method for manufacturing a semiconductor device, according to claim 1, wherein the oxygen is added by an ion implantation method.

8. The method for manufacturing a semiconductor device, according to claim 1, wherein the semiconductor element is a transistor.

9. The method for manufacturing a semiconductor device according to claim 1, wherein the oxide semiconductor comprises indium, gallium, and zinc.

10. A method for manufacturing a semiconductor device, comprising the steps of:
    forming an oxide insulator;
    forming a layer over the oxide insulator;
    adding oxygen to the oxide insulator through the layer;
    after adding the oxygen, removing the layer;
    after removing the layer, forming an oxide semiconductor over the oxide insulator to which the oxygen is added; and
    forming a semiconductor element comprising the oxide semiconductor.

11. The method for manufacturing a semiconductor device, according to claim 10, wherein the layer contains a second oxide semiconductor.

12. The method for manufacturing a semiconductor device, according to claim 10, wherein the layer is removed by wet etching.

13. The method for manufacturing a semiconductor device, according to claim 10, further comprising the step of performing heat treatment after forming the oxide semiconductor.

14. The method for manufacturing a semiconductor device, according to claim 13, wherein hydrogen in the oxide semiconductor and oxygen in the oxide insulator are made to react with each other by the heat treatment to be released as water.

15. The method for manufacturing a semiconductor device, according to claim 10, wherein the oxygen is added by an ion implantation method.

16. The method for manufacturing a semiconductor device, according to claim 10, wherein the semiconductor element is a transistor.

17. The method for manufacturing a semiconductor device according to claim 10, wherein the oxide semiconductor comprises indium, gallium, and zinc.

18. A method for manufacturing a semiconductor device, comprising:
    forming an insulating layer containing an oxide;
    forming a sacrificial layer containing an oxide semiconductor over the insulating layer;
    adding molecular ions containing oxygen to the insulating layer through the sacrificial layer, so that excess oxygen exists in the insulating layer;
    etching the sacrificial layer to remove the sacrificial layer from the insulating layer; and
    forming an oxide semiconductor layer over the insulating layer; and
    performing a heat treatment on the oxide semiconductor layer, so that the excess oxygen in the insulating layer moves to the oxide semiconductor layer.

19. The method according to claim 18, wherein the oxide in the insulating layer contains at least one selected from Al, Mg, Si, Ga, Ge, Y, Zr, La, Nd, Hf and Ta.

20. The method according to claim 18, wherein:
    the oxide semiconductor in the sacrificial layer is an In—Ga—Zn oxide, and
    the In—Ga—Zn oxide contains gallium twice or more as much as indium in an atomic ratio.

21. The method according to claim 18, wherein the step of etching is performed by wet etching.

22. The method according to claim 18, wherein a hydrogen concentration of the oxide semiconductor layer after the heat treatment is in a range of $1\times10^{16}$ atoms/cm$^3$ or higher and $5\times10^{18}$ atoms/cm$^3$ or lower.

* * * * *